United States Patent
Gorrell et al.

(10) Patent No.: US 7,758,739 B2
(45) Date of Patent: *Jul. 20, 2010

(54) METHODS OF PRODUCING STRUCTURES FOR ELECTRON BEAM INDUCED RESONANCE USING PLATING AND/OR ETCHING

(75) Inventors: Jonathan Gorrell, Gainesville, FL (US); Mark Davidson, Florahome, FL (US); Jean Tokarz, Hawthorne, FL (US); Michael E. Maines, Gainesville, FL (US); Andres Trucco, Gainesville, FL (US); Paul Hart, Kansas City, MO (US)

(73) Assignee: Virgin Islands Microsystems, Inc., Saint Thomas (VG)

( * ) Notice: Subject to any disclaimer, the term of this patent is extended or adjusted under 35 U.S.C. 154(b) by 1022 days.

This patent is subject to a terminal disclaimer.

(21) Appl. No.: 11/433,486

(22) Filed: May 15, 2006

(65) Prior Publication Data

US 2006/0216940 A1    Sep. 28, 2006

Related U.S. Application Data

(63) Continuation of application No. 11/243,477, filed on Oct. 5, 2005, now Pat. No. 7,626,179, which is a continuation-in-part of application No. 11/238,991, filed on Sep. 30, 2005, application No. 11/433,486, which is a continuation-in-part of application No. 11/203,407, filed on Aug. 15, 2005, now abandoned, and a continuation-in-part of application No. 10/917,511, filed on Aug. 13, 2004, now abandoned.

(51) Int. Cl.
*H01L 21/461* (2006.01)
*H01L 21/302* (2006.01)

(52) U.S. Cl. .............. 205/118; 204/229.4; 216/24; 438/706; 257/E21.311

(58) Field of Classification Search ............... None
See application file for complete search history.

(56) References Cited

U.S. PATENT DOCUMENTS 1,948,384 A    2/1934    Lawrence (Continued)

FOREIGN PATENT DOCUMENTS

EP    0237559 B1    12/1991

(Continued)

OTHER PUBLICATIONS

B. Loechel et al., "Fabrication of Magnetic Microstructures by Using Thick Layer Resists", Microelectronics Eng., vol. 21, pp. 463-466 (1993).*

(Continued)

*Primary Examiner*—Allan Olsen
(74) *Attorney, Agent, or Firm*—Davidson Berquist Jackson & Gowdey LLP

(57) ABSTRACT

We describe an ultra-small structure and a method of producing the same. The structures produce visible light of varying frequency, from a single metallic layer. In one example, a row of metallic posts are etched or plated on a substrate according to a particular geometry. When a charged particle beam passed close by the row of posts, the posts and cavities between them cooperate to resonate and produce radiation in the visible spectrum (or even higher). A plurality of such rows of different geometries are formed by either etching or plating from a single metal layer such that the charged particle beam will yield different visible light frequencies (i.e., different colors) using different ones of the rows.

7 Claims, 38 Drawing Sheets

U.S. PATENT DOCUMENTS

| | | |
|---|---|---|
| 2,307,086 A | 1/1943 | Varian et al. |
| 2,397,905 A | 4/1946 | Rockwell et al. |
| 2,431,396 A | 11/1947 | Hansell |
| 2,473,477 A | 6/1949 | Smith |
| 2,634,372 A | 4/1953 | Salisbury |
| 2,932,798 A | 4/1960 | Kerst et al. |
| 2,944,183 A | 7/1960 | Drexler |
| 2,966,611 A | 12/1960 | Sandstrom |
| 3,231,779 A | 1/1966 | White |
| 3,297,905 A | 1/1967 | Rockwell et al. |
| 3,315,117 A | 4/1967 | Udelson |
| 3,387,169 A | 6/1968 | Farney |
| 3,543,147 A | 11/1970 | Kovarik |
| 3,546,524 A | 12/1970 | Stark |
| 3,560,694 A | 2/1971 | White |
| 3,571,642 A | 3/1971 | Westcott |
| 3,586,899 A | 6/1971 | Fleisher |
| 3,761,828 A | 9/1973 | Pollard et al. |
| 3,886,399 A | 5/1975 | Symons |
| 3,923,568 A | 12/1975 | Bersin |
| 3,989,347 A | 11/1976 | Eschler |
| 4,053,845 A | 10/1977 | Gould |
| 4,269,672 A * | 5/1981 | Inoue ..................... 205/96 |
| 4,282,436 A | 8/1981 | Kapetanakos |
| 4,450,554 A | 5/1984 | Steensma et al. |
| 4,453,108 A | 6/1984 | Freeman, Jr. |
| 4,482,779 A | 11/1984 | Anderson |
| 4,528,659 A | 7/1985 | Jones, Jr. |
| 4,589,107 A | 5/1986 | Middleton et al. |
| 4,598,397 A | 7/1986 | Nelson et al. |
| 4,630,262 A | 12/1986 | Callens et al. |
| 4,652,703 A | 3/1987 | Lu et al. |
| 4,661,783 A | 4/1987 | Gover et al. |
| 4,704,583 A | 11/1987 | Gould |
| 4,712,042 A | 12/1987 | Hamm |
| 4,713,581 A | 12/1987 | Haimson |
| 4,727,550 A | 2/1988 | Chang et al. |
| 4,740,963 A | 4/1988 | Eckley |
| 4,740,973 A | 4/1988 | Madey |
| 4,746,201 A | 5/1988 | Gould |
| 4,761,059 A | 8/1988 | Yeh et al. |
| 4,782,485 A | 11/1988 | Gollub |
| 4,789,945 A | 12/1988 | Niijima |
| 4,806,859 A | 2/1989 | Hetrick |
| 4,809,271 A | 2/1989 | Kondo et al. |
| 4,813,040 A | 3/1989 | Futato |
| 4,819,228 A | 4/1989 | Baran et al. |
| 4,829,527 A | 5/1989 | Wortman et al. |
| 4,838,021 A | 6/1989 | Beattie |
| 4,841,538 A | 6/1989 | Yanabu et al. |
| 4,864,131 A | 9/1989 | Rich et al. |
| 4,866,704 A | 9/1989 | Bergman |
| 4,866,732 A | 9/1989 | Carey et al. |
| 4,873,715 A | 10/1989 | Shibata |
| 4,887,265 A | 12/1989 | Felix |
| 4,890,282 A | 12/1989 | Lambert et al. |
| 4,898,022 A | 2/1990 | Yumoto et al. |
| 4,912,705 A | 3/1990 | Paneth et al. |
| 4,932,022 A | 6/1990 | Keeney et al. |
| 4,981,371 A | 1/1991 | Gurak et al. |
| 5,023,563 A | 6/1991 | Harvey et al. |
| 5,036,513 A | 7/1991 | Greenblatt |
| 5,065,425 A | 11/1991 | Lecomte et al. |
| 5,113,141 A | 5/1992 | Swenson |
| 5,121,385 A | 6/1992 | Tominaga et al. |
| 5,127,001 A | 6/1992 | Steagall et al. |
| 5,128,729 A | 7/1992 | Alonas et al. |
| 5,130,985 A | 7/1992 | Kondo et al. |
| 5,150,410 A | 9/1992 | Bertrand |
| 5,155,726 A | 10/1992 | Spinney et al. |
| 5,157,000 A | 10/1992 | Elkind et al. |
| 5,163,118 A | 11/1992 | Lorenzo et al. |
| 5,185,073 A | 2/1993 | Bindra |
| 5,187,591 A | 2/1993 | Guy et al. |
| 5,199,918 A | 4/1993 | Kumar |
| 5,214,650 A | 5/1993 | Renner et al. |
| 5,233,623 A | 8/1993 | Chang |
| 5,235,248 A | 8/1993 | Clark et al. |
| 5,262,656 A | 11/1993 | Blondeau et al. |
| 5,263,043 A | 11/1993 | Walsh |
| 5,268,693 A | 12/1993 | Walsh |
| 5,268,788 A | 12/1993 | Fox et al. |
| 5,282,197 A | 1/1994 | Kreitzer |
| 5,283,819 A | 2/1994 | Glick et al. |
| 5,293,175 A | 3/1994 | Hemmie et al. |
| 5,302,240 A | 4/1994 | Hori et al. |
| 5,305,312 A | 4/1994 | Fornek et al. |
| 5,341,374 A | 8/1994 | Lewen et al. |
| 5,354,709 A | 10/1994 | Lorenzo et al. |
| 5,446,814 A | 8/1995 | Kuo et al. |
| 5,485,277 A | 1/1996 | Foster |
| 5,504,341 A | 4/1996 | Glavish |
| 5,578,909 A | 11/1996 | Billen |
| 5,604,352 A | 2/1997 | Schuetz |
| 5,608,263 A | 3/1997 | Drayton et al. |
| 5,637,966 A | 6/1997 | Umstadter et al. |
| 5,663,971 A | 9/1997 | Carlsten |
| 5,666,020 A | 9/1997 | Takemura |
| 5,668,368 A | 9/1997 | Sakai et al. |
| 5,705,443 A | 1/1998 | Stauf et al. |
| 5,737,458 A | 4/1998 | Wojnarowski et al. |
| 5,744,919 A | 4/1998 | Mishin et al. |
| 5,757,009 A | 5/1998 | Walstrom |
| 5,767,013 A | 6/1998 | Park |
| 5,780,970 A | 7/1998 | Singh et al. |
| 5,790,585 A | 8/1998 | Walsh |
| 5,811,943 A | 9/1998 | Mishin et al. |
| 5,821,836 A | 10/1998 | Katehi et al. |
| 5,821,902 A | 10/1998 | Keen |
| 5,825,140 A | 10/1998 | Fujisawa |
| 5,831,270 A | 11/1998 | Nakasuji |
| 5,847,745 A | 12/1998 | Shimizu et al. |
| 5,858,799 A | 1/1999 | Yee et al. |
| 5,889,449 A | 3/1999 | Fiedziuszko |
| 5,889,797 A | 3/1999 | Nguyen |
| 5,902,489 A | 5/1999 | Yasuda et al. |
| 5,963,857 A | 10/1999 | Greywall |
| 5,972,193 A | 10/1999 | Chou et al. |
| 6,005,347 A | 12/1999 | Lee |
| 6,008,496 A | 12/1999 | Winefordner et al. |
| 6,040,625 A | 3/2000 | Ip |
| 6,060,833 A | 5/2000 | Velazco |
| 6,080,529 A | 6/2000 | Ye et al. |
| 6,117,784 A | 9/2000 | Uzoh |
| 6,139,760 A | 10/2000 | Shim et al. |
| 6,180,415 B1 | 1/2001 | Schultz et al. |
| 6,195,199 B1 | 2/2001 | Yamada |
| 6,210,555 B1 * | 4/2001 | Taylor et al. ................. 205/103 |
| 6,222,866 B1 | 4/2001 | Seko |
| 6,278,239 B1 | 8/2001 | Caporaso et al. |
| 6,281,769 B1 | 8/2001 | Fiedziuszko |
| 6,297,511 B1 | 10/2001 | Syllaios et al. |
| 6,301,041 B1 | 10/2001 | Yamada |
| 6,303,014 B1 * | 10/2001 | Taylor et al. ................. 205/103 |
| 6,309,528 B1 | 10/2001 | Taylor et al. |
| 6,316,876 B1 | 11/2001 | Tanabe |
| 6,338,968 B1 | 1/2002 | Hefti |
| 6,370,306 B1 | 4/2002 | Sato et al. |
| 6,373,194 B1 | 4/2002 | Small |
| 6,376,258 B2 | 4/2002 | Hefti |
| 6,407,516 B1 | 6/2002 | Victor |
| 6,441,298 B1 | 8/2002 | Thio |
| 6,448,850 B1 | 9/2002 | Yamada |
| 6,453,087 B2 | 9/2002 | Frish et al. |

| Patent/Publication | Date | Inventor |
|---|---|---|
| 6,470,198 B1 | 10/2002 | Kintaka et al. |
| 6,504,303 B2 | 1/2003 | Small |
| 6,524,461 B2 * | 2/2003 | Taylor et al. ................. 205/103 |
| 6,525,477 B2 | 2/2003 | Small |
| 6,534,766 B2 | 3/2003 | Abe et al. |
| 6,545,425 B2 | 4/2003 | Victor |
| 6,552,320 B1 | 4/2003 | Pan |
| 6,577,040 B2 | 6/2003 | Nguyen |
| 6,580,075 B2 | 6/2003 | Kametani et al. |
| 6,603,781 B1 | 8/2003 | Stinson et al. |
| 6,603,915 B2 | 8/2003 | Glebov et al. |
| 6,624,916 B1 | 9/2003 | Green et al. |
| 6,636,185 B1 | 10/2003 | Spitzer et al. |
| 6,636,534 B2 | 10/2003 | Madey et al. |
| 6,636,653 B2 | 10/2003 | Miracky et al. |
| 6,640,023 B2 | 10/2003 | Miller et al. |
| 6,642,907 B2 | 11/2003 | Hamada et al. |
| 6,687,034 B2 | 2/2004 | Wine et al. |
| 6,700,748 B1 | 3/2004 | Cowles et al. |
| 6,724,486 B1 | 4/2004 | Shull et al. |
| 6,738,176 B2 | 5/2004 | Rabinowitz et al. |
| 6,741,781 B2 | 5/2004 | Furuyama |
| 6,777,244 B2 | 8/2004 | Pepper et al. |
| 6,782,205 B2 | 8/2004 | Trisnadi et al. |
| 6,791,438 B2 | 9/2004 | Takahashi et al. |
| 6,800,877 B2 | 10/2004 | Victor et al. |
| 6,801,002 B2 | 10/2004 | Victor et al. |
| 6,819,432 B2 | 11/2004 | Pepper et al. |
| 6,829,286 B1 | 12/2004 | Guilfoyle et al. |
| 6,834,152 B2 | 12/2004 | Gunn et al. |
| 6,870,438 B1 | 3/2005 | Shino et al. |
| 6,871,025 B2 | 3/2005 | Maleki et al. |
| 6,885,262 B2 | 4/2005 | Nishimura et al. |
| 6,900,447 B2 | 5/2005 | Gerlach et al. |
| 6,908,355 B2 * | 6/2005 | Habib et al. ................. 445/50 |
| 6,909,092 B2 | 6/2005 | Nagahama |
| 6,909,104 B1 | 6/2005 | Koops |
| 6,924,920 B2 | 8/2005 | Zhilkov |
| 6,936,981 B2 | 8/2005 | Gesley |
| 6,943,650 B2 | 9/2005 | Ramprasad et al. |
| 6,944,369 B2 | 9/2005 | Deliwala |
| 6,952,492 B2 | 10/2005 | Tanaka et al. |
| 6,953,291 B2 | 10/2005 | Liu |
| 6,954,515 B2 | 10/2005 | Bjorkholm et al. |
| 6,965,284 B2 | 11/2005 | Maekawa et al. |
| 6,965,625 B2 | 11/2005 | Mross et al. |
| 6,972,439 B1 | 12/2005 | Kim et al. |
| 6,995,406 B2 | 2/2006 | Tojo et al. |
| 7,010,183 B2 | 3/2006 | Estes et al. |
| 7,064,500 B2 | 6/2006 | Victor et al. |
| 7,068,948 B2 | 6/2006 | Wei et al. |
| 7,092,588 B2 | 8/2006 | Kondo |
| 7,092,603 B2 | 8/2006 | Glebov et al. |
| 7,099,586 B2 | 8/2006 | Yoo |
| 7,120,332 B1 | 10/2006 | Spoonhower et al. |
| 7,122,978 B2 | 10/2006 | Nakanishi et al. |
| 7,130,102 B2 | 10/2006 | Rabinowitz |
| 7,177,515 B2 | 2/2007 | Estes et al. |
| 7,194,798 B2 | 3/2007 | Bonhote et al. |
| 7,230,201 B1 | 6/2007 | Miley et al. |
| 7,253,426 B2 | 8/2007 | Gorrell et al. |
| 7,267,459 B2 | 9/2007 | Matheson |
| 7,267,461 B2 | 9/2007 | Kan et al. |
| 7,309,953 B2 | 12/2007 | Tiberi et al. |
| 7,342,441 B2 | 3/2008 | Gorrell et al. |
| 7,359,589 B2 | 4/2008 | Gorrell et al. |
| 7,361,916 B2 | 4/2008 | Gorrell et al. |
| 7,362,972 B2 | 4/2008 | Yavor et al. |
| 7,375,631 B2 | 5/2008 | Moskowitz et al. |
| 7,436,177 B2 | 10/2008 | Gorrell et al. |
| 7,442,940 B2 | 10/2008 | Gorrell et al. |
| 7,443,358 B2 | 10/2008 | Gorrell et al. |
| 7,459,099 B2 | 12/2008 | Kubena et al. |
| 7,470,920 B2 | 12/2008 | Gorrell et al. |
| 7,473,917 B2 | 1/2009 | Singh |
| 7,554,083 B2 | 6/2009 | Gorrell et al. |
| 7,569,836 B2 | 8/2009 | Gorrell |
| 7,573,045 B2 | 8/2009 | Gorrell et al. |
| 7,586,097 B2 | 9/2009 | Gorrell et al. |
| 7,586,167 B2 | 9/2009 | Gorrell et al. |
| 2001/0002315 A1 | 5/2001 | Schultz et al. |
| 2001/0025925 A1 | 10/2001 | Abe et al. |
| 2001/0045360 A1 * | 11/2001 | Omasa ....................... 205/108 |
| 2002/0009723 A1 | 1/2002 | Hefti |
| 2002/0027481 A1 | 3/2002 | Fiedziuszko |
| 2002/0036121 A1 | 3/2002 | Ball et al. |
| 2002/0036264 A1 | 3/2002 | Nakasuji et al. |
| 2002/0053638 A1 | 5/2002 | Winkler et al. |
| 2002/0056645 A1 * | 5/2002 | Taylor et al. ................. 205/103 |
| 2002/0068018 A1 | 6/2002 | Pepper et al. |
| 2002/0070671 A1 | 6/2002 | Small |
| 2002/0071457 A1 | 6/2002 | Hogan |
| 2002/0122531 A1 | 9/2002 | Whitham |
| 2002/0135665 A1 | 9/2002 | Gardner |
| 2002/0139961 A1 | 10/2002 | Kinoshita et al. |
| 2002/0158295 A1 | 10/2002 | Armgarth et al. |
| 2002/0191650 A1 | 12/2002 | Madey et al. |
| 2003/0010979 A1 | 1/2003 | Pardo |
| 2003/0012925 A1 | 1/2003 | Gorrell |
| 2003/0016421 A1 | 1/2003 | Small |
| 2003/0034535 A1 | 2/2003 | Barenburu et al. |
| 2003/0103150 A1 | 6/2003 | Catrysse et al. |
| 2003/0106998 A1 | 6/2003 | Colbert et al. |
| 2003/0155521 A1 | 8/2003 | Feuerbaum |
| 2003/0158474 A1 | 8/2003 | Scherer et al. |
| 2003/0164947 A1 | 9/2003 | Vaupel |
| 2003/0179974 A1 | 9/2003 | Estes et al. |
| 2003/0206708 A1 | 11/2003 | Estes et al. |
| 2003/0214695 A1 | 11/2003 | Abramson et al. |
| 2003/0222579 A1 * | 12/2003 | Habib et al. ................. 313/523 |
| 2004/0011432 A1 * | 1/2004 | Podlaha et al. .............. 148/336 |
| 2004/0061053 A1 | 4/2004 | Taniguchi et al. |
| 2004/0080285 A1 | 4/2004 | Victor et al. |
| 2004/0085159 A1 | 5/2004 | Kubena et al. |
| 2004/0092104 A1 | 5/2004 | Gunn, III et al. |
| 2004/0108471 A1 | 6/2004 | Luo et al. |
| 2004/0108473 A1 | 6/2004 | Melnychuk et al. |
| 2004/0108823 A1 | 6/2004 | Amaldi et al. |
| 2004/0136715 A1 | 7/2004 | Kondo |
| 2004/0150991 A1 | 8/2004 | Ouderkirk et al. |
| 2004/0154925 A1 * | 8/2004 | Podlaha et al. .............. 205/104 |
| 2004/0171272 A1 | 9/2004 | Jin et al. |
| 2004/0180244 A1 | 9/2004 | Tour et al. |
| 2004/0184270 A1 | 9/2004 | Halter |
| 2004/0213375 A1 | 10/2004 | Bjorkholm et al. |
| 2004/0217297 A1 | 11/2004 | Moses et al. |
| 2004/0218651 A1 | 11/2004 | Iwasaki et al. |
| 2004/0231996 A1 | 11/2004 | Webb |
| 2004/0240035 A1 | 12/2004 | Zhilkov |
| 2004/0264867 A1 | 12/2004 | Kondo |
| 2005/0023145 A1 | 2/2005 | Cohen et al. |
| 2005/0045821 A1 | 3/2005 | Noji et al. |
| 2005/0045832 A1 | 3/2005 | Kelly et al. |
| 2005/0054151 A1 | 3/2005 | Lowther et al. |
| 2005/0062903 A1 | 3/2005 | Cok et al. |
| 2005/0067286 A1 | 3/2005 | Ahn et al. |
| 2005/0082469 A1 | 4/2005 | Carlo |
| 2005/0092929 A1 | 5/2005 | Schneiker |
| 2005/0104684 A1 | 5/2005 | Wojcik |
| 2005/0105595 A1 | 5/2005 | Martin et al. |
| 2005/0105690 A1 | 5/2005 | Pau et al. |
| 2005/0145882 A1 | 7/2005 | Taylor et al. |
| 2005/0152635 A1 | 7/2005 | Paddon et al. |
| 2005/0162104 A1 | 7/2005 | Victor et al. |
| 2005/0180678 A1 | 8/2005 | Panepucci et al. |
| 2005/0190637 A1 | 9/2005 | Ichimura et al. |

| | | | |
|---|---|---|---|
| 2005/0191055 | A1 | 9/2005 | Maruyama et al. |
| 2005/0194258 | A1 | 9/2005 | Cohen et al. |
| 2005/0201707 | A1 | 9/2005 | Glebov et al. |
| 2005/0201717 | A1 | 9/2005 | Matsumura et al. |
| 2005/0206314 | A1* | 9/2005 | Habib et al. .............. 313/542 |
| 2005/0212503 | A1 | 9/2005 | Deibele |
| 2005/0231138 | A1 | 10/2005 | Nakanishi et al. |
| 2005/0249451 | A1 | 11/2005 | Baehr-Jones et al. |
| 2005/0285541 | A1 | 12/2005 | LeChevalier |
| 2006/0007730 | A1 | 1/2006 | Nakamura et al. |
| 2006/0018619 | A1 | 1/2006 | Helffrich et al. |
| 2006/0035173 | A1 | 2/2006 | Davidson et al. |
| 2006/0045418 | A1 | 3/2006 | Cho et al. |
| 2006/0050269 | A1 | 3/2006 | Brownell |
| 2006/0060782 | A1 | 3/2006 | Khursheed |
| 2006/0062258 | A1 | 3/2006 | Brau et al. |
| 2006/0131176 | A1 | 6/2006 | Hsu |
| 2006/0131695 | A1 | 6/2006 | Kuekes et al. |
| 2006/0159131 | A1 | 7/2006 | Liu et al. |
| 2006/0164496 | A1 | 7/2006 | Tokutake et al. |
| 2006/0187794 | A1 | 8/2006 | Harvey et al. |
| 2006/0208667 | A1 | 9/2006 | Lys et al. |
| 2006/0216940 | A1 | 9/2006 | Gorrell et al. |
| 2006/0232364 | A1 | 10/2006 | Koh et al. |
| 2006/0243925 | A1 | 11/2006 | Barker et al. |
| 2006/0274922 | A1 | 12/2006 | Ragsdale |
| 2007/0003781 | A1 | 1/2007 | de Rochemont |
| 2007/0013765 | A1 | 1/2007 | Hudson et al. |
| 2007/0075263 | A1 | 4/2007 | Gorrell et al. |
| 2007/0075264 | A1 | 4/2007 | Gorrell et al. |
| 2007/0085039 | A1 | 4/2007 | Gorrell et al. |
| 2007/0086915 | A1 | 4/2007 | LeBoeuf et al. |
| 2007/0116420 | A1 | 5/2007 | Estes et al. |
| 2007/0146704 | A1 | 6/2007 | Schmidt et al. |
| 2007/0152176 | A1 | 7/2007 | Gorrell et al. |
| 2007/0154846 | A1 | 7/2007 | Gorrell et al. |
| 2007/0194357 | A1 | 8/2007 | Oohashi et al. |
| 2007/0200940 | A1 | 8/2007 | Gruhlke et al. |
| 2007/0238037 | A1 | 10/2007 | Wuister et al. |
| 2007/0252983 | A1 | 11/2007 | Tong et al. |
| 2007/0258492 | A1 | 11/2007 | Gorrell |
| 2007/0258689 | A1 | 11/2007 | Gorrell et al. |
| 2007/0258690 | A1 | 11/2007 | Gorrell et al. |
| 2007/0258720 | A1 | 11/2007 | Gorrell et al. |
| 2007/0259641 | A1 | 11/2007 | Gorrell |
| 2007/0264023 | A1 | 11/2007 | Gorrell et al. |
| 2007/0264030 | A1 | 11/2007 | Gorrell et al. |
| 2007/0282030 | A1 | 12/2007 | Anderson et al. |
| 2007/0284527 | A1 | 12/2007 | Zani et al. |
| 2008/0069509 | A1 | 3/2008 | Gorrell et al. |
| 2008/0218102 | A1 | 9/2008 | Sliski et al. |
| 2008/0283501 | A1* | 11/2008 | Roy ........................ 216/71 |
| 2008/0302963 | A1 | 12/2008 | Nakasuji et al. |

FOREIGN PATENT DOCUMENTS

| | | |
|---|---|---|
| JP | 2004-32323 A | 1/2004 |
| WO | WO 87/01873 | 3/1987 |
| WO | WO 93/21663 A1 | 10/1993 |
| WO | WO 00/72413 | 11/2000 |
| WO | WO 02/25785 | 3/2002 |
| WO | WO 02/077607 | 10/2002 |
| WO | WO 2004/086560 | 10/2004 |
| WO | WO 2005/015143 A2 | 2/2005 |
| WO | WO 2005/098966 | 10/2005 |
| WO | WO 2006/042239 A2 | 4/2006 |
| WO | WO 2007/081389 | 7/2007 |
| WO | WO 2007/081390 | 7/2007 |
| WO | WO 2007/081391 | 7/2007 |

OTHER PUBLICATIONS

U.S. Appl. No. 11/418,082, filed May 5, 2006, Gorrell et al.
J. C. Palais, "Fiber optic communications," Prentice Hall, New Jersey, 1998, pp. 156-158.
Search Report and Written Opinion mailed Dec. 20, 2007 in PCT Appln. No. PCT/US2006/022771.
Search Report and Written Opinion mailed Jan. 31, 2008 in PCT Appln. No. PCT/US2006/027427.
Search Report and Written Opinion mailed Jan. 8, 2008 in PCT Appln. No. PCT/US2006/028741.
Search Report and Written Opinion mailed Mar. 11, 2008 in PCT Appln. No. PCT/US2006/022679.
Search Report and Written Opinion mailed Apr. 23, 2008 in PCT Appln. No. PCT/US2006/022678.
Search Report and Written Opinion mailed Apr. 3, 2008 in PCT Appln. No. PCT/US2006/027429.
Search Report and Written Opinion mailed Jun. 18, 2008 in PCT Appln. No. PCT/US2006/027430.
Search Report and Written Opinion mailed Jun. 3, 2008 in PCT Appln. No. PCT/US2006/022783.
Search Report and Written Opinion mailed Mar. 24, 2008 in PCT Appln. No. PCT/US2006/022677.
Search Report and Written Opinion mailed Mar. 24, 2008 in PCT Appln. No. PCT/US2006/022784.
Search Report and Written Opinion mailed May 2, 2008 in PCT Appln. No. PCT/US2006/023280.
Search Report and Written Opinion mailed May 21, 2008 in PCT Appln. No. PCT/US2006/023279.
Search Report and Written Opinion mailed May 22, 2008 in PCT Appln. No. PCT/US2006/022685.
Search Report and Written Opinion mailed Aug. 24, 2007 in PCT Appln. No. PCT/US2006/022768.
Search Report and Written Opinion mailed Aug. 31, 2007 in PCT Appln. No. PCT/US2006/022680.
Search Report and Written Opinion mailed Jul. 16, 2007 in PCT Appln. No. PCT/US2006/022774.
Search Report and Written Opinion mailed Jul. 20, 2007 in PCT Appln. No. PCT/US2006/024216.
Search Report and Written Opinion mailed Jul. 26, 2007 in PCT Appln. No. PCT/US2006/022776.
Search Report and Written Opinion mailed Jun. 20, 2007 in PCT Appln. No. PCT/US2006/022779.
Search Report and Written Opinion mailed Sep. 12, 2007 in PCT Appln. No. PCT/US2006/022767.
Search Report and Written Opinion mailed Sep. 13, 2007 in PCT Appln. No. PCT/US2006/024217.
Search Report and Written Opinion mailed Sep. 17, 2007 in PCT Appln. No. PCT/US2006/022787.
Search Report and Written Opinion mailed Sep. 5, 2007 in PCT Appln. No. PCT/US2006/027428.
Search Report and Written Opinion mailed Sep. 17, 2007 in PCT Appln. No. PCT/US2006/022689.
International Search Report and Written Opinion mailed Nov. 23, 2007 in International Application No. PCT/US2006/022786.
Search Report and Written Opinion mailed Oct. 25, 2007 in PCT Appln. No. PCT/US2006/022687.
Search Report and Written Opinion mailed Oct. 26, 2007 in PCT Appln. No. PCT/US2006/022675.
Search Report and Written Opinion mailed Sep. 21, 2007 in PCT Appln. No. PCT/US2006/022688.
Search Report and Written Opinion mailed Sep. 25, 2007 in PCT appln. No. PCT/US2006/022681.
Search Report and Written Opinion mailed Sep. 26, 2007 in PCT Appln. No. PCT/US2006/024218.
Response to Non-Final Office Action submitted May 13, 2009 in U.S. Appl. No. 11/203,407.
U.S. Appl. No. 11/238,991—May 11, 2009 PTO Office Action.
U.S. Appl. No. 11/350,812—Apr. 17, 2009 Office Action.
Lee Kwang-Cheol et al., "Deep X-Ray Mask with Integrated Actuator for 3D Microfabrication", Conference: Pacific Rim Workshop on Transducers and Micro/Nano Technologies, (Xiamen CHN), Jul. 22, 2002.
Markoff, John, "A Chip That Can Transfer Data Using Laser Light," The New York Times, Sep. 18, 2006.

S.M. Sze, "Semiconductor Devices Physics and Technology", 2nd Edition, Chapters 9 and 12, Copyright 1985, 2002.
Search Report and Written Opinion mailed Feb. 12, 2007 in PCT Appln. No. PCT/US2006/022682.
Search Report and Written Opinion mailed Feb. 20, 2007 in PCT Appln. No. PCT/US2006/022676.
Search Report and Written Opinion mailed Feb. 20, 2007 in PCT Appln. No. PCT/US2006/022772.
Search Report and Written Opinion mailed Feb. 20, 2007 in PCT Appln. No. PCT/US2006/022780.
Search Report and Written Opinion mailed Feb. 21, 2007 in PCT Appln. No. PCT/US2006/022684.
Search Report and Written Opinion mailed Jan. 17, 2007 in PCT Appln. No. PCT/US2006/022777.
Search Report and Written Opinion mailed Jan. 23, 2007 in PCT Appln. No. PCT/US2006/022781.
Search Report and Written Opinion mailed Mar. 7, 2007 in PCT Appln. No. PCT/US2006/022775.
Speller et al., "A Low-Noise MEMS Accelerometer for Unattended Ground Sensor Applications", Applied MEMS Inc., 12200 Parc Crest, Stafford, TX, USA 77477, Dec. 2004.
Thurn-Albrecht et al., "Ultrahigh-Density Nanowire Arrays Grown in Self-Assembled Diblock Copolymer Templates", Science 290. 5499, Dec. 15, 2000, pp. 2126-2129.
"An Early History—Invention of the Klystron," http://varianinc.com/cgi-bin/advprint/print.cgi?cid=KLQNPPJJFJ, printed on Dec. 26, 2008.
"An Early History—The Founding of Varian Associates," http://varianinc.com/cgi-bin/advprint/print.cgi?cid=KLQNPPJJFJ, printed on Dec. 26, 2008.
"Chapter 3 X-Ray Tube," http://compepid.tuskegee.edu/syllabi/clinical/small/radiology/chapter..., printed from tuskegee.edu on Dec. 29, 2008.
"Diagnostic imaging modalities—Ionizing vs non-ionizing radiation," http://info.med.yale.edu/intmed/cardio/imaging/techniques/ionizing_v..., printed from Yale University School of Medicine on Dec. 29, 2008.
"Frequently Asked Questions," Luxtera Inc., found at http://www.luxtera.com/technology_faq.htm, printed on Dec. 2, 2005, 4 pages.
"Klystron Amplifier," http://www.radartutorial.eu/08.transmitters/tx12.en.html, printed on Dec. 26, 2008.
"Klystron is a Micowave Generator," http://www2.slac.stanford.edu/vvc/accelerators/klystron.html, printed on Dec. 26, 2008.
"Klystron," http:en.wikipedia.org/wiki/Klystron, printed on Dec. 26, 2008.
"Making X-rays," http://www.fnrfscience.cmu.ac.th/theory/radiation/xray-basics.html, printed on Dec. 29, 2008.
"Microwave Tubes," http://www.tpub.com/neets/book11/45b.htm, printed on Dec. 26, 2008.
"Notice of Allowability" mailed on Jan. 17, 2008 in U.S. Appl. No. 11/418,082, filed May 5, 2006.
"Technology Overview," Luxtera, Inc., found at http://www.luxtera.com/technology.htm, printed on Dec. 2, 2005, 1 page.
"The Reflex Klystron," http://www.fnrfscience.cmu.ac.th/theory/microwave/microwave%2, printed from Fast Netoron Research Facilty on Dec. 26, 2008.
"X-ray tube," http://www.answers.com/topic/x-ray-tube, printed on Dec. 29, 2008.
Mar. 6, 2009 Response to PTO Office Action of Sep. 16, 2008 in U.S. Appl. No. 11/418,085.
Mar. 24, 2006 PTO Office Action in U.S. Appl. No. 10/917,511.
Mar. 25, 2008 PTO Office Action in U.S. Appl. No. 11/411,131.
Mar. 31, 2008 PTO Office Action in U.S. Appl. No. 11/418,315.
Apr. 8, 2008 PTO Office Action in U.S. Appl. No. 11/325,571.
Apr. 17, 2008 Response to PTO Office Action of Dec. 20, 2007 in U.S. Appl. No. 11/418,087.
Apr. 19, 2007 Response to PTO Office Action of Jan. 17, 2007 in U.S. Appl. No. 11/418,082.
May 10, 2005 PTO Office Action in U.S. Appl. No. 10/917,511.
May 21, 2007 PTO Office Action in U.S. Appl. No. 11/418,087.
May 26, 2006 Response to PTO Office Action of Mar. 24, 2006 in U.S. Appl. No. 10/917,511.
Jun. 16, 2008 Response to PTO Office Action of Dec. 14, 2007 in U.S. Appl. No. 11/418,264.
Jun. 20, 2008 PTO Office Action in U.S. Appl. No. 11/418,083.
Jun. 20, 2008 Response to PTO Office Action of Mar. 25, 2008 in U.S. Appl. No. 11/411,131.
Jul. 1, 2008 PTO Office Action in U.S. Appl. No. 11/418,244.
Aug. 10, 2007 PTO Office Action in U.S. Appl. No. 11/418,085.
Aug. 12, 2008 Response to PTO Office Action of Feb. 12, 2008 in U.S. Appl. No. 11/418,085.
Aug. 14, 2006 PTO Office Action in U.S. Appl. No. 10/917,511.
Sep. 1, 2006 Response to PTO Office Action of Aug. 14, 2006 in U.S. Appl. No. 10/917,511.
Sep. 12, 2005 Response to PTO Office Action of May 10, 2005 in U.S. Appl. No. 10/917,511.
Sep. 14, 2007 PTO Office Action in U.S. Appl. No. 11/411,131.
Sep. 16, 2008 PTO Office Action in U.S. Appl. No. 11/418,085.
Oct. 19, 2007 Response to PTO Office Action of May 21, 2007 in U.S. Appl. No. 11/418,087.
Nov. 13, 2007 Response to PTO Office Action of Aug. 10, 2007 in U.S. Appl. No. 11/418,085.
Nov. 25, 2008 Response to PTO Office Action of Jul. 1, 2008 in U.S. Appl. No. 11/418,244.
Dec. 4, 2006 PTO Office Action in U.S. Appl. No. 11/418,087.
Dec. 14, 2007 PTO Office Action in U.S. Appl. No. 11/418,264.
Dec. 14, 2007 Response to PTO Office Action of Sep. 14, 2007 in U.S. Appl. No. 11/411,131.
Dec. 18, 2008 Response to PTO Office Action of Jun. 20, 2008 in U.S. Appl. No. 11/418,083.
Dec. 20, 2007 PTO Office Action in U.S. Appl. No. 11/418,087.
Corcoran, Elizabeth, "Ride the Light," Forbes Magazine, Apr. 11, 2005, pp. 68-70.
European Search Report mailed Mar. 3, 2009 in European Application No. 06852028.7.
Neo et al., "Smith-Purcell Radiation from Ultraviolet to Infrared Using a Si-field Emitter" Vacuum Electronics Conference, 2007, IVEC '07, IEEE International May 2007.
Ossia, Babak, "The X-Ray Production," Department of Biomedical Engineering—University of Rhode Island, 1 page.
Sadwick, Larry et al., "Microfabricated next-generation millimeter-wave power amplifiers," www.rfdesign.com.
Saraph, Girish P. et al., "Design of a Single-Stage Depressed Collector for High-Power, Pulsed Gyroklystrom Amplifiers," IEEE Transactions on Electron Devices, vol. 45, No. 4, Apr. 1998, pp. 986-990.
Sartori, Gabriele, "CMOS Photonics Platform," Luxtera, Inc., Nov. 2005, 19 pages.
Search Report and Writen Opinion mailed Jul. 14, 2008 in PCT Appln. No. PCT/US2006/022773.
Search Report and Written Opinion mailed Aug. 19, 2008 in PCT Appln. No. PCT/US2007/008363.
Search Report and Written Opinion mailed Jul. 16, 2008 in PCT Appln. No. PCT/US2006/022766.
Search Report and Written Opinion mailed Jul. 28, 2008 in PCT Appln. No. PCT/US2006/022782.
Search Report and Written Opinion mailed Jul. 3, 2008 in PCT Appln. No. PCT/US2006/022690.
Search Report and Written Opinion mailed Jul. 3, 2008 in PCT Appln. No. PCT/US2006/022778.
Search Report and Written Opinion mailed Jul. 7, 2008 in PCT Appln. No. PCT/US2006/022686.
Search Report and Written Opinion mailed Jul. 7, 2008 in PCT Appln. No. PCT/US2006/022785.
Search Report and Written Opinion mailed Sep. 2, 2008 in PCT Appln. No. PCT/US2006/022769.
Search Report and Written Opinion mailed Sep. 26, 2008 in PCT Appln. No. PCT/US2007/00053.
Search Report and Written Opinion mailed Sep. 3, 2008 in PCT Appln. No. PCT/US2006/022770.
Thumm, Manfred, "Historical German Contributions to Physics and Applications of Electromagnetic Oscillations and Waves."
U.S. Appl. No. 11/203,407—Nov. 13, 2008 PTO Office Action.
U.S. Appl. No. 11/238,991—Dec. 6, 2006 PTO Office Action.
U.S. Appl. No. 11/238,991—Jun. 6, 2007 Response to PTO Office Action of Dec. 6, 2006.

U.S. Appl. No. 11/238,991—Sep. 10, 2007 PTO Office Action.
U.S. Appl. No. 11/238,991—Mar. 6, 2008 Response to PTO Office Action of Sep. 10, 2007.
U.S. Appl. No. 11/238,991—Jun. 27, 2008 PTO Office Action.
U.S. Appl. No. 11/238,991—Dec. 29, 2008 Response to PTO Office Action of Jun. 27, 2008.
U.S. Appl. No. 11/238,991—Mar. 24, 2009 PTO Office Action.
U.S. Appl. No. 11/243,477—Apr. 25, 2008 PTO Office Action.
U.S. Appl. No. 11/243,477—Oct. 24, 2008 Response to PTO Office Action of Apr. 25, 2008.
U.S. Appl. No. 11/243,477—Jan. 7, 2009 PTO Office Action.
U.S. Appl. No. 11/325,448—Jun. 16, 2008 PTO Office Action.
U.S. Appl. No. 11/325,448—Dec. 16, 2008 Response to PTO Office Action of Jun. 16, 2008.
U.S. Appl. No. 11/325,534—Jun. 11, 2008 PTO Office Action.
U.S. Appl. No. 11/325,534—Oct. 15, 2008 Response to PTO Office Action of Jun. 11, 2008.
U.S. Appl. No. 11/353,208—Jan. 15, 2008 PTO Office Action.
U.S. Appl. No. 11/353,208—Mar. 17, 2008 PTO Office Action.
U.S. Appl. No. 11/353,208—Sep. 15, 2008 Response to PTO Office Action of Mar. 17, 2008.
U.S. Appl. No. 11/353,208—Dec. 24, 2008 PTO Office Action.
U.S. Appl. No. 11/353,208—Dec. 30, 2008 Response to PTO Office Action of Dec. 24, 2008.
U.S. Appl. No. 11/400,280—Oct. 16, 2008 PTO Office Action.
U.S. Appl. No. 11/400,280—Oct. 24, 2008 Response to PTO Office Action of Oct. 16, 2008.
U.S. Appl. No. 11/410,905—Sep. 26, 2008 PTO Office Action.
U.S. Appl. No. 11/410,905—Mar. 26, 2009 Response to PTO Office Action of Sep. 26, 2008.
U.S. Appl. No. 11/410,924—Mar. 6, 2009 PTO Office Action.
U.S. Appl. No. 11/411,120—Mar. 19, 2009 PTO Office Action.
U.S. Appl. No. 11/411,129—Jan. 16, 2009 Office Action.
U.S. Appl. No. 11/411,130—May 1, 2008 PTO Office Action.
U.S. Appl. No. 11/411,130—Oct. 29, 2008 Response to PTO Office Action of May 1, 2008.
U.S. Appl. No. 11/417,129—Jul. 11, 2007 PTO Office Action.
U.S. Appl. No. 11/417,129—Dec. 17, 2007 Response to PTO Office Action of Jul. 11, 2007.
U.S. Appl. No. 11/417,129—Dec. 20, 2007 Response to PTO Office Action of Jul. 11, 2007.
U.S. Appl. No. 11/417,129—Apr. 17, 2008 PTO Office Action.
U.S. Appl. No. 11/417,129—Jun. 19, 2008 Response to PTO Office Action of Apr. 17, 2008.
U.S. Appl. No. 11/418,079—Apr. 11, 2008 PTO Office Action.
U.S. Appl. No. 11/418,079—Oct. 7, 2008 Response to PTO Office Action of Apr. 11, 2008.
U.S. Appl. No. 11/418,079—Feb. 12, 2009 PTO Office Action.
U.S. Appl. No. 11/418,080—Mar. 18, 2009 PTO Office Action.
U.S. Appl. No. 11/418,082—Jan. 17, 2007 PTO Office Action.
U.S. Appl. No. 11/418,084—Nov. 5, 2007 PTO Office Action.
U.S. Appl. No. 11/418,084—May 5, 2008 Response to PTO Office Action of Nov. 5, 2007.
U.S. Appl. No. 11/418,084—Aug. 19, 2008 PTO Office Action.
U.S. Appl. No. 11/418,084—Feb. 19, 2009 Response to PTO Office Action of Aug. 19, 2008.
U.S. Appl. No. 11/418,085—Feb. 12, 2008 PTO Office Action.
U.S. Appl. No. 11/418,087—Dec. 29, 2006 Response to PTO Office Action of Dec. 4, 2006.
U.S. Appl. No. 11/418,087—Feb. 15, 2007 PTO Office Action.
U.S. Appl. No. 11/418,087—Mar. 6, 2007 Response to PTO Office Action of Feb. 15, 2007.
U.S. Appl. No. 11/418,088—Jun. 9, 2008 PTO Office Action.
U.S. Appl. No. 11/418,088—Dec. 8, 2008 Response to PTO Office Action of Jun. 9, 2008.
U.S. Appl. No. 11/418,089—Mar. 21, 2008 PTO Office Action.
U.S. Appl. No. 11/418,089—Jun. 23, 2008 Response to PTO Office Action of Mar. 21, 2008.
U.S. Appl. No. 11/418,089—Sep. 30, 2008 PTO Office Action.
U.S. Appl. No. 11/418,089—Mar. 30, 2009 Response to PTO Office Action of Sep. 30, 2008.
U.S. Appl. No. 11/418,091—Jul. 30, 2007 PTO Office Action.
U.S. Appl. No. 11/418,091—Nov. 27, 2007 Response to PTO Office Action of Jul. 30, 2007.
U.S. Appl. No. 11/418,091—Feb. 26, 2008 PTO Office Action.
U.S. Appl. No. 11/418,097—Feb. 26, 2008 PTO Office Action.
U.S. Appl. No. 11/418,097—Dec. 2, 2008 Response to PTO Office Action of Jun. 2, 2008.
U.S. Appl. No. 11/418,097—Feb. 18, 2009 PTO Office Action.
U.S. Appl. No. 11/418,099—Jun. 23, 2008 PTO Office Action.
U.S. Appl. No. 11/418,099—Dec. 23, 2008 Response to PTO Office Action of Jun. 23, 2008.
U.S. Appl. No. 11/418,100—Jan. 12, 2009 PTO Office Action.
U.S. Appl. No. 11/418,123—Apr. 25, 2008 PTO Office Action.
U.S. Appl. No. 11/418,123—Oct. 27, 2008 Response to PTO Office Action of Apr. 25, 2008.
U.S. Appl. No. 11/418,123—Jan. 26, 2009 PTO Office Action.
U.S. Appl. No. 11/418,124—Oct. 1, 2008 PTO Office Action.
U.S. Appl. No. 11/418,124—Feb. 2, 2009 Response to PTO Office Action of Oct. 1, 2008.
U.S. Appl. No. 11/418,124—Mar. 13, 2009 PTO Office Action.
U.S. Appl. No. 11/418,126—Oct. 12, 2006 PTO Office Action.
U.S. Appl. No. 11/418,126—Feb. 12, 2007 Response to PTO Office Action of Oct. 12, 2006 (Redacted).
U.S. Appl. No. 11/418,126—Jun. 6, 2007 PTO Office Action.
U.S. Appl. No. 11/418,126—Aug. 6, 2007 Response to PTO Office Action of Jun. 6, 2007.
U.S. Appl. No. 11/418,126—Nov. 2, 2007 PTO Office Action.
U.S. Appl. No. 11/418,126—Feb. 22, 2008 Response to PTO Office Action of Nov. 2, 2007.
U.S. Appl. No. 11/418,126—Jun. 10, 2008 PTO Office Action.
U.S. Appl. No. 11/418,127—Apr. 2, 2009 Office Action.
U.S. Appl. No. 11/418,128—Dec. 16, 2008 PTO Office Action.
U.S. Appl. No. 11/418,128—Dec. 31, 2008 Response to PTO Office Action of Dec. 16, 2008.
U.S. Appl. No. 11/418,128—Feb. 17, 2009 PTO Office Action.
U.S. Appl. No. 11/418,129—Dec. 16, 2008 Office Action.
U.S. Appl. No. 11/418,129—Dec. 31, 2008 Response to PTO Office Action of Dec. 16, 2008.
U.S. Appl. No. 11/418,263—Sep. 24, 2008 PTO Office Action.
U.S. Appl. No. 11/418,263—Sep. 24, 2008 Response to PTO Office Action of Sep. 24, 2008.
U.S. Appl. No. 11/418,263—Mar. 9, 2009 PTO Office Action.
U.S. Appl. No. 11/418,318—Mar. 31, 2009 PTO Office Action.
U.S. Appl. No. 11/441,219—Jan. 7, 2009 PTO Office Action.
U.S. Appl. No. 11/522,929—Oct. 22, 2007 PTO Office Action.
U.S. Appl. No. 11/522,929—Feb. 21, 2008 Response to PTO Office Action of Oct. 22, 2007.
U.S. Appl. No. 11/641,678—Jul. 22, 2008 PTO Office Action.
U.S. Appl. No. 11/641,678—Jan. 22, 2009 Response to Office Action of Jul. 22, 2008.
U.S. Appl. No. 11/711,000—Mar. 6, 2009 PTO Office Action.
U.S. Appl. No. 11/716,552—Feb. 12, 2009 Response to PTO Office Action of Feb. 9, 2009.
U.S. Appl. No. 11/716,552—Jul. 3, 2008 PTO Office Action.
Whiteside, Andy et al., "Dramatic Power Savings using Depressed Collector IOT Transmitters in Digital and Analog Service."
"Notice of Allowability" mailed on Jul. 2, 2009 in U.S. Appl. No. 11/410,905, filed Apr. 26, 2006.
"Notice of Allowability" mailed on Jun. 30, 2009 in U.S. Appl. No. 11/418,084, filed May 5, 2006.
Magellan 8500 Scanner Product Reference Guide, PSC Inc., 2004, pp. 6-27—F18.
Magellan 9500 with SmartSentry Quick Reference Guide, PSC Inc., 2004.
U.S. Appl. No. 11/411,130—Jun. 23, 2009 PTO Office Action.
U.S. Appl. No. 11/418,089—Jul. 15, 2009 PTO Office Action.
U.S. Appl. No. 11/418,096—Jun. 23, 2009 PTO Office Action.
Brau et al., "Tribute to John E Walsh", Nuclear Instruments and Methods in Physics Research Section A. Accelerators, Spectrometers, Detectors and Associated Equipment, vol. 475, Issues 1-3, Dec. 21, 2001, pp. xiii-xiv.
Kapp, et al., "Modification of a scanning electron microscope to produce Smith-Purcell radiation", Rev. Sci. Instrum. 75, 4732 (Nov. 2004).

Scherer et al. "Photonic Crystals for Confining, Guiding, and Emitting Light", IEEE Transactions on Nanotechnology, vol. 1, No. 1, Mar. 2002, pp. 4-11.
U.S. Appl. No. 11/203,407—Jul. 17, 2009 PTO Office Action.
U.S. Appl. No. 11/418,097—Sep. 16, 2009 PTO Office Action.
U.S. Appl. No. 11/418,123—Aug. 11, 2009 PTO Office Action.
U.S. Appl. No. 11/418,365—Jul. 23, 2009 PTO Office Action.
U.S. Appl. No. 11/441,240—Aug. 31, 2009 PTO Office Action.
Urata et al., "Superradiant Smith-Purcell Emission", Phys. Rev. Lett. 80, 516-519 (Jan. 19, 1998).
European Search Report mailed Nov. 2, 2009 (related to PCT/US2006/022782).
Gervasoni J.L. et al., "Plasmon Excitations in Cylindrical Wires by External Charged Particles," Physical Review B (Condensed Matter and Materials Physics) APS through AIP USA, vol. 68, No. 23, Dec. 15, 2003, pp. 235302-1, XP002548423, ISSN: 0163-1829.
Gervasoni, J.L., "Excitations of Bulk and Surface Plasmons in Solids and Nanostructures," Surface and Interface Analysis, Apr. 2006, John Wiley and Sons Ltd GB, vol. 38, No. 4, Apr. 2006, pp. 583-586, XP002548422.
U.S. Appl. No. 11/418,128—Nov. 24, 2009 PTO Office Action.
U.S. Appl. No. 11/418,263—Dec. 9, 2009 PTO Office Action.
"Array of Nanoklystrons for Frequency Agility or Redundancy," NASA's Jet Propulsion Laboratory, NASA Tech Briefs, NPO-21033. 2001.
"Hardware Development Programs," Calabazas Creek Research, Inc. found at http://calcreek.com/hardware.html.
"Antenna Arrays." May 18, 2002. www.tpub.com/content/neets/14183/css/14183_159.htm.
"Diffraction Grating," hyperphysics.phy-astr.gsu.edu/hbase/phyopt/grating.html.
Alford, T.L. et al., "Advanced silver-based metallization patterning for ULSI applications," Microelectronic Engineering 55, 2001, pp. 383-388, Elsevier Science B.V.
Amato, Ivan, "An Everyman's Free-Electron Laser?" Science, New Series, Oct. 16, 1992, p. 401, vol. 258 No. 5081, American Association for the Advancement of Science.
Andrews, H.L. et al., "Dispersion and Attenuation in a Smith-Purcell Free Electron Laser," The American Physical Society, Physical Review Special Topics—Accelerators and Beams 8 (2005), pp. 050703-1-050703-9.
Backe, H. et al. "Investigation of Far-Infrared Smith-Purcell Radiation at the 3.41 MeV Electron Injector Linac of the Mainz Microtron MAMI," Institut fur Kernphysik, Universitat Mainz, D-55099, Mainz Germany.
Bakhtyari, A. et al., "Horn Resonator Boosts Miniature Free-Electron Laser Power," Applied Physics Letters, May 12, 2003, pp. 3150-3152, vol. 82, No. 19, American Institute of Physics.
Bakhtyari, Dr. Arash, "Gain Mechanism in a Smith-Purcell MicroFEL," Abstract, Department of Physics and Astronomy, Dartmouth College.
Bhattacharjee, Sudeep et al., "Folded Waveguide Traveling-Wave Tube Sources for Terahertz Radiation." IEEE Transactions on Plasma Science, vol. 32. No. 3, Jun. 2004, pp. 1002-1014.
Booske, J.H. et al., "Microfabricated TWTs as High Power, Wideband Sources of THz Radiation".
Brau, C.A. et al., "Gain and Coherent Radiation from a Smith-Purcell Free Electron Laser," Proceedings of the 2004 FEL Conference, pp. 278-281.
Brownell, J.H. et al., "Improved µFEL Performance with Novel Resonator," Jan. 7, 2005, from website: www.frascati.enea.it/thz-bridge/workshop/presentations/Wednesday/We-07-Brownell.ppt.
Brownell, J.H. et al., "The Angular Distribution of the Power Produced by Smith-Purcell Radiation," J. Phys. D: Appl. Phys. 1997, pp. 2478-2481, vol. 30, IOP Publishing Ltd., United Kingdom.
Chuang, S.L. et al., "Enhancement of Smith-Purcell Radiation from a Grating with Surface-Plasmon Excitation," Journal of the Optical Society of America, Jun. 1984, pp. 672-676, vol. 1 No. 6, Optical Society of America.
Chuang, S.L. et al., "Smith-Purcell Radiation from a Charge Moving Above a Penetrable Grating," IEEE MTT-S Digest, 1983, pp. 405-406, IEEE.

Far-IR, Sub-MM & MM Detector Technology Workshop list of manuscripts, session 6 2002.
Feltz, W.F. et al., "Near-Continuous Profiling of Temperature, Moisture, and Atmospheric Stability Using the Atmospheric Emitted Radiance Interferometer (AERI)," Journal of Applied Meteorology, May 2003, vol. 42 No. 5, H.W. Wilson Company, pp. 584-597.
Freund, H.P. et al., "Linearized Field Theory of a Smith-Purcell Traveling Wave Tube," IEEE Transactions on Plasma Science, Jun. 2004, pp. 1015-1027, vol. 32 No. 3, IEEE.
Gallerano, G.P. et al., "Overview of Terahertz Radiation Sources," Proceedings of the 2004 FEL Conference, pp. 216-221.
Goldstein, M. et al., "Demonstration of a Micro Far-Infrared Smith-Purcell Emitter," Applied Physics Letters, Jul. 28, 1997, pp. 452-454, vol. 71 No. 4, American Institute of Physics.
Gover, A. et al., "Angular Radiation Pattern of Smith-Purcell Radiation," Journal of the Optical Society of America, Oct. 1984, pp. 723-728, vol. 1 No. 5, Optical Society of America.
Grishin, Yu. A. et al., "Pulsed Orotron—A New Microwave Source for Submillimeter Pulse High-Field Electron Paramagnetic Resonance Spectroscopy," Review of Scientific Instruments, Sep. 2004, pp. 2926-2936, vol. 75 No. 9, American Institute of Physics.
Ishizuka, H. et al., "Smith-Purcell Experiment Utilizing a Field-Emitter Array Cathode: Measurements of Radiation," Nuclear Instruments and Methods in Physics Research, 2001, pp. 593-598, A 475, Elsevier Science B.V.
Ishizuka, H. et al., "Smith-Purcell Radiation Experiment Using a Field-Emission Array Cathode," Nuclear Instruments and Methods in Physics Research, 2000, pp. 276-280, A 445, Elsevier Science B.V.
Ives, Lawrence et al., "Development of Backward Wave Oscillators for Terahertz Applications," Terahertz for Military and Security Applications, Proceedings of SPIE vol. 5070 (2003), pp. 71-82.
Ives, R. Lawrence, "IVEC Summary, Session 2, Sources I" 2002.
Jonietz, Erika, "Nano Antenna Gold nanospheres show path to all-optical computing," Technology Review, Dec. 2005/Jan. 2006, p. 32.
Joo, Youngcheol et al., "Air Cooling of IC Chip with Novel Microchannels Monolithically Formed on Chip Front Surface," Cooling and Thermal Design of Electronic Systems (HTD-vol. 319 & EEP-vol. 15), International Mechanical Engineering Congress and Exposition, San Francisco, CA Nov. 1995 pp. 117-121.
Joo, Youngcheol et al., "Fabrication of Monolithic Microchannels for IC Chip Cooling," 1995, Mechanical, Aerospace and Nuclear Engineering Department, University of California at Los Angeles.
Jung, K.B. et al., "Patterning of Cu, Co, Fe, and Ag for magnetic nanostructures," J. Vac. Sci. Technol. A 15(3), May/Jun. 1997, pp. 1780-1784.
Kapp, Oscar H. et al., "Modification of a Scanning Electron Microscope to Produce Smith-Purcell Radiation," Review of Scientific Instruments, Nov. 2004, pp. 4732-4741, vol. 75 No. 11, American Institute of Physics.
Kiener, C. et al., "Investigation of the Mean Free Path of Hot Electrons in GaAs/AlGaAs Heterostructures," Semicond. Sci. Technol., 1994, pp. 193-197, vol. 9, IOP Publishing Ltd., United Kingdom.
Kim, Shang Hoon, "Quantum Mechanical Theory of Free-Electron Two-Quantum Stark Emission Driven by Transverse Motion," Journal of the Physical Society of Japan, Aug. 1993, vol. 62 No. 8, pp. 2528-2532.
Korbly, S.E. et al., "Progress on a Smith-Purcell Radiation Bunch Length Diagnostic," Plasma Science and Fusion Center, MIT, Cambridge, MA.
Kormann, T. et al., "A Photoelectron Source for the Study of Smith-Purcell Radiation".
Kube, G. et al., "Observation of Optical Smith-Purcell Radiation at an Electron Beam Energy of 855 MeV," Physical Review E, May 8, 2002, vol. 65, The American Physical Society, pp. 056501-1-056501-15.
Liu, Chuan Sheng, et al., "Stimulated Coherent Smith-Purcell Radiation from a Metallic Grating," IEEE Journal of Quantum Electronics, Oct. 1999, pp. 1386-1389, vol. 35, No. 10, IEEE.
Manohara, Harish et al., "Field Emission Testing of Carbon Nanotubes for THz Frequency Vacuum Microtube Sources." Abstract. Dec. 2003. from SPIEWeb.
Manohara, Harish M. et al., "Design and Fabrication of a THz Nanoklystron".

Manohara, Harish M. et al., "Design and Fabrication of a THz Nanoklystron" (www.sofia.usra.edu/det_workshop/ posters/session 3/3-43manohara poster.pdf), PowerPoint Presentation.

McDaniel, James C. et al., "Smith-Purcell Radiation in the High Conductivity and Plasma Frequency Limits," Applied Optics, Nov. 15, 1989, pp. 4924-4929, vol. 28 No. 22, Optical Society of America.

Meyer, Stephan, "Far IR, Sub-MM & MM Detector Technology Workshop Summary," Oct. 2002. (may date the Manohara documents).

Mokhoff, Nicolas, "Optical-speed light detector promises fast space talk," EETimes Online, Mar. 20, 2006, from website: www.eetimes.com/showArticle.jhtml?articleID=183701047.

Nguyen, Phucanh et al., "Novel technique to pattern silver using CF4 and CF4/O2 glow discharges," J.Vac. Sci. Technol. B 19(1), Jan./Feb. 2001, American Vacuum Society, pp. 158-165.

Nguyen, Phucanh et al., "Reactive ion etch of patterned and blanket silver thin films in Cl2/O2 and O2 glow discharges," J. Vac. Sci, Technol. B. 17 (5), Sep./Oct. 1999, American Vacuum Society, pp. 2204-2209.

Ohtaka, Kazuo, "Smith-Purcell Radiation from Metallic and Dielectric Photonic Crystals," Center for Frontier Science, pp. 272-273, Chiba University, 1-33 Yayoi, Inaqe-ku, Chiba-shi, Japan.

Phototonics Research, "Surface-Plasmon-Enhanced Random Laser Demonstrated," Photonics Spectra, Feb. 2005, pp. 112-113.

Platt, C.L. et al., "A New Resonator Design for Smith-Purcell Free Electron Lasers," 6Q19, p. 296.

Potylitsin, A.P., "Resonant Diffraction Radiation and Smith-Purcell Effect," (Abstract), arXiv: physics/9803043 v2 Apr. 13, 1998.

Potylitsyn, A.P., "Resonant Diffraction Radiation and Smith-Purcell Effect," Physics Letters A, Feb. 2, 1998, pp. 112-116, A 238, Elsevier Science B.V.

S. Hoogland et al., "A solution-processed 1.53 μm quantum dot laser with temperature-invariant emission wavelength," Optics Express, vol. 14, No. 8, Apr. 17, 2006, pp. 3273-3281.

Savilov, Andrey V., "Stimulated Wave Scattering in the Smith-Purcell FEL," IEEE Transactions on Plasma Science, Oct. 2001, pp. 820-823, vol. 29 No. 5, IEEE.

Schachter, Levi et al., "Smith-Purcell Oscillator in an Exponential Gain Regime," Journal of Applied Physics, Apr. 15, 1989, pp. 3267-3269, vol. 65 No. 8, American Institute of Physics.

Schachter, Levi, "Influence of the Guiding Magnetic Field on the Performance of a Smith-Purcell Amplifier Operating in the Weak Compton Regime," Journal of the Optical Society of America, May 1990, pp. 873-876, vol. 7 No. 5, Optical Society of America.

Schachter, Levi, "The Influence of the Guided Magnetic Field on the Performance of a Smith-Purcell Amplifier Operating in the Strong Compton Regime," Journal of Applied Physics, Apr. 15, 1990, pp. 3582-3592, vol. 67 No. 8, American Institute of Physics.

Shih, I. et al., "Experimental Investigations of Smith-Purcell Radiation," Journal of the Optical Society of America, Mar. 1990, pp. 351-356, vol. 7, No. 3, Optical Society of America.

Shih, I. et al., "Measurements of Smith-Purcell Radiation," Journal of the Optical Society of America, Mar. 1990, pp. 345-350, vol. 7 No. 3, Optical Society of America.

Swartz, J.C. et al., "THz-FIR Grating Coupled Radiation Source," Plasma Science, 1998. 1D02, p. 126.

Temkin, Richard, "Scanning with Ease Through the Far Infrared," Science, New Series, May 8, 1998, p. 854, vol. 280, No. 5365, American Association for the Advancement of Science.

Walsh, J.E., et al., 1999. From website: http://www.ieee.org/organizations/pubs/newsletters/leos/feb99/hot2.htm.

Wentworth, Stuart M. et al., "Far-Infrared Composite Microbolometers," IEEE MTT-S Digest, 1990, pp. 1309-1310.

Yamamoto, N. et al., "Photon Emission From Silver Particles Induced by a High-Energy Electron Beam," Physical Review B, Nov. 6, 2001, pp. 205419-1-205419-9, vol. 64, The American Physical Society.

Yokoo, K. et al., "Smith-Purcell Radiation at Optical Wavelength Using a Field-Emitter Array," Technical Digest of IVMC, 2003, pp. 77-78.

Zeng, Yuxiao et al., "Processing and encapsulation of silver patterns by using reactive ion etch and ammonia anneal," Materials Chemistry and Physics 66, 2000, pp. 77-82.

\* cited by examiner

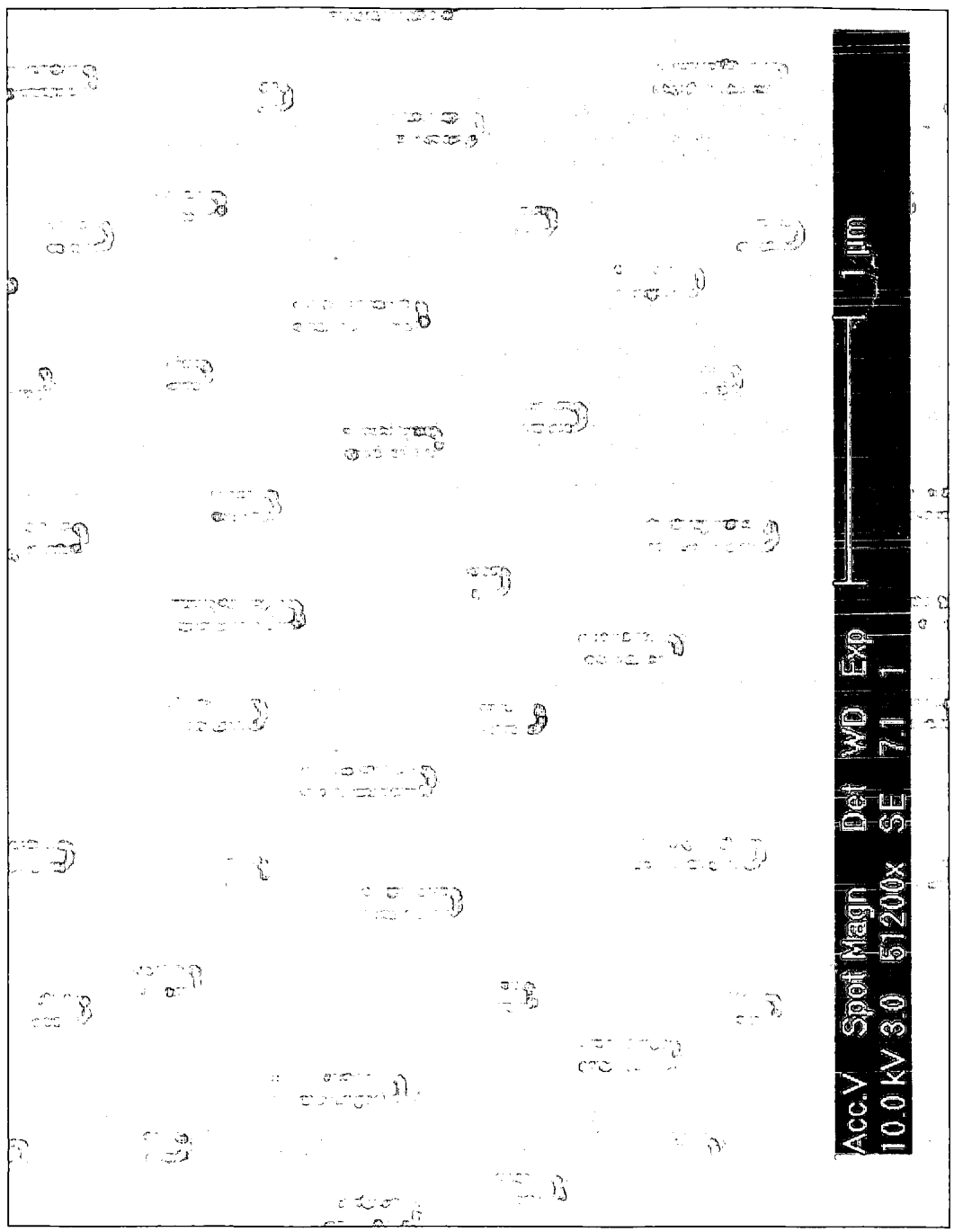

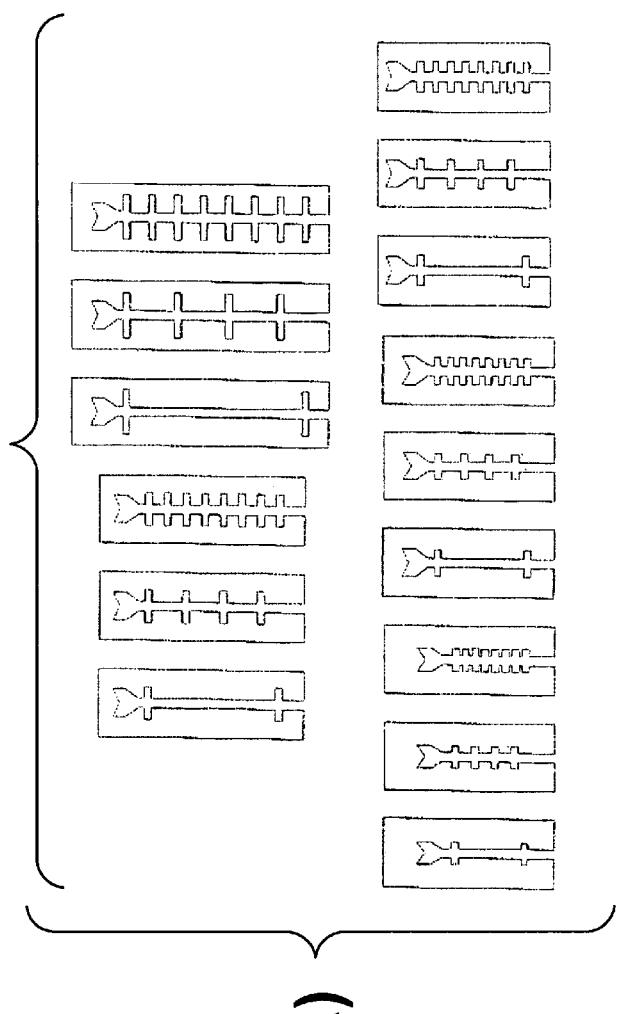
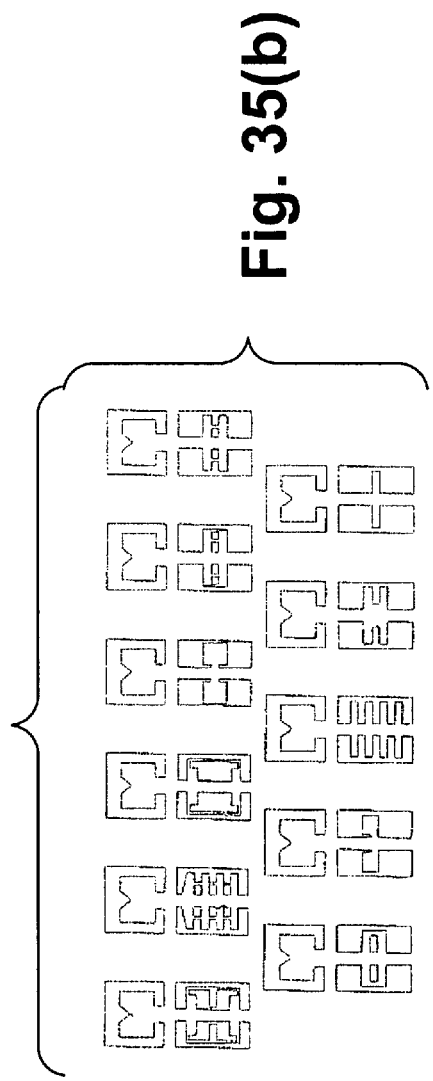

METHODS OF PRODUCING STRUCTURES FOR ELECTRON BEAM INDUCED RESONANCE USING PLATING AND/OR ETCHING

RELATED APPLICATIONS

This application is a continuation of U.S. patent application Ser. No. 11/243,477 filed Oct. 5, 2005 now U.S. Pat. No. 7,626,179 which is a continuation-in-part of U.S. patent application Ser. No. 11/238,991, filed Sep. 30, 2005. This application is also a continuation-in-part of U.S. patent application Ser. No. 11/203,407, filed Aug. 15, 2005 now abandoned. This application is also a continuation-in-part of U.S. patent application Ser. No. 10/917,511 filed Aug. 13, 2004 now abandoned. This application is related to U.S. application Ser. No. 11/243,476 filed on Oct. 5, 2005, titled "Structures And Methods For Coupling Energy From An Electromagnetic Wave," which is commonly owned with the present application at the time of filing. The entire contents of each of the above applications are incorporated herein by reference.

COPYRIGHT NOTICE

A portion of the disclosure of this patent document contains material which is subject to copyright or mask work protection. The copyright or mask work owner has no objection to the facsimile reproduction by anyone of the patent document or the patent disclosure, as it appears in the Patent and Trademark Office patent file or records, but otherwise reserves all copyright or mask work rights whatsoever.

FIELD OF THE INVENTION

This disclosure relates to ultra-small resonant structures for producing high frequency electromagnetic radiation (as described in U.S. patent application Ser. No. 11/243,477) from a process including either or both of plating (as described in U.S. patent application Ser. No. 11/203,407) or etching (as described in U.S. patent application Ser. No. 11/203,407).

BRIEF DESCRIPTION OF THE DRAWINGS

FIGS. 29-35(*b*) are reproduced in substance from U.S. patent application Ser. No. 11/203,407 and are described in greater detail in the section below associated with that application.

TABLE OF THE DISCLOSURE

Figure 1A:
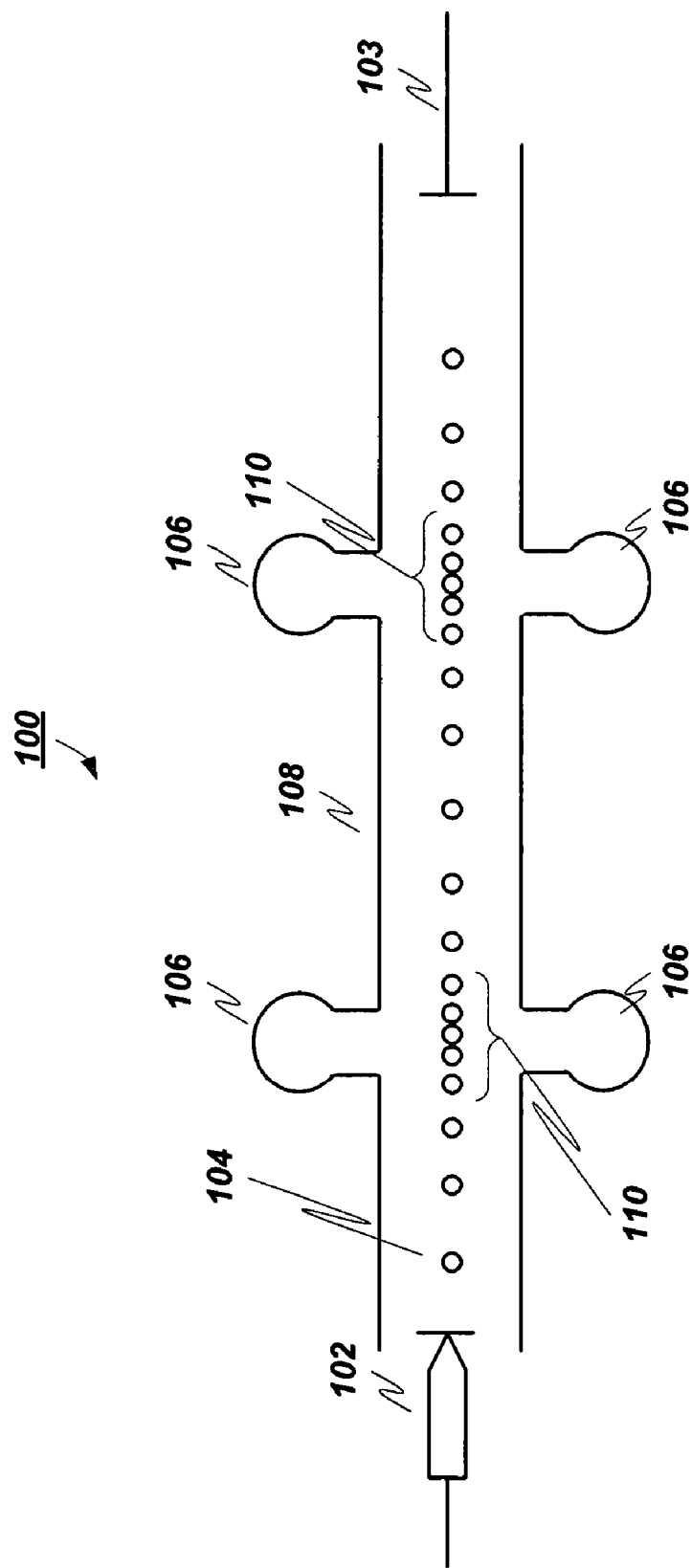
FIGS. 1-24 are reproduced in substance from U.S. patent application Ser. No. 11/243,477 and are described in greater detail in the section below associated with that application.

A. Express Incorporation of the substance of U.S. application Ser. No. 10/917,511

B. Express Incorporation of the substance of U.S. application Ser. No. 11/243,476

C. Express Incorporation of the substance of U.S. application Ser. No. 11/243,477

A. U.S. application Ser. No. 10/917,511 ("the '511 Application"), Entitled "Patterning Thin Metal Films by Dry Reactive Ion Etching"

This relates to the field of metal etching, and particularly to patterning thin metal films by dry reactive ion etching.

A.i. Introduction to the '511 Application

We describe a new method for etching patterns in silver, copper, or gold, or other plate metal thin films. In some of the embodiments, the method consists of putting a pattern of a hard mask onto the surface of the thin film, followed by reactive ion etching using a plasma formed using a gas feed of some combination of some amounts of methane ($CH_4$) and hydrogen ($H_2$), and some or no amount of Argon (Ar). The areas of silver, copper or gold not covered by the hard mask are etched while the hard mask protects those areas that will form the raised portions of thin film in the final structure.

One potential use for patterning silver thin films is in the production of integrated circuits. Typically, aluminum is used as the primary conductor for interconnects and integrated circuits. However, the conductivity of aluminum is relatively poor compared to copper or silver. In addition, aluminum is subject to a phenomenon known as electro-migration, which causes failure of interconnects after long-term use. Higher molecular weight metals such as silver are less susceptible to electro-migration. The higher conductivity of silver and copper can also lead to higher efficiency, lower energy loss devices.

In recent years, integrated circuits have been produced using copper interconnects. However, the copper cannot be patterned using known conventional dry etched techniques. Typically, that copper has to be patterned using the so-called "Damascene" process. That process is a multi-step process, which involves chemical mechanical polishing. This is a highly complicated and difficult to control process in the production environment. It is advantageous to develop an improved dry etched process for silver, which is compatible with conventional dry etch process tools such as inductively coupled plasma (ICP) space or electron cyclotron resonance (ECR) high density plasma reactors.

There have been several efforts to develop dry etch processes for silver based on halogen chemistries (e.g. Chlorine ($Cl_2$), tetrafluoromethane ($CF_4$), sulfur hexafluoride ($SF_6$)). While halogen chemistries work well for silicon-based thin films, it has been repeatedly found that silver halides are not volatile enough to be easily removed from the surface during the etch process. This results in residues of silver halides forming on the surface, which then must be removed by some post-processing technique. Alternatively, it has been proposed that halides chemistries can be used when the substrate is held at elevated temperatures (~200° C.). At elevated temperature, the vapor pressure of the formed halides is high enough that they are removed from the surface during the reactive ion etch. In many cases, high temperatures can lead to problems of diffusion and grain growth of the materials and layers on the device. This problem is exacerbated by the very small size of the features in modern integrated circuits and devices.

In U.S. Pat. No. 5,157,000, Elkind et al. teach a method to dry etch openings in the surface of a wafer made of Group II and Group VI elements. Elkind et al describe a second processing step after the dry etch, namely a wet etching step to smooth and expand the openings. Elkind et al do not describe an acceptable way to eliminate that second processing step.

In U.S. Pat. No. 5,705,443, Stauf et al. teach a method of plasma assisted dry etching to remove material from a metal containing layer. No patterns are formed in the surface.

In U.S. Pat. No. 6,080,529, Ye et al. teach a method of etching patterns into a conductive surface. The conductive surface is coated with a high-temperature masking material, which is imaged and processed to produce a patterned mask in any suitable standard method. The mask pattern is transferred to the conductive surface using an anisotropic etch process. After the etch, Ye et al describe a second processing step to remove the residual masking material is then removed with a plasma etching step. Ye et al do not an acceptable way to eliminate the second processing step.

Alford et al. in an article published in Microelectronic Engineering 55 (2001) 383-388 studied the etching and patterning of silver thin films. Alford et al. used pure $CF_4$, which creates a silver fluoride (AgF) species that must be removed in a secondary processing step.

K. B. Jung et al. in the article entitled "Patterning of Cu, Co, Fe, and Ag for Magnetic Nanostructures," (J. Vac. Sci. Tech. A, 15(3), May/June 1997, pp 1780-1784) disclose a method of etching silver samples, using a gas mixture of $CH_4/H_2/Ar$. The researchers present evidence of patterns etched in copper, but did not pattern the silver surfaces. In contrast, a presently described method produces intricate patterns of nanostructures that provide the opportunity to etch in a single step (or more, only if desired) and in a way that is compatible with industrial microprocessor production. Further, the etch chemistry disclosed by Jung et al. still requires a method for producing patterns, such as is described in the presently preferred embodiment.

Nguyen et al, "Novel Technique to Pattern Silver Using CF4 and CF4/O2 Glow Discharges," J. Vac. Sci. Technol. B 19, No. 1, January/February 2001, 1071-1023, used $CF_4$ RIE followed by a secondary rinse to do the etching. Nguyen et al also looked at $Cl_2/O_2$ chemistry for etching. With this chemistry, they believe that Cl—O—Ag compounds form then are sputtered away. The resulting surfaces tended to be rough as the $Cl_2$ corroded the silver. The researchers did etch lines into the silver, on the order of 10 microns in width.

Zeng et. al., "Processing and encapsulation of silver patterns by using reactive ion etch and ammonia anneal," Materials Chemistry and Physics 66 (2000) 77-82 etched silver films using an oxygen plasma, which caused the silver to oxidize and flake unless encapsulated in an atmosphere of flowing ammonia gas. This processing method is incompatible with current semiconductor processing practice.

We have discovered new methods of dry etching the surface of, for example, silver films. The methods can be designed to avoid any secondary wet etch, although the invention does not prevent such a wet etch (or other secondary processing step) if the artisan optionally wishes for other reasons to incorporate one or more. We have discovered, for example, that when etching silver in a dry etch reactor using a mixture of methane and hydrogen, and in some instances also argon to generate a combination of reaction with the silver surface, volatile hydrides and/or hydrocarbons that are formed will volatilize spontaneously or undergo sputter assisted removal. Such a method is compatible with micro-electronic processing.

The dry etching method yields smooth, sub-micron sized features and, for the first time, can selectively do so with or without a preliminary and/or secondary etch process and remain in compatibility with industrial microprocessor production.

One example mixture includes any fraction of methane (1-99%), hydrogen (1-99%), and argon (0-99%) in a plasma etcher.

In an example embodiment, we describe the use of a hard mask resistant to etching by methane, hydrogen and argon.

We also describe a method of etching silver films that is compatible with micro-electronic processing.

Methods that we describe can be used to etch smooth, fine patterns into silver films in a single etching step, with no secondary etching step required. Although the invention does not necessarily preclude secondary or preliminary etchings, the methods described can provide new ways to eliminate secondary and preliminary etchings, if so desired.

Our described methods also can be used to produce smooth fine features of any size or form factor with other metals.

A.ii. Brief Description of the Drawings from the '511 Application

Figure 25A:
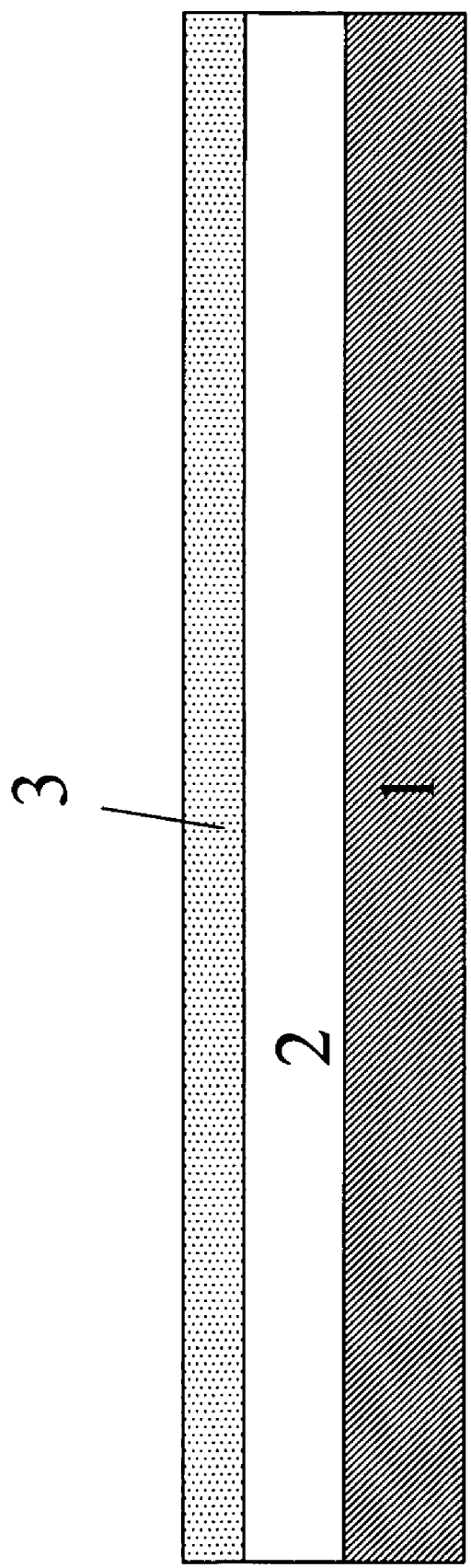
FIGS. 25A-28 are reproduced in substance from U.S. patent application Ser. No. 10/917,511 and are described in greater detail in the section below associated with that application.

FIG. 25A is a schematic drawing of a substrate coated with a thin metallic film and a layer of masking material.

Figure 25B:
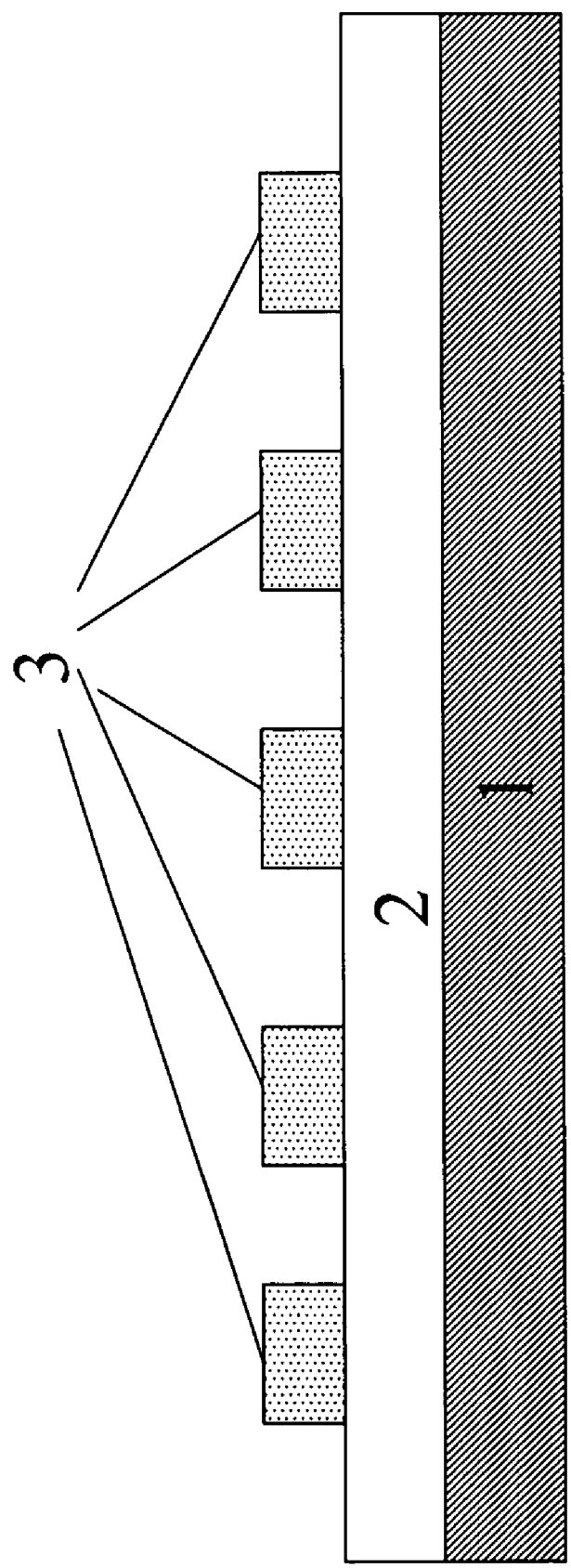

FIG. 25B is a schematic drawing showing the pattern formed in the masking material.

Figure 26:
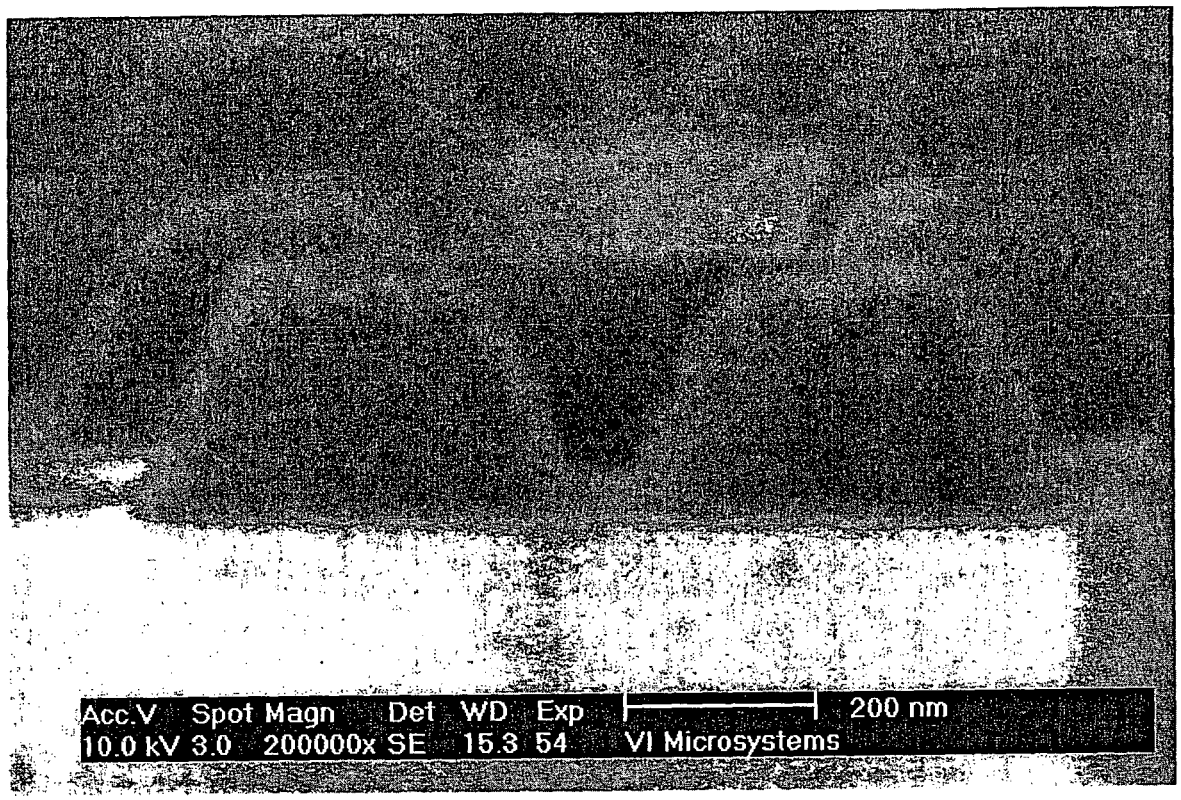

FIG. 26 is a scanning electron microscope (SEM) photograph of typical etch profile of structure and etched using the preferred embodiment.

Figure 27:
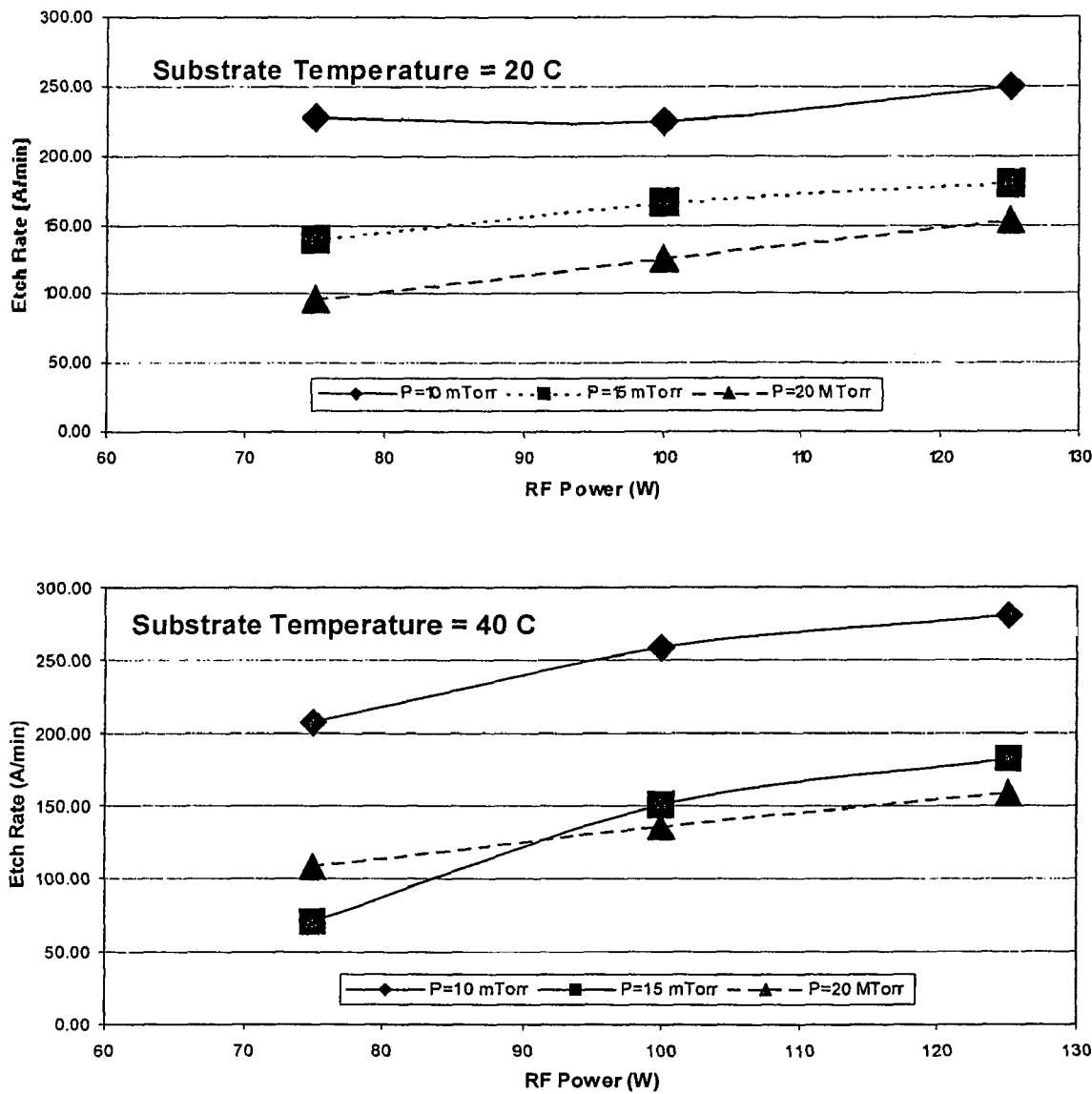

FIG. 27 is a set of graphs that show the effect of RF power, pressure, and substrate temperature on etch rate of silver for a gas composition consisting of 11.5 sccm $H_2$, 8.5 sccm $CH_4$, and 10 sccm Ar.

Figure 28:
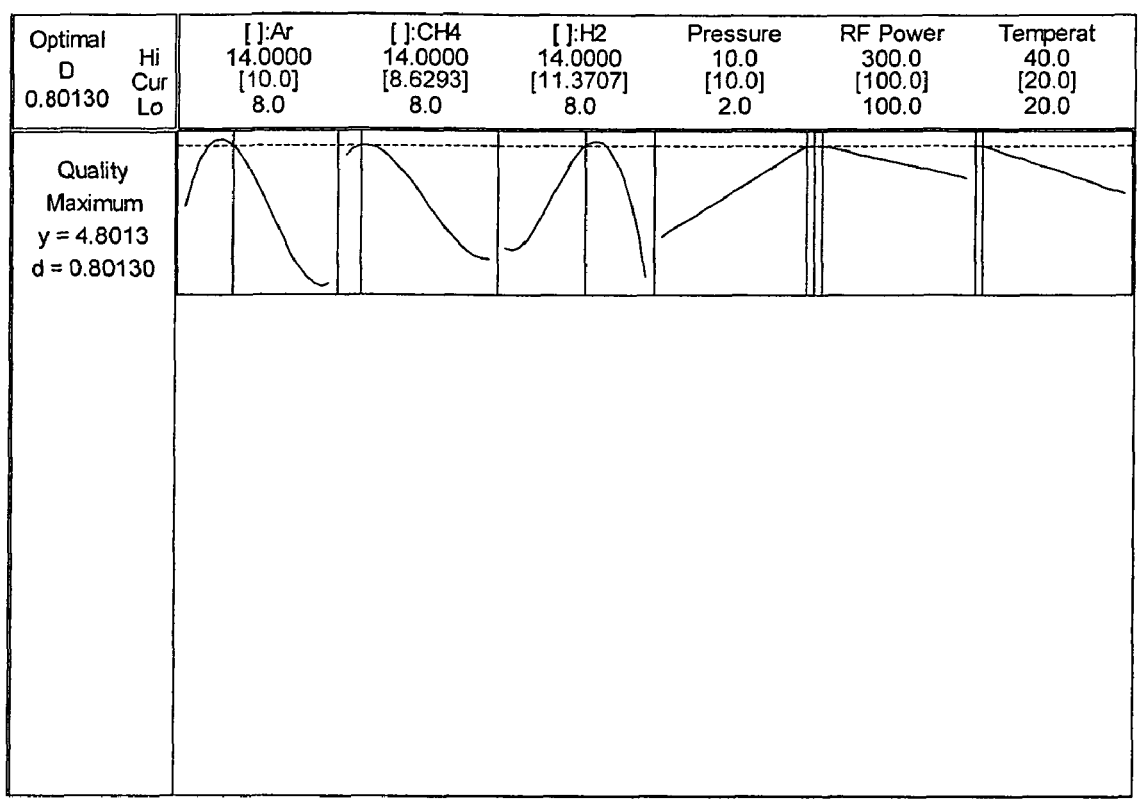

FIG. 28 is a series of graphs illustrating the optimal conditions for the preferred embodiment.

A.iii. Detailed Description from the '511 Application

In FIG. 25A a substrate 1 is shown coated with a metallic layer 2. In the preferred embodiment, the substrate, 1, is comprised of silicon, and can be smooth and suitable for coating with a metal layer. In the preferred embodiment, the layer 2 is a thin film of silver, however, thin layers of copper or gold are also suitable.

A hard mask layer 3 is shown deposited on top of the metal layer 2. In the preferred embodiment, a chromium layer is used as the etch resist mask. There is no requirement that the masking material be chromium. The masking material could be any material that is capable of withstanding the plasma chemistry long enough to protect the silver in the areas where no etching is desired. These may include, but are not limited to, a metal layer, a ceramic layer such as silicon nitride or silicon oxide, or a soft material such as a polymer or photoresist.

Alternatively, poly-methyl methacrylate (PMMA) is used as the etch mask when the Ag film is in the 100 to 200 nm range of thickness. In this case, the selectivity (ratio of resist etch rate to Ag etch rate) is around 1:1, but the PMMA can be made thicker than the Ag. This allows the Ag to be etched through the full thickness prior to the resist being etched through.

In addition, other photoresists that are more resistant to etching in this chemistry can be used to etch thicker layers of Ag. However, many of these resists are reactive towards the Ag. In this case, a thin layer of carbon a few nanometers in thickness is evaporated over the layer of silver to act as a diffusion barrier and stop the reaction of the photoresist with the Ag film. Once the pattern is written into the resist mask, the carbon layer can be easily removed from the silver with, for example, a short oxygen plasma or ozone treatment.

In FIG. 25B, the hard mask layer 3 is shown patterned on top of the silver layer. In the preferred embodiment, the patterning is done using the "lift-off" method, familiar to those skilled in the art. Alternatively, any method of patterning that results in the desired feature size may be used to pattern the hard mask layer 3.

After the mask is patterned, the sample is placed into a reactor. The reactor is preferably an ECR reactor, although it could be an ICP, straight RF plasma, a DC "glow discharge" plasma, or other suitable reactor. It could also be any other source capable of generating reactive atoms and molecules from the source gas, is such as a laser. In the preferred embodiment a mixture of methane, hydrogen, and argon, flows into the reactor.

FIG. 26 is a scanning electron microscope micrograph that shows a silver film etched using the preferred embodiment of the invention. The patterned features are 400 nm at their base and 200 nm high and are spaced less than 100 nm apart. The features are smooth and can be made devoid of the masking layer.

It is well known that the optimal reactor conditions such as power density, temperature, pressure and gas composition depend strongly upon the type of reactor, the size and shape of the features being etched. Consideration must also be given to the balance between effects such as desirable etch rates and mask selectivity, minimum feature size, and etch profile. These factors are typically assigned some weight based on their importance, and a full optimization of the reactor conditions is performed.

The results optimization of the etch conditions, used in the preferred embodiment, are shown in FIG. 27. The etch conditions were optimized on a Plasmatherm model 770SLR ECR etch tool equipped with numerous source gases, including methane, hydrogen, Argon and Helium. The optimization was performed on structures with nominal feature sizes on the order of 0.5 um etched to a nominal depth of 0.5 um. Initial experiments showed that good etch rates (~25 nm/min) were obtained with the reactor pressure of 10 mTorr, RF power of 100W, substrate temperature of 20C, 400W ECR microwave power, and flow rates of 11.5, 8.5, and 10 SCCM (standard cubic centimeters per minute) of hydrogen, methane and Argon, respectively. These conditions were found to be optimal for this particular rectangular geometry features, using Cr as an etch mask on the Plasmatherm 770.

The same basic chemistry consisting of mixtures of methane, hydrogen, and argon may be found to provide satisfactory results at different compositions and specific reactor conditions, depending upon the desired balance between critical dimensions, etch rates, and mask selectivity. Typically, the ideal condition is determined by a statistical design of experiments (DOE) to make a model, which is then used to determine the optimal condition. Some results and trends from one such DOE are shown in FIG. 28.

Figure 4:
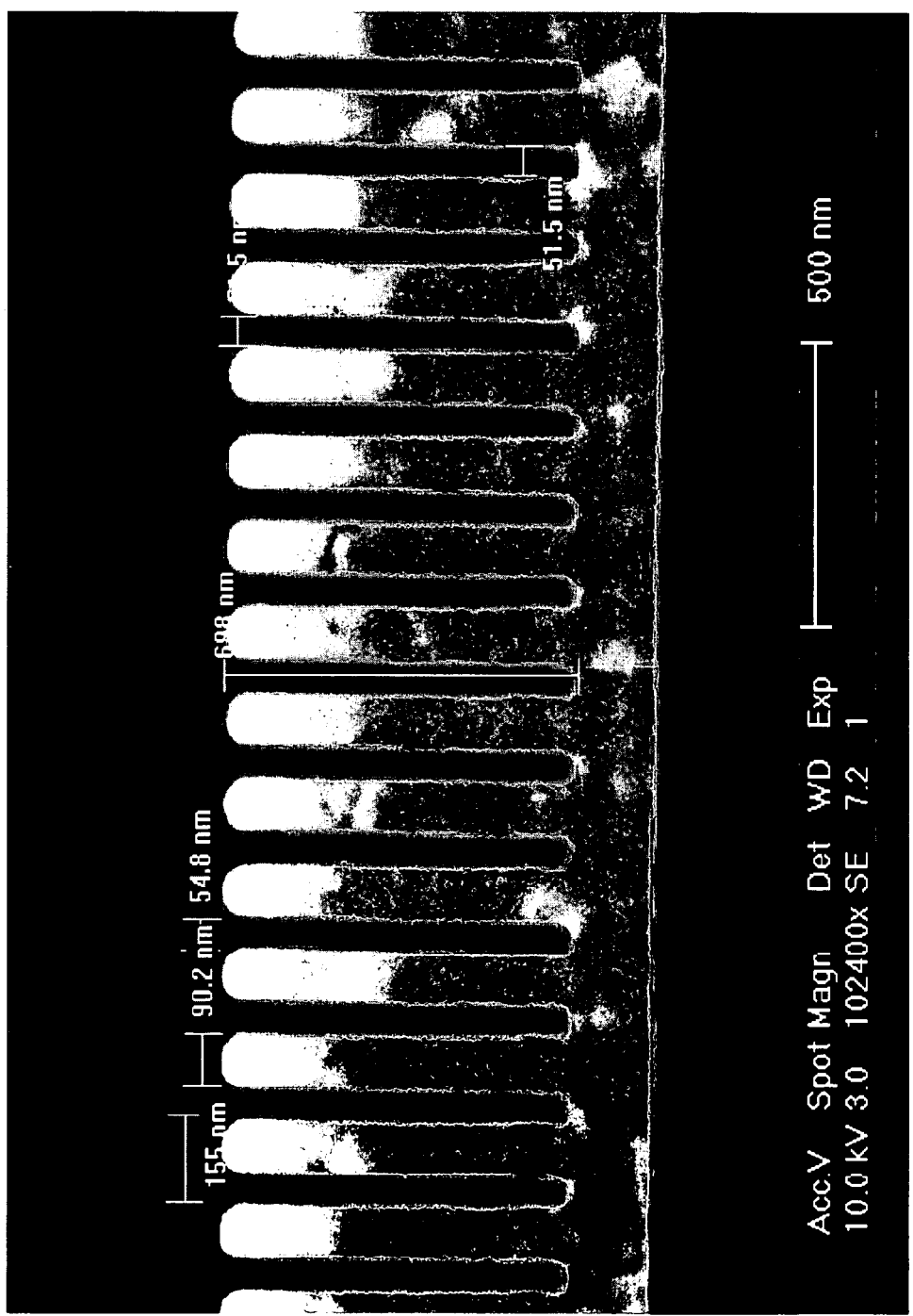

In the plots of FIG. 28, the quality of each etch condition is quantified by a qualitative factor which ranged from 1 to 5, representing poor to good etches. This factor is a subjective factor determined by inspection of the etched test patterns and takes into account the critical dimension, mask selectivity, etch rate, particle generation etc. The plots in FIG. 4 show the variation of the model with each of the parameters shown, with the other parameters held constant at their optimal conditions. This optimal etch condition produced small, cleanly etched features with sidewall angles of 75-80 degrees.

As expected, the overall trend is that as the pressure goes up, the etch rates go down. This is consistent with a mechanism involving the formation of volatile species bound to the surface, followed by sputter-assisted desorption.

B. U.S. application Ser. No. 11/203,407 ("the '407 Application"), Entitled "Method Of Patterning Ultra-Small Structures"

This disclosure relates to patterning ultra-small structures using pulsed electroplating.

B.i. Introduction to the '407 Application

Electroplating is well known and is used in a variety of applications, including the production of microelectronics. For example, an integrated circuit can be electroplated with copper to fill structural recesses such as blind via structures.

In a basic electroplating procedure, samples are immersed in a suitable solution containing ions, typically cations, but anionic solutions are also known. An appropriate electrode is also immersed in the solution and a charge is applied that causes the deposition of metals ions from the solution onto the sample surface via an ionic reaction.

The current density, established by adjusting the electrode potential, controls the reaction rate at the sample surface. At high current density, the reaction rate becomes limited by diffusion of ions in the solution. Pulsed electroplating, also known as pulse plating, alters the current or voltage applied to the sample according to a predetermined waveform. The shape of the waveform pattern depends upon the required surface characteristics of the final plated structure.

Pulse plating can permit the use of simpler solutions containing fewer additives to achieve the plated surface. Pulse plating is well known as a method of improving coating density, ductility, hardness, electrical conductivity, wear resistance and roughness. In addition, pulse plating provides more uniform plating than other plating methods.

The production of compact, nonporous and smooth vertical surfaces is difficult with existing electroplating techniques. Porous structural morphologies produced in a controlled and predictable manner can also be advantageous to device designers.

Ultra-small structures encompass a range of structure sizes sometimes described as micro- or nano-sized. Objects with dimensions measured in ones, tens or hundreds of microns are described as micro-sized. Objects with dimensions measured in ones, tens or hundreds of nanometers or less are commonly designated nano-sized. Ultra-small hereinafter refers to structures and features ranging in size from hundreds of microns in size to ones of nanometers in size.

Catalysts, sensors, and filters represent a non-exhaustive list of examples of devices that can be fabricated or enhanced with structures of a porous morphology. The ability to create three-dimensional structures with a designed predictable structural morphology offers designers a method to realize new devices.

Ultra-small three-dimensional surface structures with sidewalls can be fabricated with coating techniques such as evaporation or sputtering. In both these techniques, a negative of the desired surface structures is created, usually using photolithographic techniques well known in the art. The patterned surface is then placed into a vacuum chamber and coated with the final material. After coating, the residual resist is removed.

However, with these techniques, patterned structures are known to cause a shadowing effect to occur during coating such that material deposition is uneven across the breadth of the patterned surface. In addition, the angles between the sidewalls created and the substrate surface often have angles other than the desired 90° orientation. The ability to create smooth, dense sidewalls oriented at a 90° angle relative to the substrate surface is desirable for the fabrication of a variety of ultra-small devices.

The ability to build significantly larger three-dimensional structures with smooth dense sidewalls employing the similar processing offers advantages to device designers. For example, smooth, dense sidewalls increase the efficiency of optical device function. It may also be beneficial in some microfluidic application.

Recent emphasis in the arts relates to the production of dense, smooth contiguous coatings using pulse-electroplating techniques. For example, in U.S. Patent Publication No. 20040231996A1, Web et al. describe a method of plating a copper layer onto a wafer with an integrated circuit including depressions using a pulse plating technique. In the preferred embodiment disclosed, the wafer is rotated during deposition. The rate of rotation affects the quality of layer produced. Depressions within the circuit layer are filled during the plating process.

Electroplating dendritic three-dimensional surface structures using electroplating techniques is also known. For example, U.S. Pat. No. 5,185,073, to Bindra et al., includes a description of forming dendritic surface structures using pulsed electroplating techniques. The structures produced are dense, but have angled sidewalls.

In 1995, Joo et al ("Air Cooling Of IC Chip With Novel Microchannels Monolithically Formed On Chip Front Surface," Cooling and Thermal Design of Electronic Systems (HTD-Vol. 319 & EEP-Vol. 15), International Mechanical Engineering Congress and Exposition, San Francisco, Calif., November 1995, pp. 117-121) described fabricated cooling channels using direct current electroplate of nickel. The smoothness and microstructure of the walls created was not an issue. Direct current electro-plating processing tends to produce non-uniform structures across a die or wafer.

B.ii. Brief Description of Figures from the '407 Application

Figure 29:
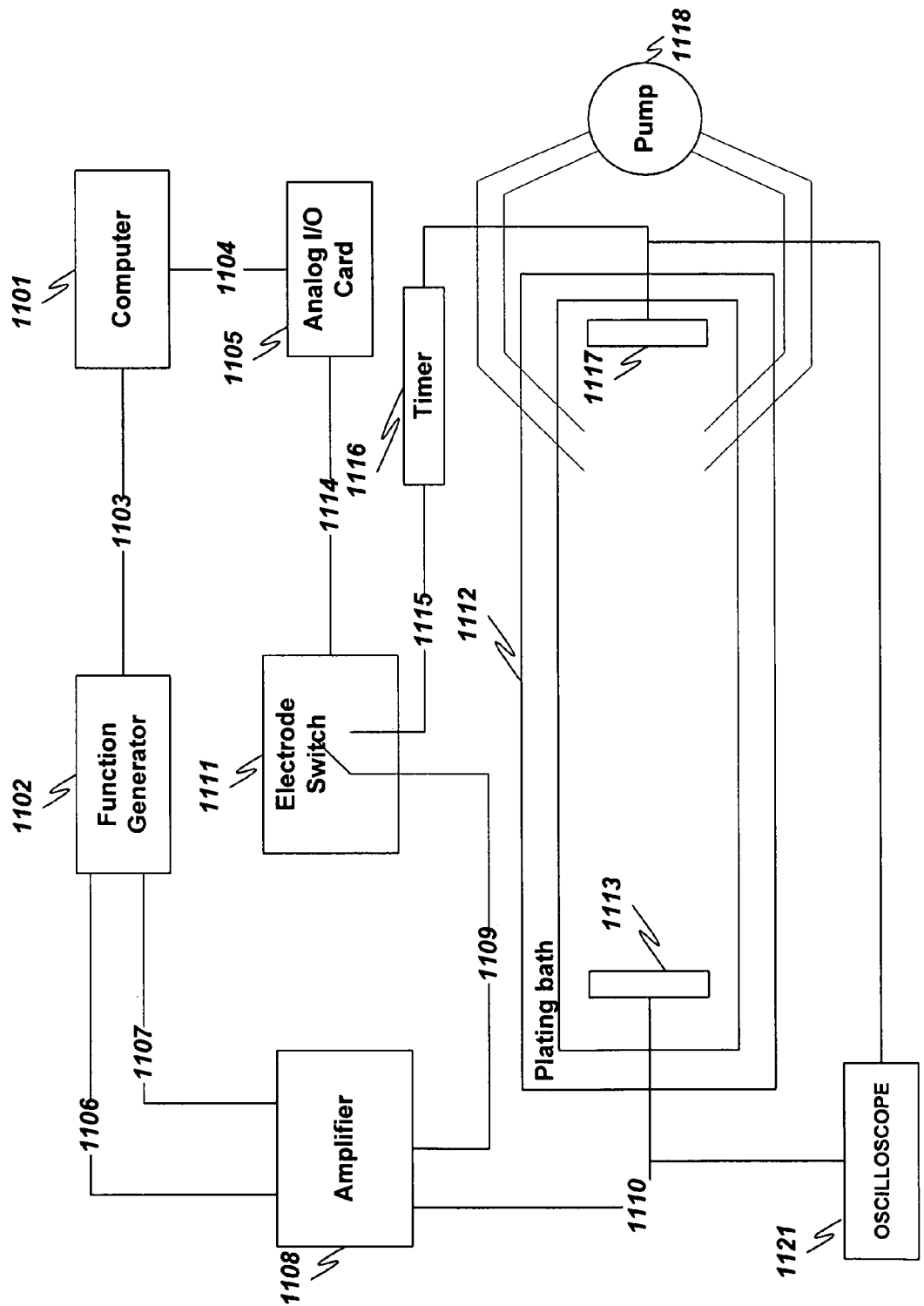

The invention is better understood by reading the following detailed description with reference to the accompanying drawings in which:

FIG. 29 is a schematic of a typical apparatus.

Figure 30A:
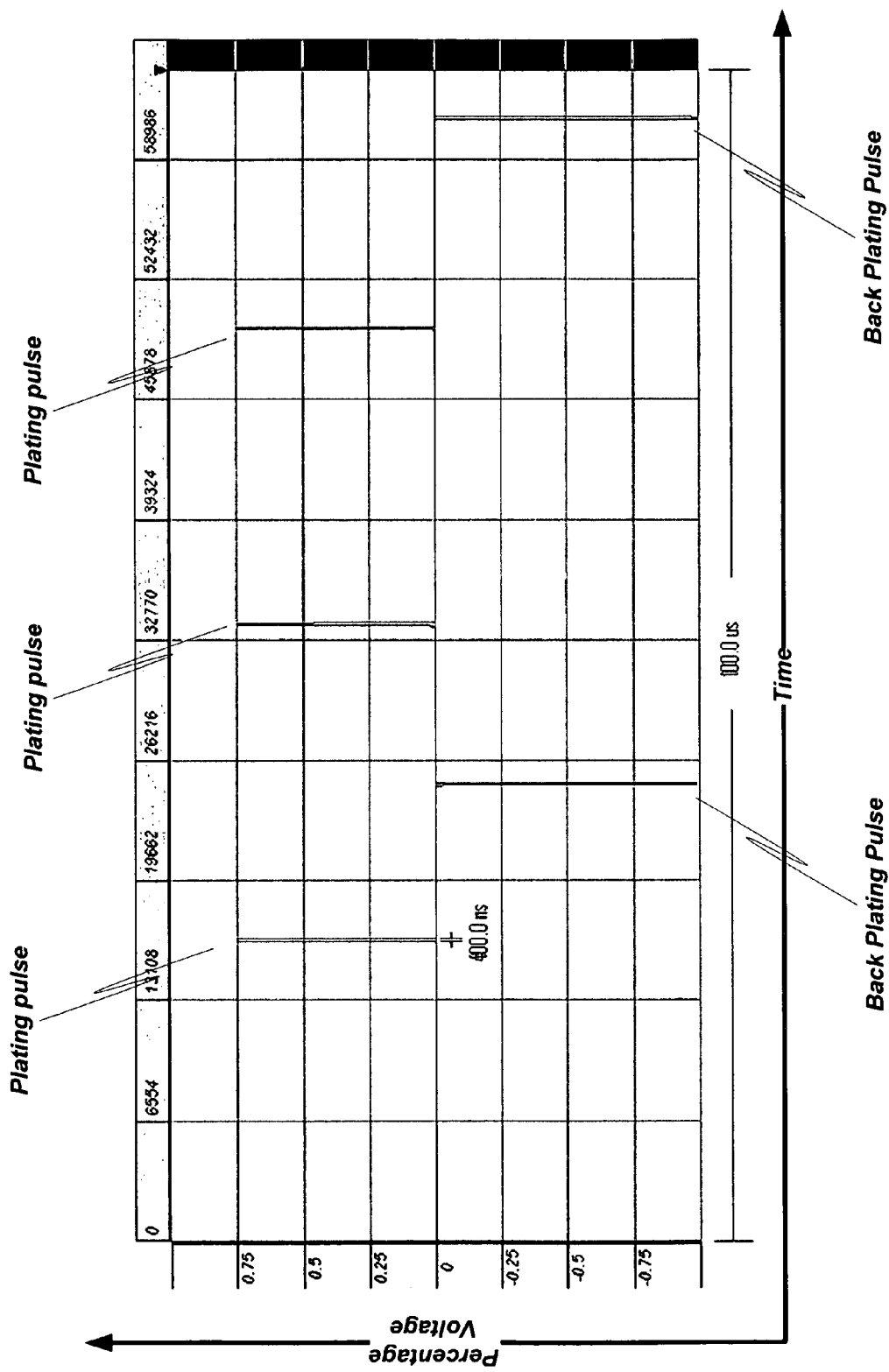
Figure 30B:
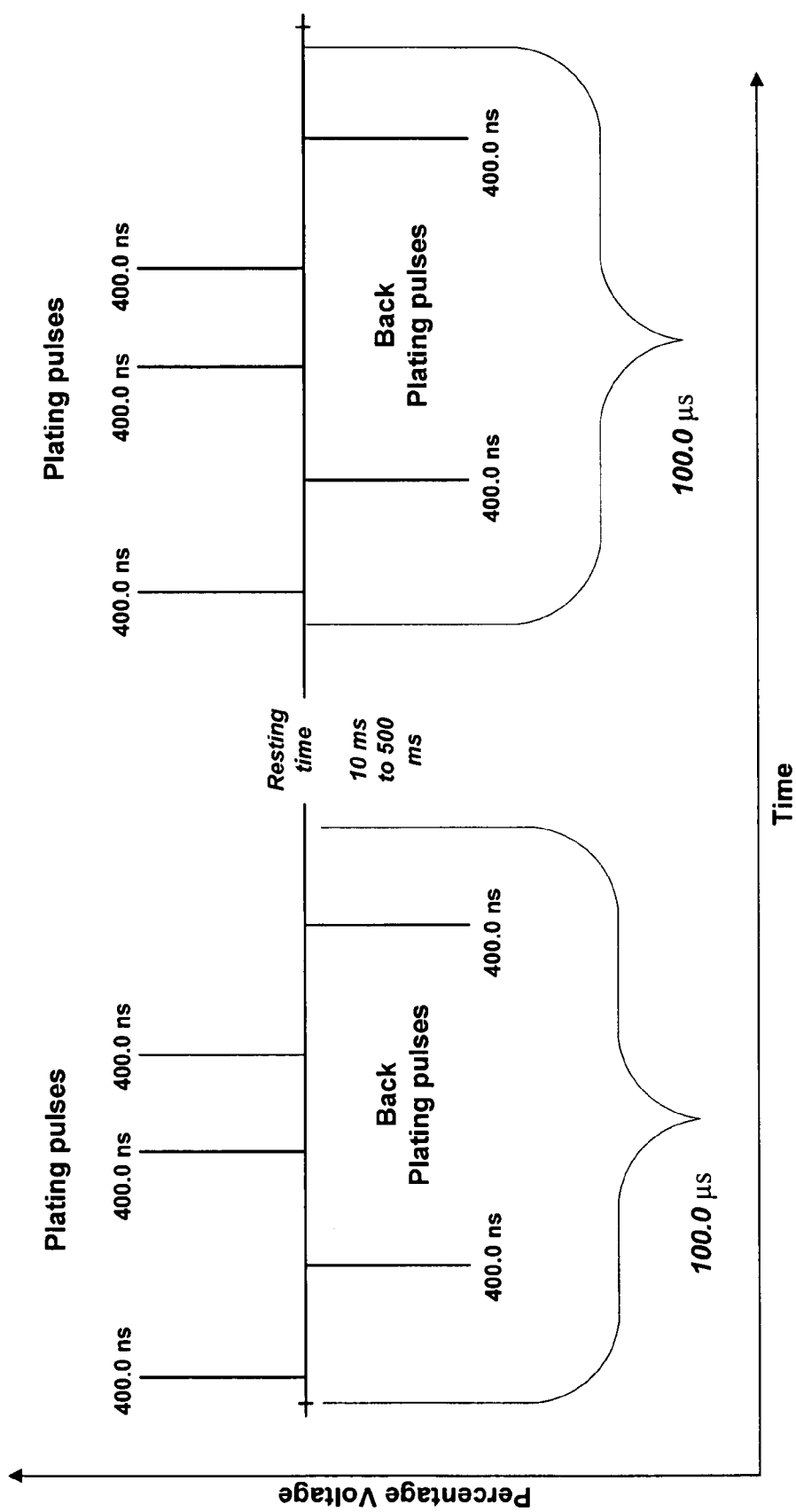

FIGS. 30(a)-30(b) are plots of typical voltage waveform according to embodiments of the present invention.

Figure 31:
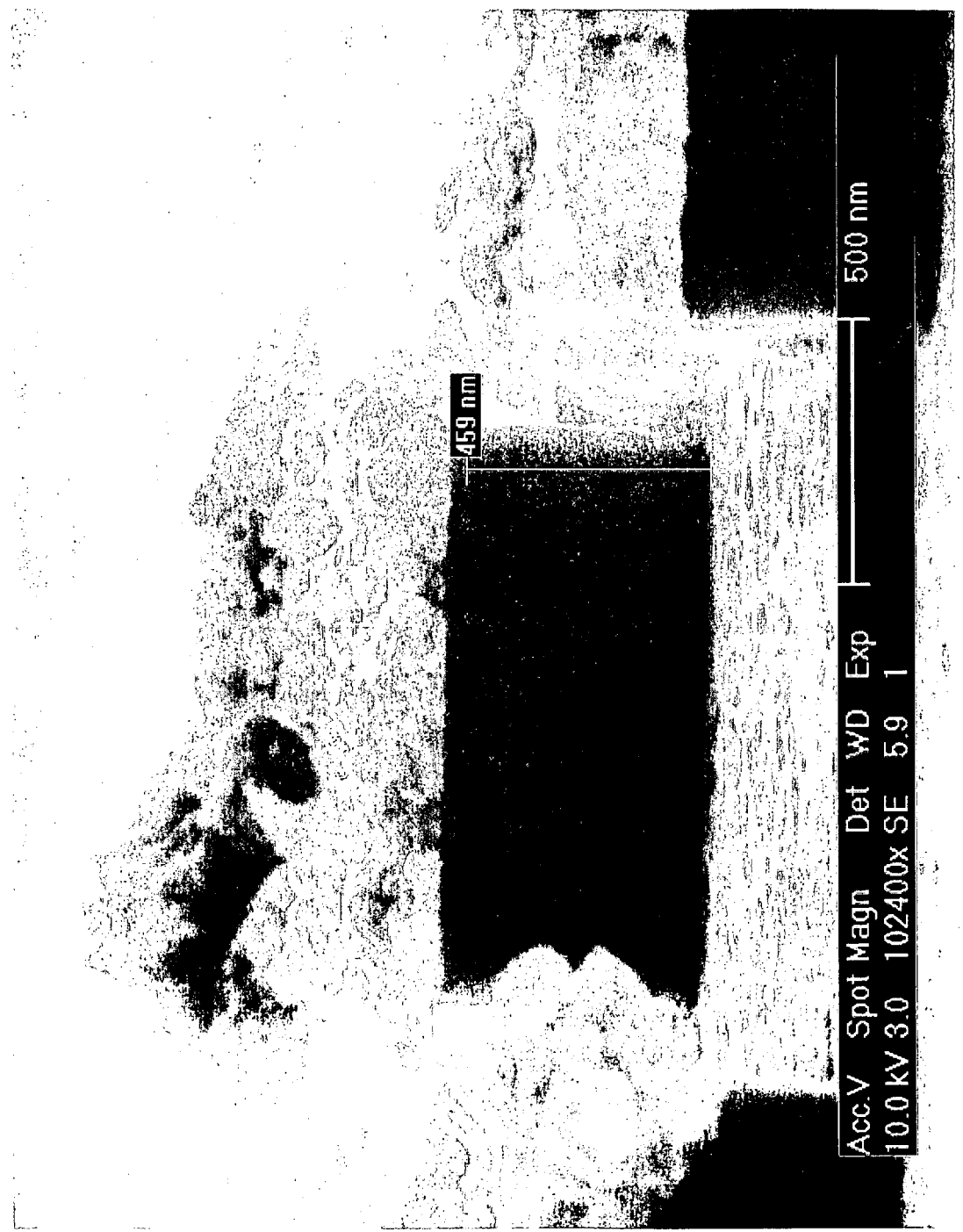

FIG. 31 is an electron microscope photograph illustrating sample representative dense ultra-small structures.

Figure 32:
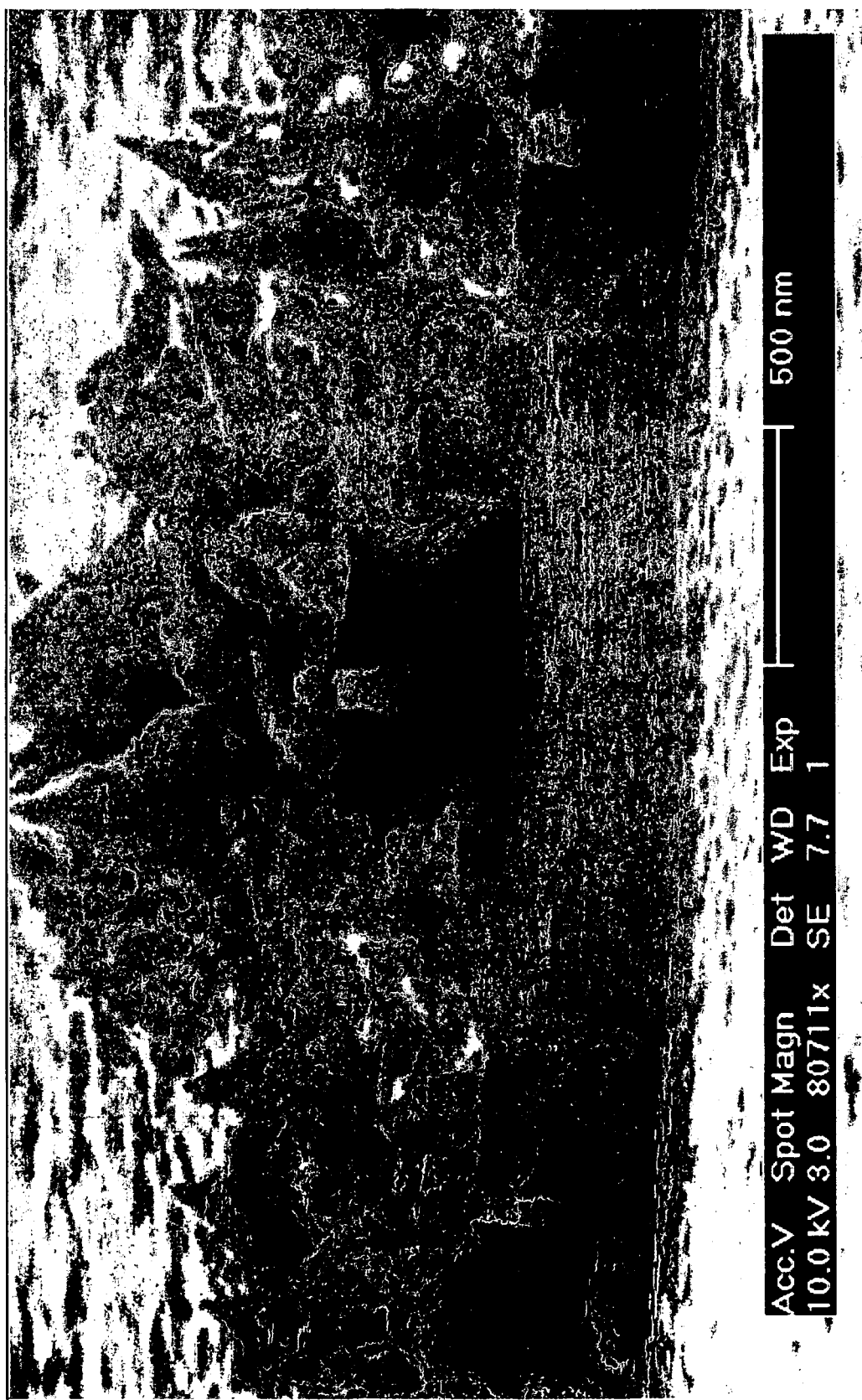

FIG. 32 is an electron microscope photograph illustrating a sample representative structure with a varying morphology.

Figure 33:
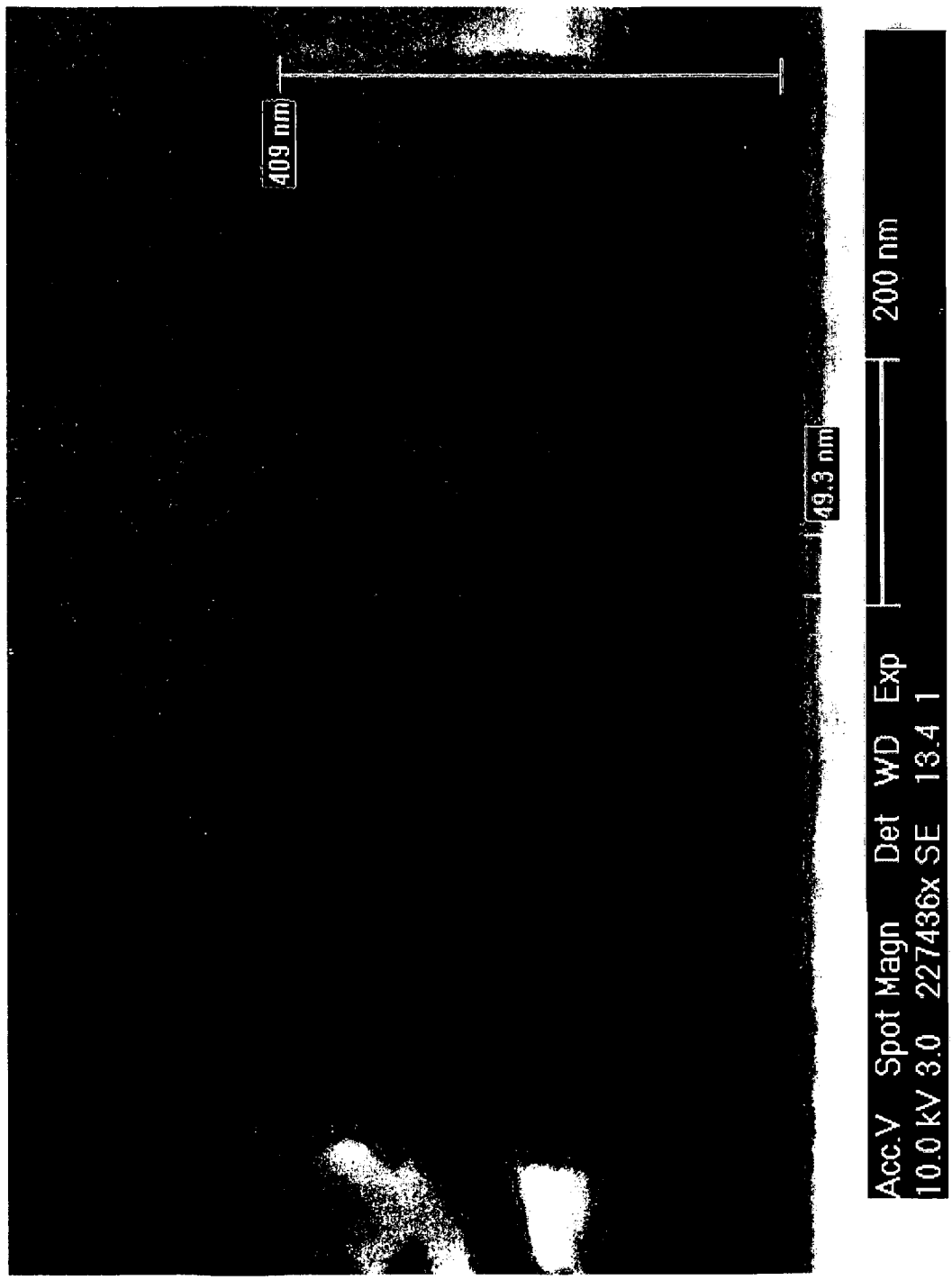
Figure 34B:
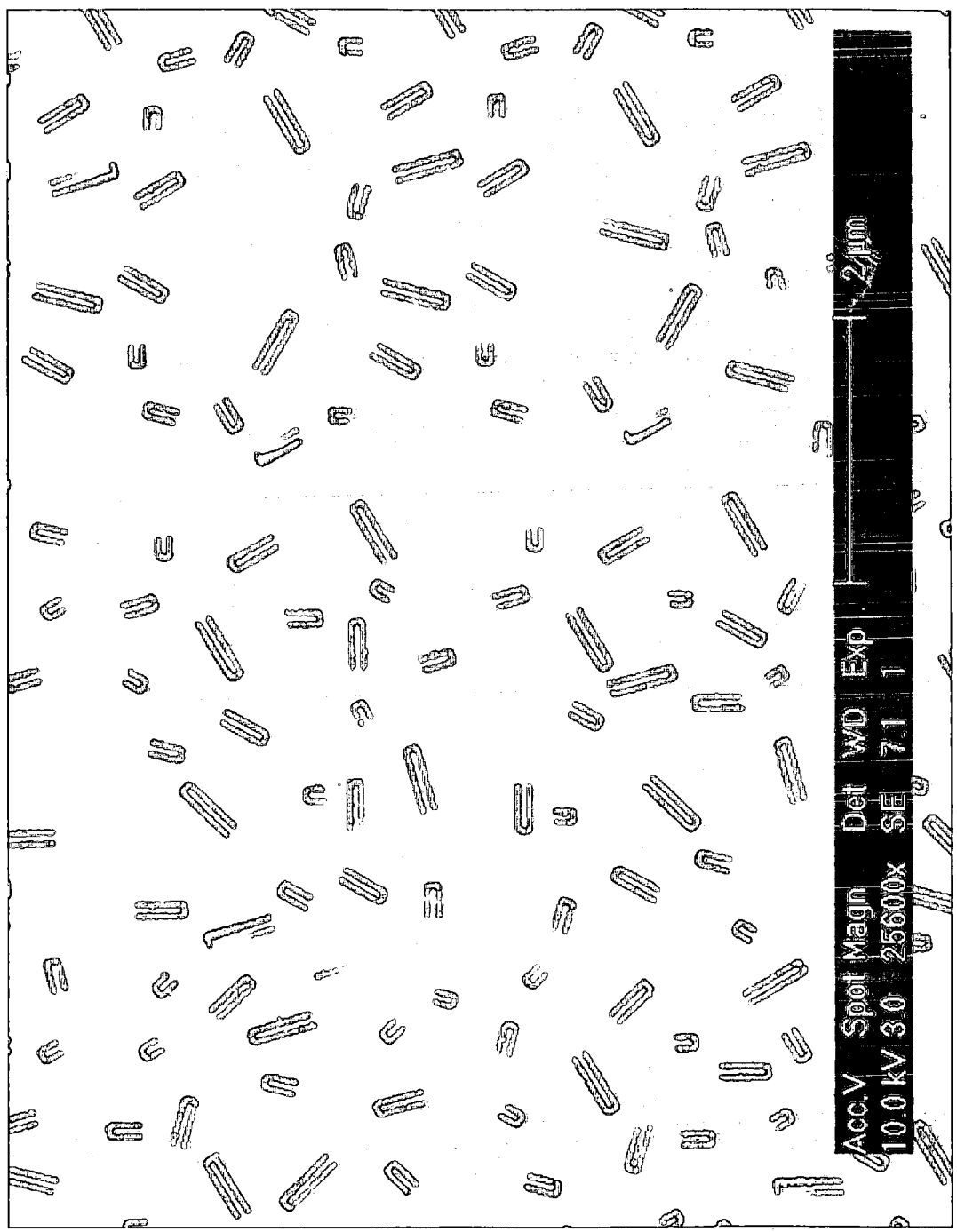
Figure 34C:
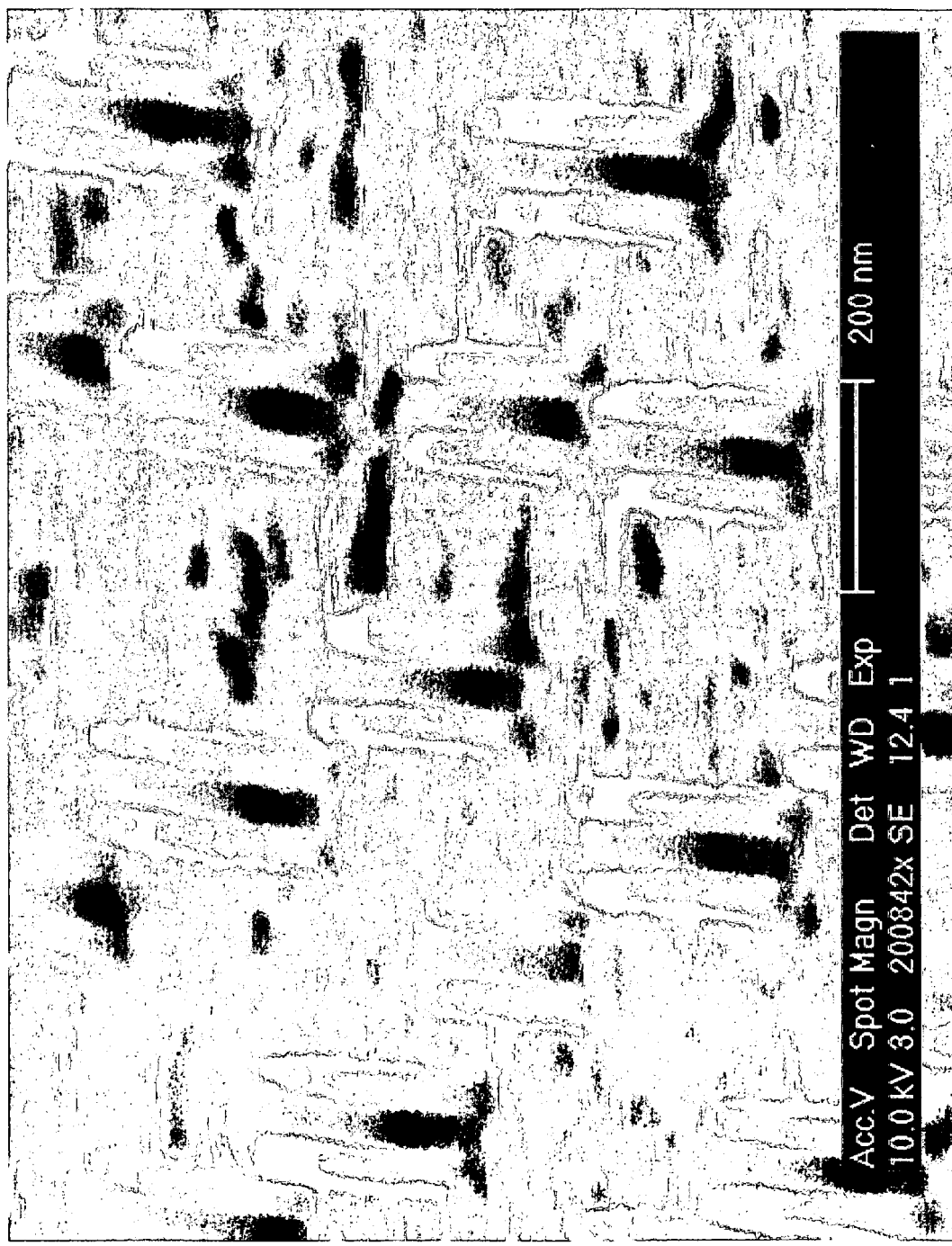
Figure 34D:
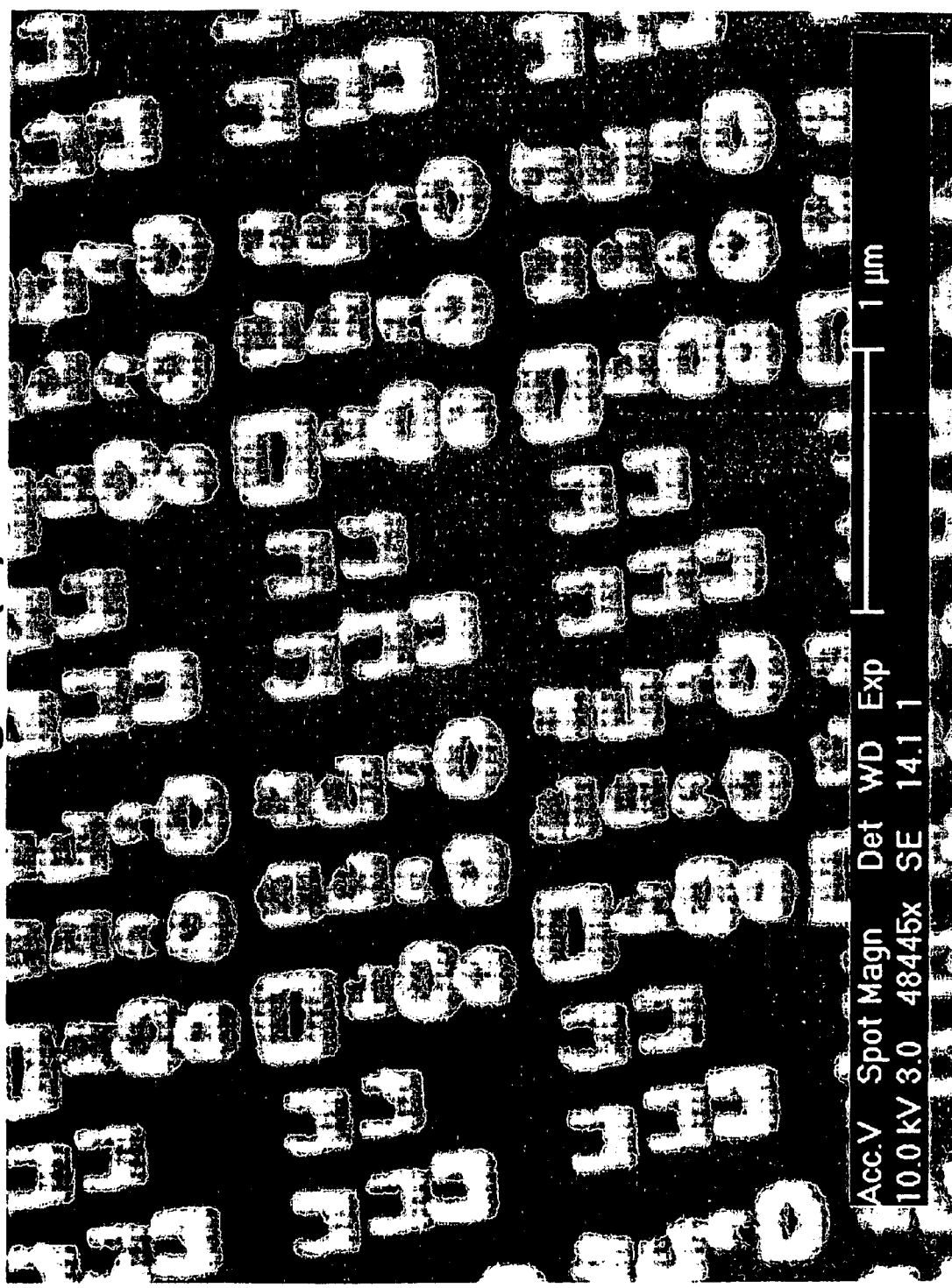
Figure 34E:
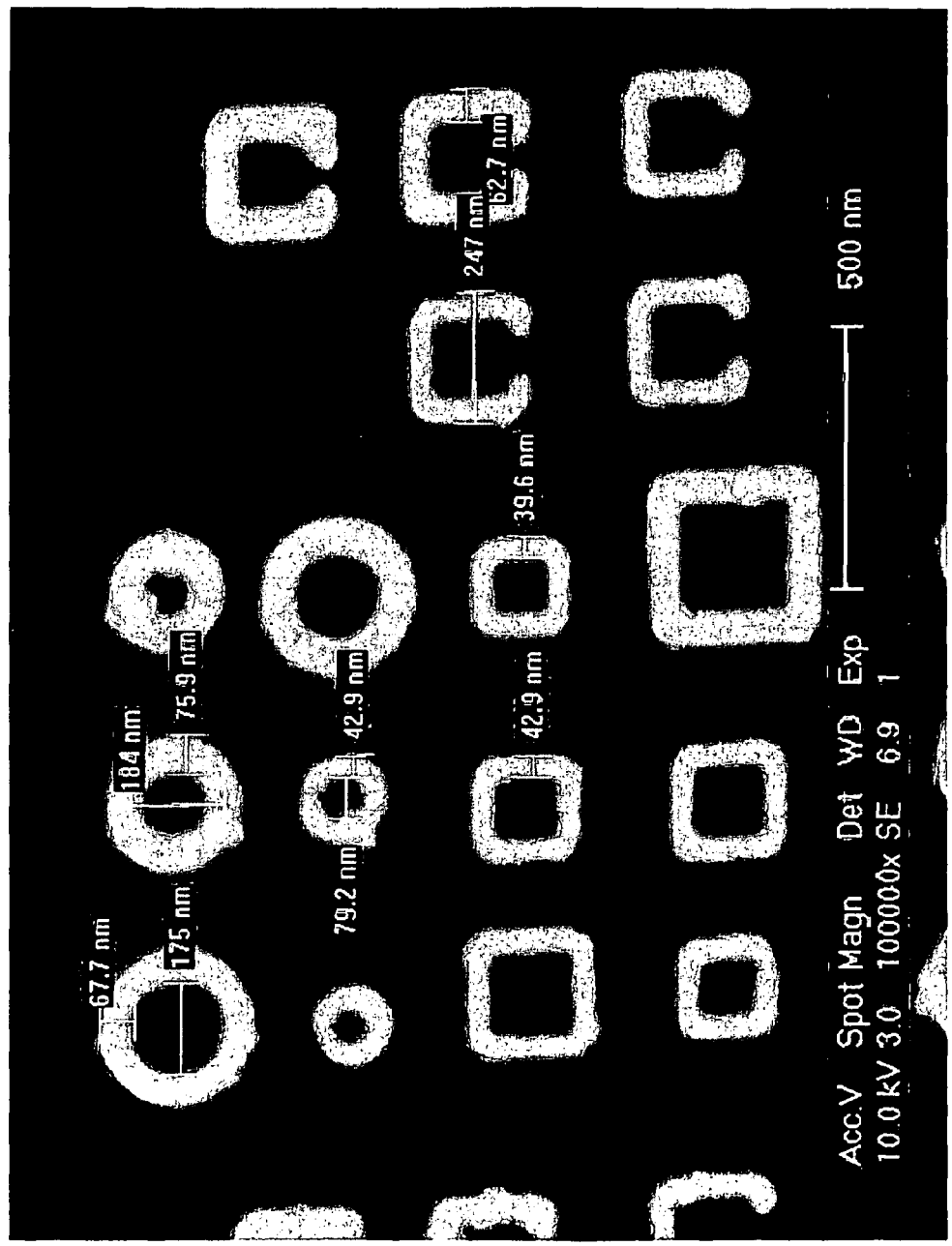
Figure 34F:
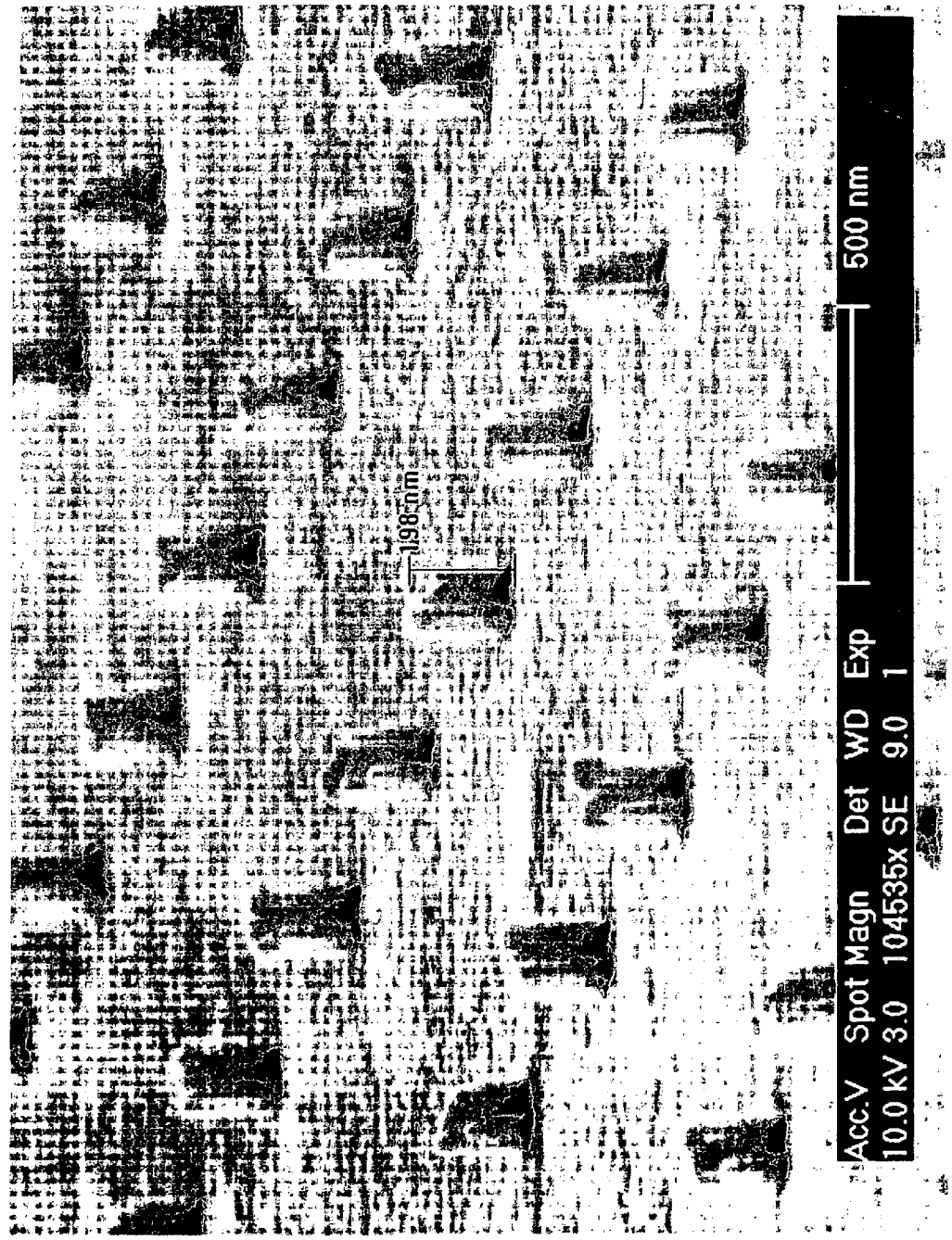

FIG. 33 is an electron microscope photograph illustrating a sample representative porous ultra-small structures.

FIGS. 34(a)-34(f) are electron microscope photographs illustrating various exemplary structures produced according to embodiments of the present invention.

FIGS. 35(a)-35(b) depict exemplary shapes and patterns made according to embodiments of the present invention.

B.iii. Detailed Description from the '407 Application

FIG. 29 is a schematic drawing of a configuration of an example coating apparatus according to embodiments of the present invention. A computer such as personal computer 1101 is connected to a function generator 1102, e.g., by a standard cable such as USB cable 1103. Personal computer 1101 is also connected to analog input-output card 1105, e.g., by standard USB cable 1104.

Waveform functions on the personal computer 1101 are drawn using a standard program included with function generator 1102. After the personal computer 1101 downloads the waveforms to function generator 1102, the function generator sets characteristics such as amplitude, period, and offset of its output electrical signal. The output of function generator 1102 is sent to the current amplifier 1108 along cables 1106 and 1107. The cables 1106 and 1107 may be, e.g., standard USB cables.

In cases where the output current of the function generator is insufficient to carry out the plating, an amplifier 1108 can be introduced between the function generation and the plating bath 1112. Amplifier 1108 increases the output current of the function generator 1102, making it sufficient to carry out the plating without experiencing a voltage drop. Current amplifier 1108 maintains an appropriately constant voltage in plating bath 1112 as deposition occurs. Any DC voltage offset introduced by an imperfect amplifier can be corrected by programming an opposite DC offset from the function generator.

Time between pulses is controlled via a program that triggers the function generator output. This program is also used to start and stop the plating.

The output signal from the current amplifier 1108 is provided to electrode switch 1111 on cable 1109. Analog input-output (I/O) card 1105 sends a signal to electrode switch 1111 via cable/line 1114. Analog input-output card 1105 is controlled by an output signal from the computer 1101.

Electrode switch 1111 generates an output signal that is sent to timer 1116 (via cable 1115). The signal output from timer 1116 is connected to anode 1117 in the plating bath 1112. In currently preferred embodiments, the anode is a silver (Ag) metal plate, but there is no requirement that the anode consist of silver, and other materials, including (without limitation) copper (Cu), aluminum (Al), gold (Au) and platinum (Pt) may be used and are contemplated by the invention.

A second output signal is sent from current amplifier 1108 via cable 1110 (which may be, e.g., a USB cable) to sample 1113 (which comprises the surface/substrate to be coated/plated by the metal on the anode 1117). Sample 1113 is the cathode. In presently preferred embodiments, substrates are rectangular and are about 1 cm by 2 cm. There is no requirement that the substrate be any minimum or maximum size.

An agitation mechanism such as agitation pump 1118 is attached to plating bath 1112. Agitation of the liquid in the bath 1112 speeds up the deposition rate. The pump 118 agitates the solution, thereby moving the solution around the plating bath 1112. The plating bath 1112 is preferably large enough to permit even flow of the solution over the substrate.

The effect of agitation depends on the size and shape of the device being plated. In some cases, agitation reduces the plating time to thirty seconds on some of the smaller devices and down to ninety seconds on larger ones. Agitation also facilitates uniform thicknesses on all the devices across the substrate leading to higher yields. There are other known ways of agitation, including using an air pump to aerate the solution. For some applications, agitation may not be preferred at all.

An appropriate plating solution is placed into plating bath 1112. In presently preferred embodiments, a silver plating solution is used. In the currently preferred embodiment the solution is Caswell's Silver Brush & Tank Plating Solution.

To ensure that the plating bath 1112 is getting the desired period and amplitude, an oscilloscope 1121 can be connected directly to the plating bath.

In one presently preferred embodiment, sample 1113 is prepared by evaporating a 0.3 nanometer thick layer of nickel (Ni) onto the surface of a silicon (Si) wafer to form a conductive layer. The artisan will recognize that the substrate need not be silicon. The substrate in this example is substantially flat and may be either conductive or non-conductive with a conductive layer applied by other means. A 10 to 300 nanometer layer of silver (Ag) is deposited using electron beam evaporation on top of the nickel layer. Alternative methods of production can also be used to deposit the silver coating. The presence of the nickel layer improves the adherence of silver to the silicon. In an alternate embodiment, a thin carbon (C) layer may be evaporated onto the surface instead of the nickel layers. Alternatively, the conductive layer may comprise indium tin oxide (ITO) or comprise a conductive polymer.

The now-conductive substrate is coated with a layer of photoresist. In current embodiments, a layer of polymethylmethacrylate (PMMA) is deposited over top of the conductive coating. The PMMA may be diluted to produce a continuous layer of 200 nanometers. The photoresist layer is exposed with a scanning electron microscope (SEM) and developed to produce a pattern of the desired device structure. The patterned substrate is positioned in an electroplating bath 1112. A range of alternate examples of photoresists, both negative and positive in type, exist that can be used to coat the conductive surface and then patterned to create the desired structure.

In the plating process, the voltage applied on the sample 1113 is pulsed. FIGS. 30(a)-30(b) show a plot of a typical voltage waveform. In FIGS. 30(a)-30(b), the percentage of the total voltage applied on the sample is plotted versus time. In this waveform, a positive voltage pulse of between five and six volts is applied on the sample, and after some rest time, the voltage is reversed to a negative voltage. Plating occurs as the voltage applied on the substrate is negative-referenced to the counter electrode. Accordingly, the y-axis in FIGS. 30(a) and 30(b) corresponds to percentages of negative voltages. It has been noticed that if the pulsed length, is increased the plating pushes on the photoresist, creating slightly larger features.

During the intervals when the voltage is positive, material is removed from the structures. The optimum values of parameters such as peak voltage, pulse widths, and rest times will vary depending upon the size, shape and density of the devices on the substrate that are being plated, temperature and composition of the bath, and other specifications of the particular system to which this technique is applied.

FIG. 31 shows an image of a typical ultra-small feature fabricated using the example waveforms shown in FIGS. 30(a)-30(b). In the fabrication of these structures, the time between pulses was ten microseconds. The time between pulses can be varied to achieve a variety of structure morphologies.

After the devices are plated onto the surface, the conductive surface may be removed between the devices. Many methods of surface removal exist that can be applied in these circumstances. In one currently preferred exemplary surface removal method, if the ultra-small structures are comprised of silver, a thin layer of nickel is plated over the silver structures to mask them during a reactive ion etching process. A thin hard mask of other materials might also be used, including but not limited to a thin layer of silicon dioxide (SiO2) of silicon nitride (SiNx).

The reactive ion etching method is described in commonly-owned U.S. patent application Ser. No. 10/917,511 (Davidson, et al, filed Aug. 13, 2004), the entire contents of which are incorporated herein by reference. If the conductive layer consists of carbon, then the layer may be removed easily with oxygen. If the conductive surface is removed, the devices are insulated from each other. Material deposited over remaining photoresist is removed along with the photoresist using standard processing methods.

The desired characteristics of the ultra-small structures depend upon the application for which the structures are intended. Altering the nature of the voltage waveform can vary the characteristics of the ultra-small structures fabricated using this pulse-electroplating process.

For example, in the case of heat sinks, a very dense silver film contacting the substrate is required to draw the heat out of the chip. Then it might be better to have a less dense, larger surface area to conduct heat to the air or liquid cooling media. FIG. 32 shows an image of sample representative ultra-small structures with this desired morphology. In this alternative example, a negative voltage of two (2) volts was applied, with a time between pulses of fifty milliseconds. A wide range of morphologies can be achieved by altering parameters such as peak voltage, pulse widths, and rest times.

In some embodiments, a series of plating pulses including at least one positive voltage pulse and at least one negative voltage pulse, are applied. Preferably each voltage pulse is for an ultra-short period. As used herein, an "ultra-short period" is a period of less than one microsecond, preferably less than 500 ns, and more preferably less than or equal to 400 ns. Preferably there is a rest period between each of the pulses in the pulse series. In presently preferred embodiments of the invention, the series of plating pulses is repeated at least once, after an inter-series rest time. Preferably the inter-series rest time is 1 microsecond or greater. In some embodiments of the present invention, the inter-series rest time is between 1 microsecond and 500 ms. As used herein, the term "ultra-short voltage pulse" refers to a voltage pulse that lasts for an ultra-short period—i.e., a voltage pulse (positive or negative) that lasts less than one microsecond, preferably less than 500 ns, and more preferably less than or equal to 400 ns.

In some presently preferred implementations, the temperature used is 25° C. to 29° C., with 28° C. being preferable. In these preferred implementations, the distance from the cathode 1113 to the anode 1117 is 8 mm and a typical substrate size is about 1 cm×5 mm, ±2 mm.

Implementations of the current technique have been used to plate features 30 nm by 60 nm, up to 80 nm by 700 nm, with heights in the range 150 nm to 350 nm. Those skilled in the art will realize that as the shapes (areas) become smaller, plating time decreases. Pulses in these preferred implementations ranged from 1.5 microseconds to 400 nanoseconds, with the thinner pulses being used for the smallest features. In one implementation of the present invention, for larger structures, 500 nm by 1 micron and 350 nm high, longer pulses, on the order of 1.5 micron, were used.

Ultra-small porous structures may be fabricated as well. Such structures can be used, for example, as filters, sensors or gas separation media. FIG. 33 shows an image of sample representative of ultra-small structures having a porous structure. In this alternative example, a positive voltage pulse of between four and five volts is applied, and after some rest time, the voltage is reversed to a negative voltage.

FIGS. 34(a)-34(f) are electron microscope photographs illustrating various exemplary structures produced according to embodiments of the present invention.

FIGS. 35(a)-35(b) depict exemplary shapes and patterns made according to embodiments of the present invention. These shapes range from circular cavities to square cavities, as well as single and multiple cavities. Note that these drawings are not necessarily to scale.

C. U.S. application Ser. No. 11/243,477 ("the '477 Application"), Entitled "Electron Beam Induced Resonance"

This disclosure relates to resonance induced in ultra-small metal-layer structures by a charged particle beam.

C.i. Introduction to the '477 Application c.i.1. Electromagnetic Radiation & Waves

Electromagnetic radiation is produced by the motion of electrically charged particles. Oscillating electrons produce electromagnetic radiation commensurate in frequency with the frequency of the oscillations. Electromagnetic radiation is essentially energy transmitted through space or through a material medium in the form of electromagnetic waves. The term can also refer to the emission and propagation of such energy. Whenever an electric charge oscillates or is accelerated, a disturbance characterized by the existence of electric and magnetic fields propagates outward from it. This disturbance is called an electromagnetic wave. Electromagnetic radiation falls into categories of wave types depending upon their frequency, and the frequency range of such waves is tremendous, as is shown by the electromagnetic spectrum in the following chart (which categorizes waves into types depending upon their frequency):

| Type | Approx. Frequency |
| --- | --- |
| Radio | Less than 3 Gigahertz |
| Microwave | 3 Gigahertz-300 Gigahertz |
| Infrared | 300 Gigahertz-400 Terahertz |
| Visible | 400 Terahertz-750 Terahertz |
| UV | 750 Terahertz-30 Petahertz |
| X-ray | 30 Petahertz-30 Exahertz |
| Gamma-ray | Greater than 30 Exahertz |

The ability to generate (or detect) electromagnetic radiation of a particular type (e.g., radio, microwave, etc.) depends upon the ability to create a structure suitable for electron oscillation or excitation at the frequency desired. Electromagnetic radiation at radio frequencies, for example, is relatively easy to generate using relatively large or even somewhat small structures.

c.i.2. Electromagnetic Wave Generation

There are many traditional ways to produce high-frequency radiation in ranges at and above the visible spectrum, for example, up to high hundreds of Terahertz. There are also many traditional and anticipated applications that use such high frequency radiation. As frequencies increase, however, the kinds of structures needed to create the electromagnetic radiation at a desired frequency become generally smaller and harder to manufacture. We have discovered ultra-small-scale devices that obtain multiple different frequencies of radiation from the same operative layer.

Resonant structures have been the basis for much of the presently known high frequency electronics. Devices like klystrons and magnetrons had electronics that moved frequencies of emission up to the megahertz range by the 1930s and 1940s. By around 1960, people were trying to reduce the size of resonant structures to get even higher frequencies, but had limited success because the Q of the devices went down due to the resistivity of the walls of the resonant structures. At about the same time, Smith and Purcell saw the first signs that free electrons could cause the emission of electromagnetic radiation in the visible range by running an electron beam past a diffraction grating. Since then, there has been much speculation as to what the physical basis for the Smith-Purcell radiation really is.

We have shown that some of the theory of resonant structures applies to certain nano structures that we have built. It is assumed that at high enough frequencies, plasmons conduct the energy as opposed to the bulk transport of electrons in the material, although our inventions are not dependent upon such an explanation. Under that theory, the electrical resistance decreases to the point where resonance can effectively occur again, and makes the devices efficient enough to be commercially viable.

Some of the more detailed background sections that follow provide background for the earlier technologies (some of which are introduced above), and provide a framework for understanding why the present inventions are so remarkable compared to the present state-of-the-art.

c.i.3. Microwaves

As previously introduced, microwaves were first generated in so-called "klystrons" in the 1930s by the Varian brothers. Klystrons are now well-known structures for oscillating electrons and creating electromagnetic radiation in the microwave frequency. The structure and operation of klystrons has been well-studied and documented and will be readily understood by the artisan. However, for the purpose of background, the operation of the klystron will be described at a high level, leaving the particularities of such devices to the artisan's present understanding.

Klystrons are a type of linear beam microwave tube. A basic structure of a klystron is shown by way of example in FIG. 1(a). In the late 1930s, a klystron structure was described that involved a direct current stream of electrons within a vacuum cavity passing through an oscillating electric field. In the example of FIG. 1(a), a klystron 100 is shown as a high-vacuum device with a cathode 102 that emits a well-focused electron beam 104 past a number of cavities 106 that the beam traverses as it travels down a linear tube 108 to anode 103. The cavities are sized and designed to resonate at or near the operating frequency of the tube. The principle, in essence, involves conversion of the kinetic energy in the beam, imparted by a high accelerating voltage, to microwave energy. That conversion takes place as a result of the amplified RF (radio frequency) input signal causing the electrons in the beam to "bunch up" into so-called "bunches" (denoted 110) along the beam path as they pass the various cavities 106. These bunches then give up their energy to the high-level induced RF fields at the output cavity.

The electron bunches are formed when an oscillating electric field causes the electron stream to be velocity modulated so that some number of electrons increase in speed within the stream and some number of electrons decrease in speed within the stream. As the electrons travel through the drift tube of the vacuum cavity the bunches that are formed create a space-charge wave or charge-modulated electron beam. As the electron bunches pass the mouth of the output cavity, the bunches induce a large current, much larger than the input current. The induced current can then generate electromagnetic radiation.

c.i.4. Traveling Wave Tubes

Traveling wave tubes (TWT)—first described in 1942—are another well-known type of linear microwave tube. A TWT includes a source of electrons that travels the length of a microwave electronic tube, an attenuator, a helix delay line, radio frequency (RF) input and output, and an electron collector. In the TWT, an electrical current was sent along the helical delay line to interact with the electron stream.

c.i.5. Backwards Wave Devices

Backwards wave devices are also known and differ from TWTs in that they use a wave in which the power flow is opposite in direction from that of the electron beam. A backwards wave device uses the concept of a backward group velocity with a forward phase velocity. In this case, the RF power comes out at the cathode end of the device. Backward wave devices could be amplifiers or oscillators.

c.i.6. Magnetrons

Figure 1B:
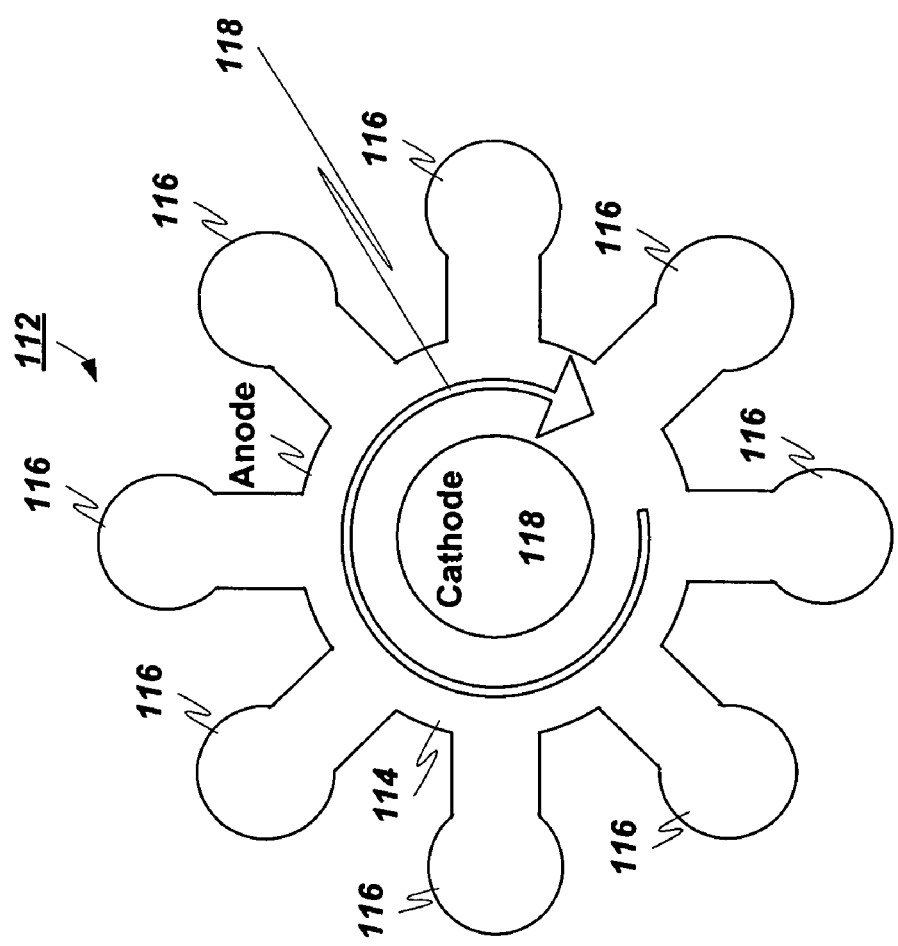

Magnetrons are another type of well-known resonance cavity structure developed in the 1920s to produce microwave radiation. While their external configurations can differ, each magnetron includes an anode, a cathode, a particular wave tube and a strong magnet. FIG. 1(b) shows an exemplary magnetron 112. In the example magnetron 112 of FIG. 1(b), the anode is shown as the (typically iron) external structure of the circular wave tube 114 and is interrupted by a number of cavities 116 interspersed around the tube 114. The cathode 118 is in the center of the magnetron, as shown. Absent a magnetic field, the cathode would send electrons directly outward toward the anode portions forming the tube 114. With a magnetic field present and in parallel to the cathode, electrons emitted from the cathode take a circular path 118 around the tube as they emerge from the cathode and move toward the anode. The magnetic field from the magnet (not shown) is thus used to cause the electrons of the electron beam to spiral around the cathode, passing the various cavities 116 as they travel around the tube. As with the linear klystron, if the cavities are tuned correctly, they cause the electrons to bunch as they pass by. The bunching and unbunching electrons set up a resonant oscillation within the tube and transfer their oscillating energy to an output cavity at a microwave frequency.

c.i.7. Reflex Klystron

Figure 1C:
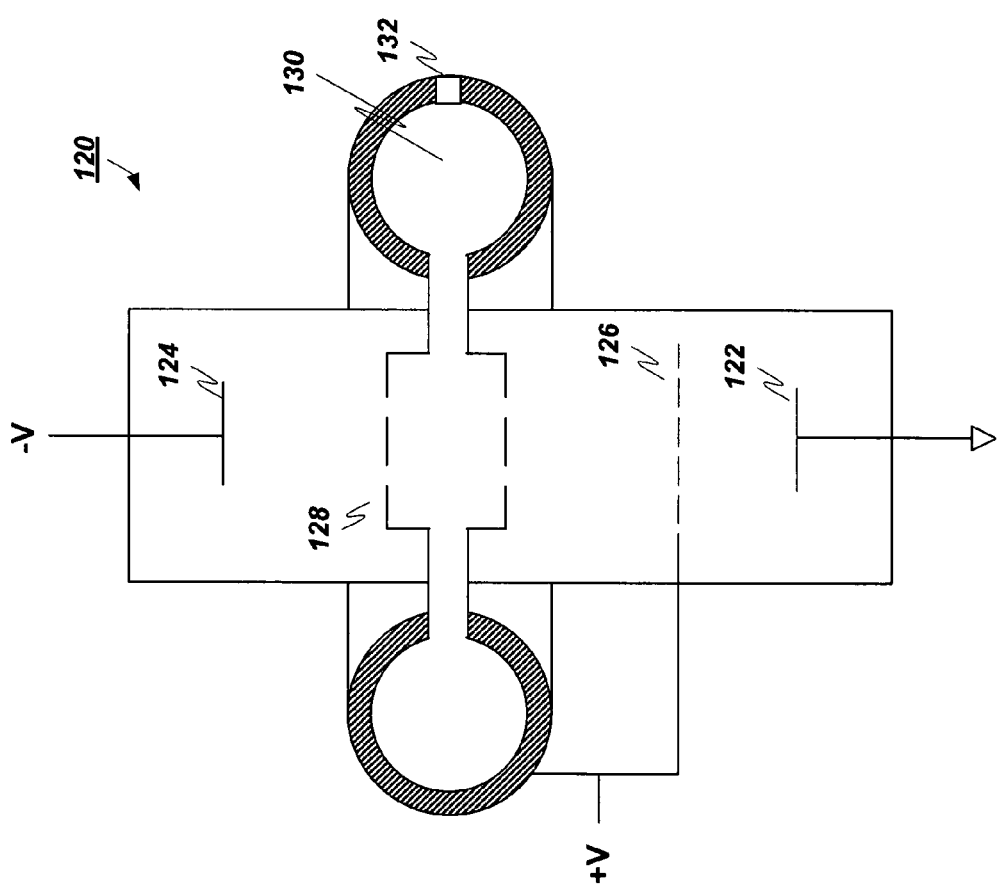

Multiple cavities are not necessarily required to produce microwave radiation. In the reflex klystron, a single cavity, through which the electron beam is passed, can produce the required microwave frequency oscillations. An example reflex klystron 120 is shown in FIG. 1(c). There, the cathode 122 emits electrons toward the reflector plate 124 via an accelerator grid 126 and grids 128. The reflex klystron 120 has a single cavity 130. In this device, the electron beam is modulated (as in other klystrons) by passing by the cavity 130 on its way away from the cathode 122 to the plate 124. Unlike other klystrons, however, the electron beam is not terminated at an output cavity, but instead is reflected by the reflector plate 124. The reflection provides the feedback necessary to maintain electron oscillations within the tube.

In each of the resonant cavity devices described above, the characteristic frequency of electron oscillation depends upon the size, structure, and tuning of the resonant cavities. To date, structures have been discovered that create relatively low frequency radiation (radio and microwave levels), up to, for example, GHz levels, using these resonant structures. Higher levels of radiation are generally thought to be prohibitive because resistance in the cavity walls will dominate with smaller sizes and will not allow oscillation. Also, using current techniques, aluminum and other metals cannot be machined down to sufficiently small sizes to form the cavities desired. Thus, for example, visible light radiation in the range of 400 Terahertz-750 Terahertz is not known to be created by klystron-type structures.

U.S. Pat. No. 6,373,194 to Small illustrates the difficulty in obtaining small, high-frequency radiation sources. Small suggests a method of fabricating a micro-magnetron. In a magnetron, the bunched electron beam passes the opening of the resonance cavity. But to realize an amplified signal, the bunches of electrons must pass the opening of the resonance cavity in less time than the desired output frequency. Thus at a frequency of around 500 THz, the electrons must travel at very high speed and still remain confined. There is no practical magnetic field strong enough to keep the electron spinning in that small of a diameter at those speeds. Small recognizes this issue but does not disclose a solution to it.

Surface plasmons can be excited at a metal dielectric interface by a monochromatic light beam. The energy of the light is bound to the surface and propagates as an electromagnetic wave. Surface plasmons can propagate on the surface of a metal as well as on the interface between a metal and dielectric material. Bulk plasmons can propagate beneath the surface, although they are typically not energetically favored.

Free electron lasers offer intense beams of any wavelength because the electrons are free of any atomic structure. In U.S. Pat. No. 4,740,973, Madey et al. disclose a free electron laser. The free electron laser includes a charged particle accelerator, a cavity with a straight section and an undulator. The accelerator injects a relativistic electron or positron beam into said straight section past an undulator mounted coaxially along said straight section. The undulator periodically modulates in space the acceleration of the electrons passing through it inducing the electrons to produce a light beam that is practically collinear with the axis of undulator. An optical cavity is defined by two mirrors mounted facing each other on either side of the undulator to permit the circulation of light thus emitted. Laser amplification occurs when the period of said circulation of light coincides with the period of passage of the electron packets and the optical gain per passage exceeds the light losses that occur in the optical cavity.

c.i.8. Smith-Purcell

Figure 1D:
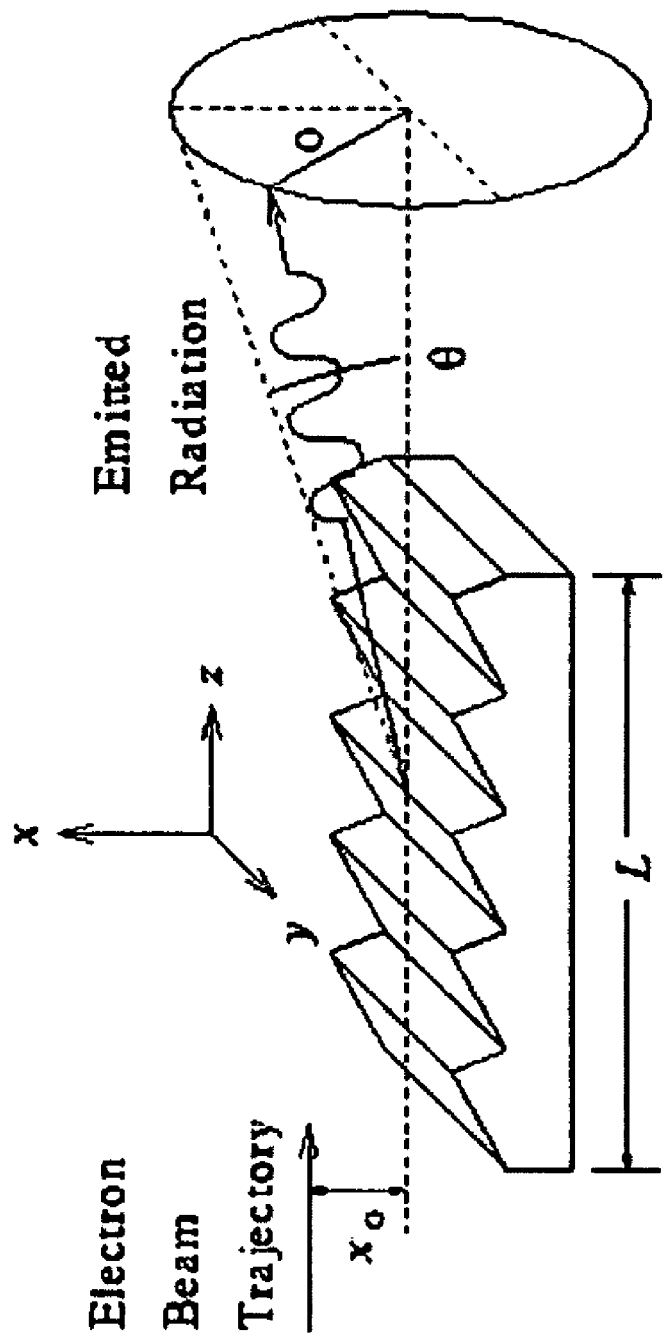

Smith-Purcell radiation occurs when a charged particle passes close to a periodically varying metallic surface, as depicted in FIG. 1(d).

Known Smith-Purcell devices produce visible light by passing an electron beam close to the surface of a diffraction grating. Using the Smith-Purcell diffraction grating, electrons are deflected by image charges in the grating at a frequency in the visible spectrum. In some cases, the effect may be a single electron event, but some devices can exhibit a change in slope of the output intensity versus current. In Smith-Purcell devices, only the energy of the electron beam and the period of the grating affect the frequency of the visible light emission. The beam current is generally, but not always, small. Vermont Photonics notice an increase in output with their devices above a certain current density limit. Because of the nature of diffraction physics, the period of the grating must exceed the wavelength of light.

Koops, et al., U.S. Pat. No. 6,909,104, published Nov. 30, 2000, (§ 102(e) date May 24, 2002) describe a miniaturized coherent terahertz free electron laser using a periodic grating for the undulator (sometimes referred to as the wiggler). Koops et al. describe a free electron laser using a periodic structure grating for the undulator (also referred to as the wiggler). Koops proposes using standard electronics to bunch the electrons before they enter the undulator. The apparent object of this is to create coherent terahertz radiation. In one instance, Koops, et al. describe a given standard electron beam source that produces up to approximately 20,000 volts accelerating voltage and an electron beam of 20 microns diameter over a grating of 100 to 300 microns period to achieve infrared radiation between 100 and 1000 microns in wavelength. For terahertz radiation, the diffraction grating has a length of approximately 1 mm to 1 cm, with grating periods of 0.5 to 10 microns, "depending on the wavelength of the terahertz radiation to be emitted." Koops proposes using standard electronics to bunch the electrons before they enter the undulator.

Potylitsin, "Resonant Diffraction Radiation and Smith-Purcell Effect," 13 Apr. 1998, described an emission of electrons moving close to a periodic structure treated as the resonant diffraction radiation. Potylitsin's grating had "perfectly conducting strips spaced by a vacuum gap."

Smith-Purcell devices are inefficient. Their production of light is weak compared to their input power, and they cannot be optimized. Current Smith-Purcell devices are not suitable for true visible light applications due at least in part to their inefficiency and inability to effectively produce sufficient photon density to be detectible without specialized equipment.

We realized that the Smith-Purcell devices yielded poor light production efficiency. Rather than deflect the passing electron beam as Smith-Purcell devices do, we created devices that resonated at the frequency of light as the electron beam passes by. In this way, the device resonance matches the system resonance with resulting higher output. Our discovery has proven to produce visible light (or even higher or lower frequency radiation) at higher yields from optimized ultra-small physical structures.

c.i.9. Coupling Energy from Electromagnetic Waves

Coupling energy from electromagnetic waves in the terahertz range from 0.1 THz (about 3000 microns) to 700 THz (about 0.4 microns) is finding use in numerous new applications. These applications include improved detection of concealed weapons and explosives, improved medical imaging, finding biological terror materials, better characterization of semiconductors; and broadening the available bandwidth for wireless communications.

In solid materials the interaction between an electromagnetic wave and a charged particle, namely an electron, can occur via three basic processes: absorption, spontaneous emission and stimulated emission. The interaction can provide a transfer of energy between the electromagnetic wave and the electron. For example, photoconductor semiconductor devices use the absorption process to receive the electromagnetic wave and transfer energy to electron-hole pairs by band-to-band transitions. Electromagnetic waves having an energy level greater than a material's characteristic binding energy can create electrons that move when connected across a voltage source to provide a current. In addition, extrinsic photoconductor devices operate having transitions across forbidden-gap energy levels use the absorption process (S. M., Sze, "Semiconductor Devices Physics and Technology," 2002).

A measure of the energy coupled from an electromagnetic wave for the material is referred to as an absorption coefficient. A point where the absorption coefficient decreases rapidly is called a cutoff wavelength. The absorption coefficient is dependant on the particular material used to make a device. For example, gallium arsenide (GaAs) absorbs electromagnetic wave energy from about 0.6 microns and has a cutoff wavelength of about 0.87 microns: In another example, silicon (Si) can absorb energy from about 0.4 microns and has a cutoff wavelength of about 1.1 microns. Thus, the ability to transfer energy to the electrons within the material for making the device is a function of the wavelength or frequency of the electromagnetic wave. This means the device can work to couple the electromagnetic wave's energy only over a particular segment of the terahertz range. At the very high end of the terahertz spectrum a Charge Coupled Device (CCD)—an intrinsic photoconductor device—can successfully be employed. If there is a need to couple energy at the lower end of the terahertz spectrum certain extrinsic semiconductors devices can provide for coupling energy at increasing wavelengths by increasing the doping levels.

c.i.10. Surface Enhanced Raman Spectroscopy (SERS)

Raman spectroscopy is a well-known means to measure the characteristics of molecule vibrations using laser radiation as the excitation source. A molecule to be analyzed is illuminated with laser radiation and the resulting scattered frequencies are collected in a detector and analyzed.

Analysis of the scattered frequencies permits the chemical nature of the molecules to be explored. Fleischmann et al. (M. Fleischmann, P. J. Hendra and A. J. McQuillan, Chem. Phys. Lett., 1974, 26, 163) first reported the increased scattering intensities that result from Surface Enhanced Raman Spectroscopy (SERS), though without realizing the cause of the increased intensity.

In SERS, laser radiation is used to excite molecules adsorbed or deposited onto a roughened or porous metallic surface, or a surface having metallic nano-sized features or structures. The largest increase in scattering intensity is realized with surfaces with features that are 10-100 nm in size. Research into the mechanisms of SERS over the past 25 years suggests that both chemical and electromagnetic factors contribute to the enhancing the Raman effect. (See, e.g., A. Campion and P. Kambhampati, Chem. Soc. Rev., 1998, 27 241.)

The electromagnetic contribution occurs when the laser radiation excites plasmon resonances in the metallic surface structures. These plasmons induce local fields of electromagnetic radiation which extend and decay at the rate defined by the dipole decay rate. These local fields contribute to enhancement of the Raman scattering at an overall rate of E4.

Recent research has shown that changes in the shape and composition of nano-sized features of the substrate cause variation in the intensity and shape of the local fields created by the plasmons. Jackson and Halas (J. B. Jackson and N. J. Halas, *PNAS*, 2004, 101 17930) used nano-shells of gold to tune the plasmon resonance to different frequencies.

Variation in the local electric field strength provided by the induced plasmon is known in SERS-based devices. In U.S. Patent application 2004/0174521 A1, Drachev et al. describe a Raman imaging and sensing device employing nanoantennas. The antennas are metal structures deposited onto a surface. The structures are illuminated with laser radiation. The radiation excites a plasmon in the antennas that enhances the Raman scatter of the sample molecule.

The electric field intensity surrounding the antennas varies as a function of distance from the antennas, as well as the size of the antennas. The intensity of the local electric field increases as the distance between the antennas decreases.

c.i.11. Advantages & Benefits

Myriad benefits and advantages can be obtained by a ultra-small resonant structure that emits varying electromagnetic radiation at higher radiation frequencies such as infrared, visible, UV and X-ray. For example, if the varying electromagnetic radiation is in a visible light frequency, the micro resonant structure can be used for visible light applications that currently employ prior art semiconductor light emitters (such as LCDs, LEDs, and the like that employ electroluminescence or other light-emitting principals). If small enough, such micro-resonance structures can rival semiconductor devices in size, and provide more intense, variable, and efficient light sources. Such micro resonant structures can also be used in place of (or in some cases, in addition to) any application employing non-semiconductor illuminators (such as incandescent, fluorescent, or other light sources). Those applications can include displays for personal or commercial use, home or business illumination, illumination for private display such as on computers, televisions or other screens, and for public display such as on signs, street lights, or other indoor or outdoor illumination. Visible frequency radiation from ultra-small resonant structures also has application in fiber optic communication, chip-to-chip signal coupling, other electronic signal coupling, and any other light-using applications.

Applications can also be envisioned for ultra-small resonant structures that emit in frequencies other than in the visible spectrum, such as for high frequency data carriers. Ultra-small resonant structures that emit at frequencies such as a few tens of terahertz can penetrate walls, making them invisible to a transceiver, which is exceedingly valuable for security applications. The ability to penetrate walls can also be used for imaging objects beyond the walls, which is also useful in, for example, security applications. X-ray frequencies can also be produced for use in medicine, diagnostics, security, construction or any other application where X-ray sources are currently used. Terahertz radiation from ultra-small resonant structures can be used in many of the known applications which now utilize x-rays, with the added advantage that the resulting radiation can be coherent and is non-ionizing.

The use of radiation per se in each of the above applications is not new. But, obtaining that radiation from particular kinds of increasingly small ultra-small resonant structures revolutionizes the way electromagnetic radiation is used in electronic and other devices. For example, the smaller the radiation emitting structure is, the less "real estate" is required to employ it in a commercial device. Since such real estate on a semiconductor, for example, is expensive, an ultra-small resonant structure that provides the myriad application benefits of radiation emission without consuming excessive real estate is valuable. Second, with the kinds of ultra-small resonant structures that we describe, the frequency of the radiation can be high enough to produce visible light of any color and low enough to extend into the terahertz levels (and conceivably even petahertz or exahertz levels with additional advances). Thus, the devices may be tunable to obtain any kind of white light transmission or any frequency or combination of frequencies desired without changing or stacking "bulbs," or other radiation emitters (visible or invisible).

Currently, LEDs and Solid State Lasers (SSLs) cannot be integrated onto silicon (although much effort has been spent trying). Further, even when LEDs and SSLs are mounted on a wafer, they produce only electromagnetic radiation at a single color. The present devices are easily integrated onto even an existing silicon microchip and can produce many frequencies of electromagnetic radiation at the same time.

There is thus a need for a device having a single layer basic construction that can couple energy from an electromagnetic wave over the full terahertz portion of the electromagnetic spectrum.

C.ii. Glossary from the '477 Application

As used throughout this document:

The phrase "ultra-small resonant structure" shall mean any structure of any material, type or microscopic size that by its characteristics causes electrons to resonate at a frequency in excess of the microwave frequency.

The term "ultra-small" within the phrase "ultra-small resonant structure" shall mean microscopic structural dimensions and shall include so-called "micro" structures, "nano" structures, or any other very small structures that will produce resonance at frequencies in excess of microwave frequencies.

C.iii. Detailed Description from the '477 Application

Figure 2:
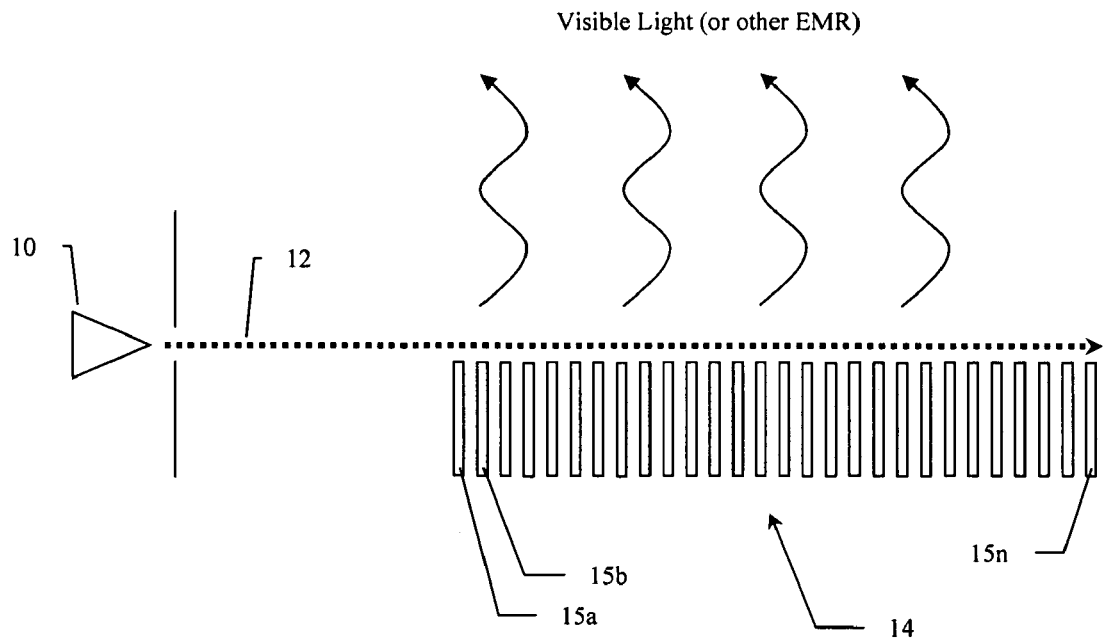
Figure 3:
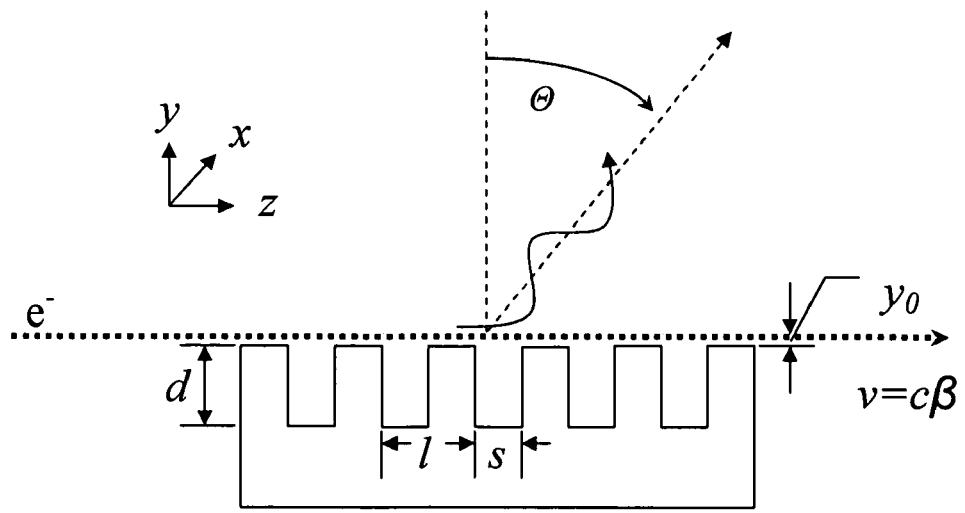
Figure 5:
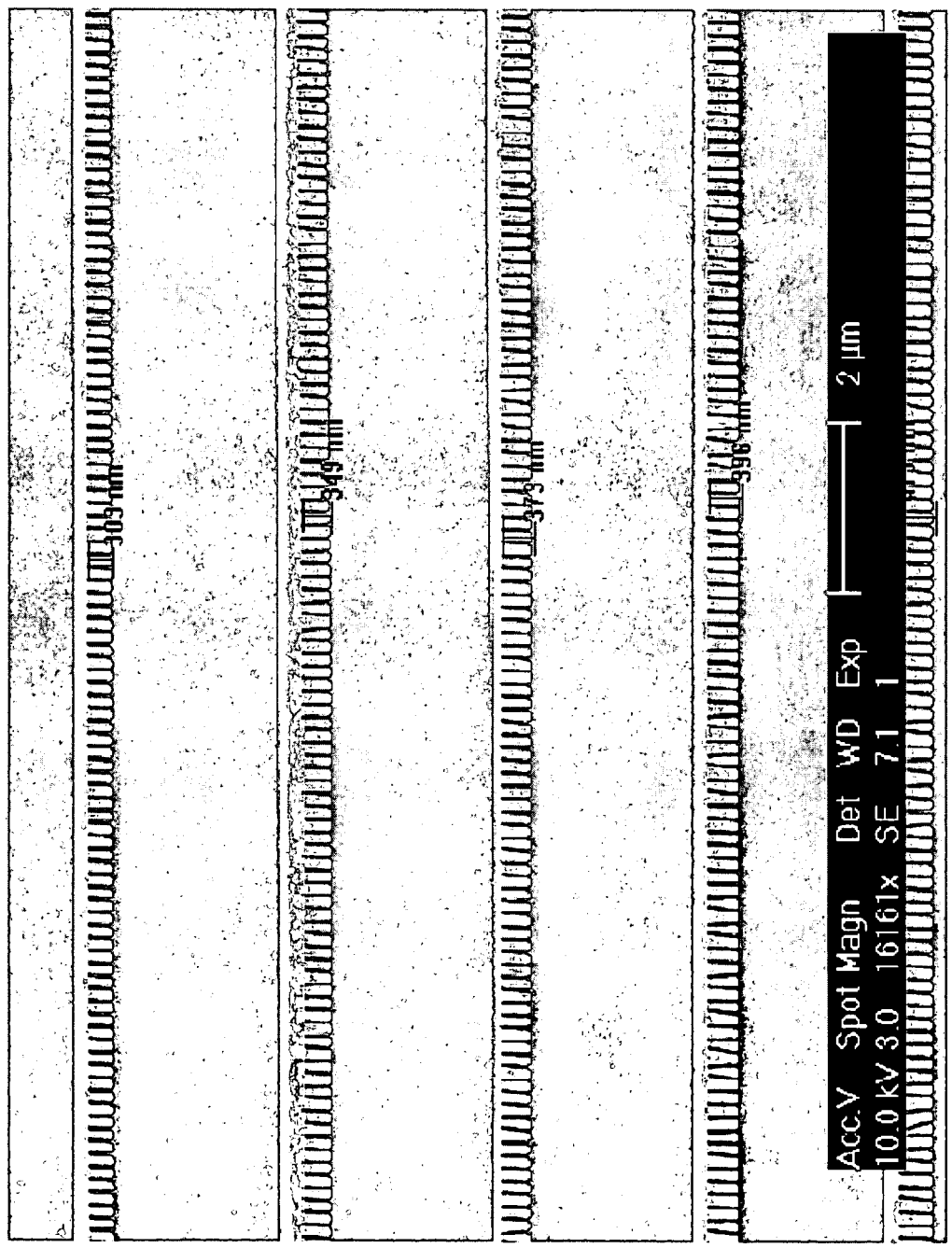
Figure 6:
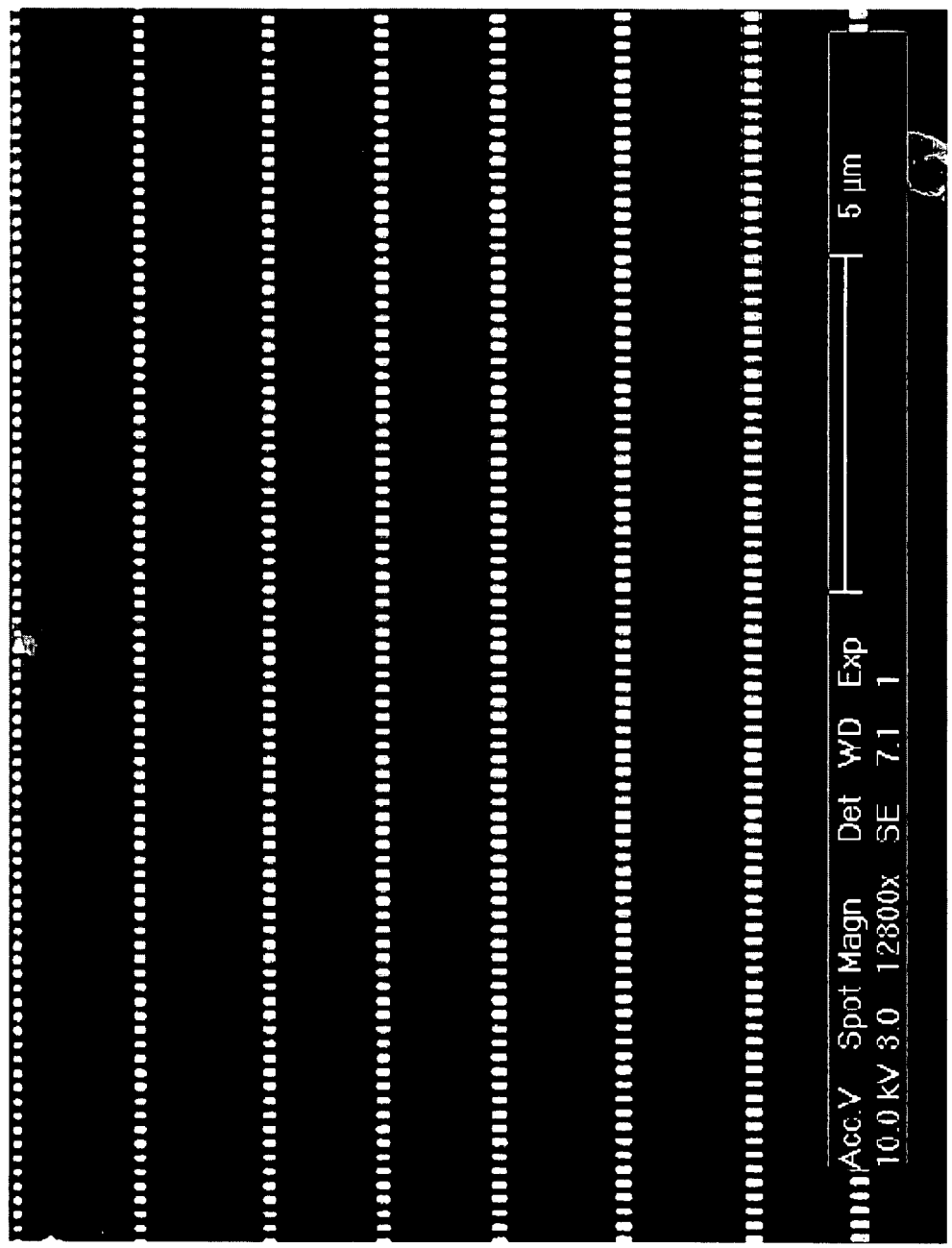
Figure 7:
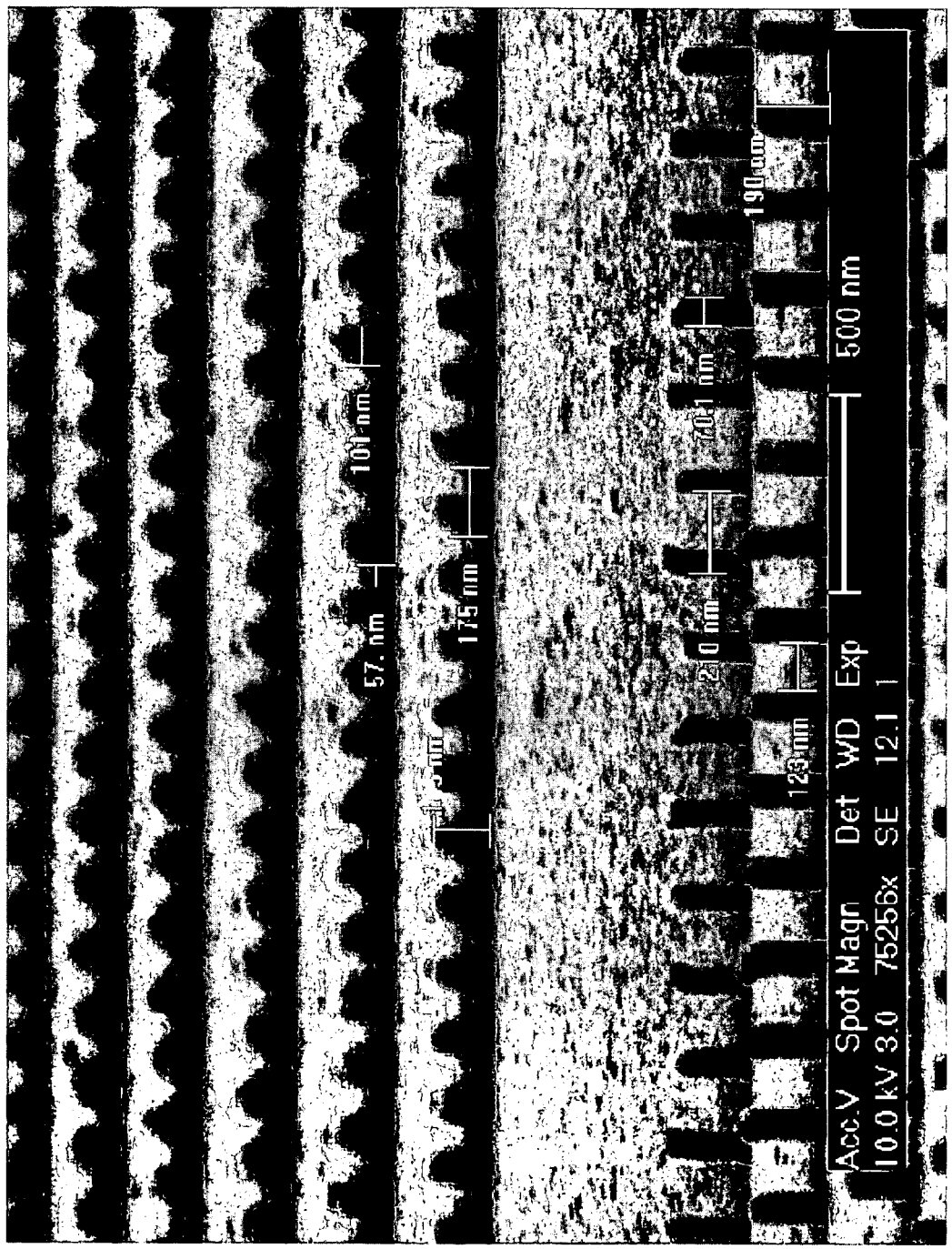
Figure 8:
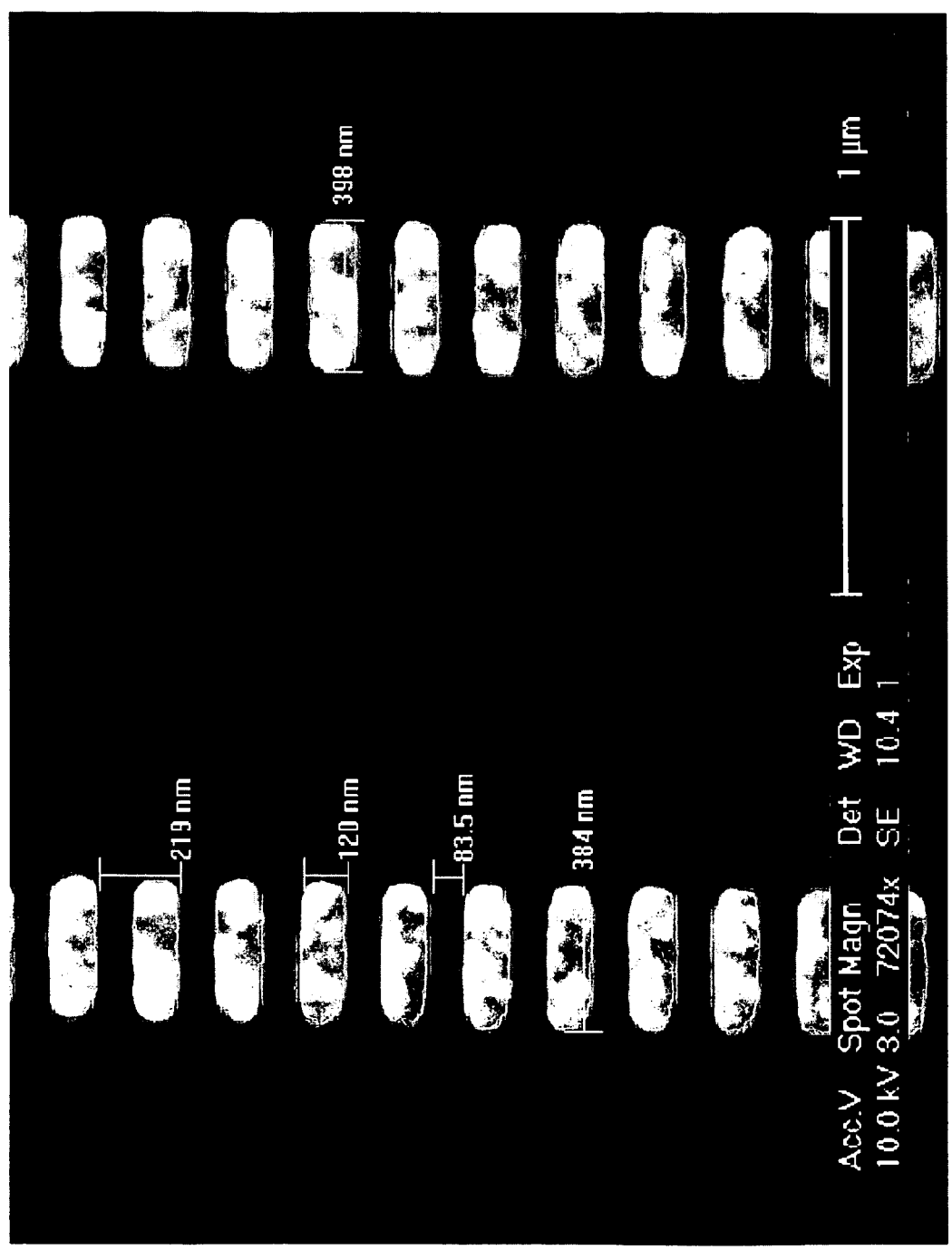
Figure 9:
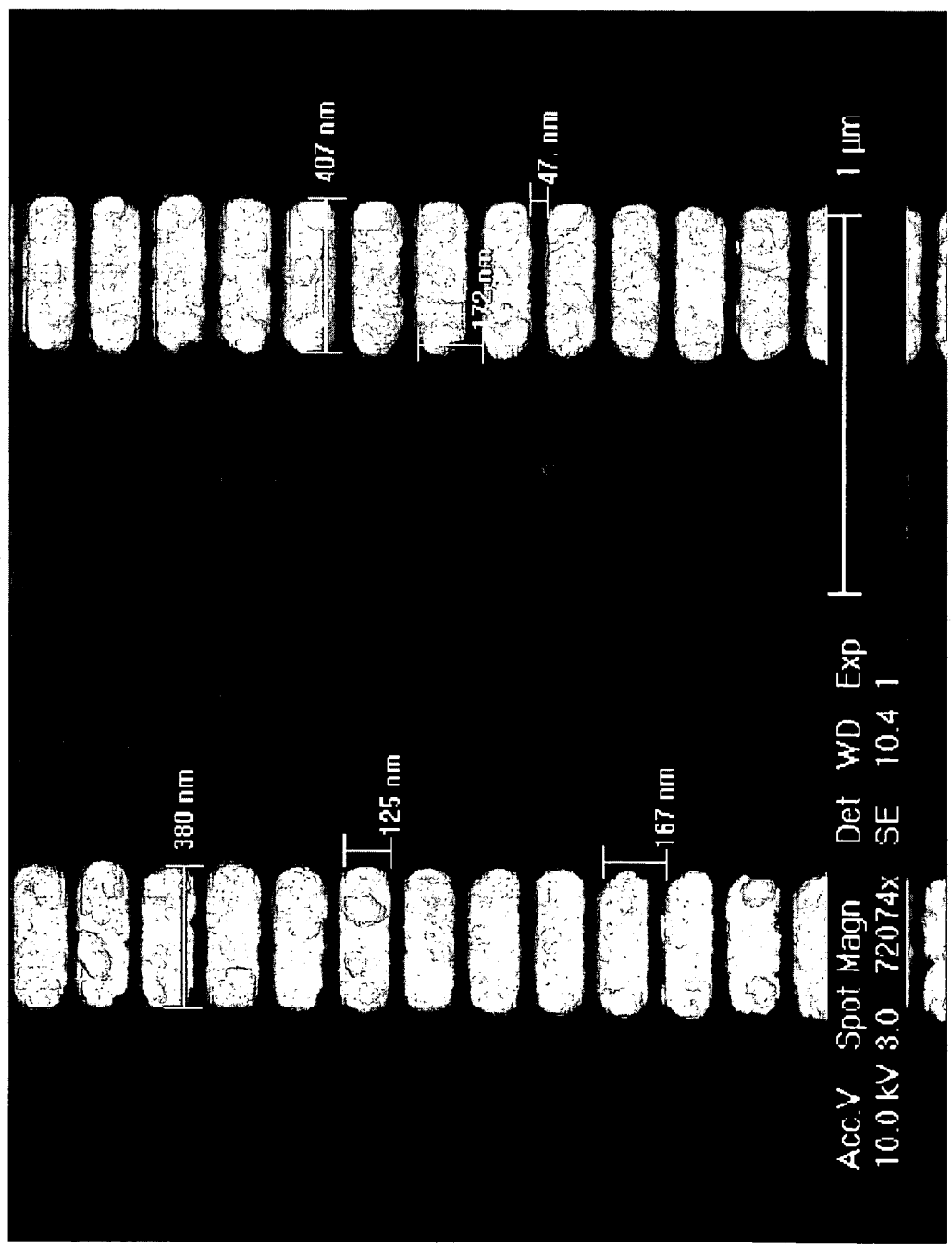
Figure 10:
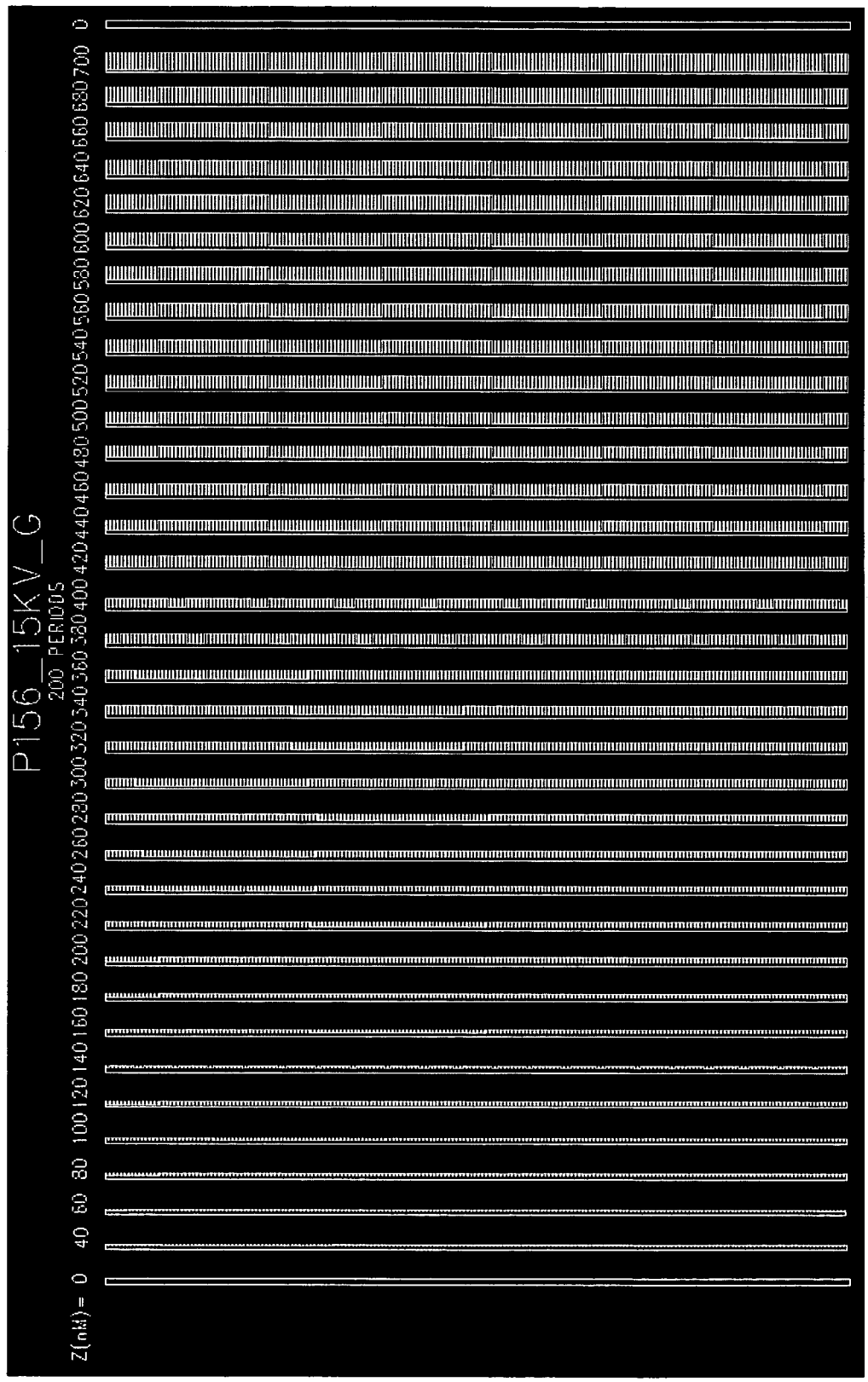
Figure 11:
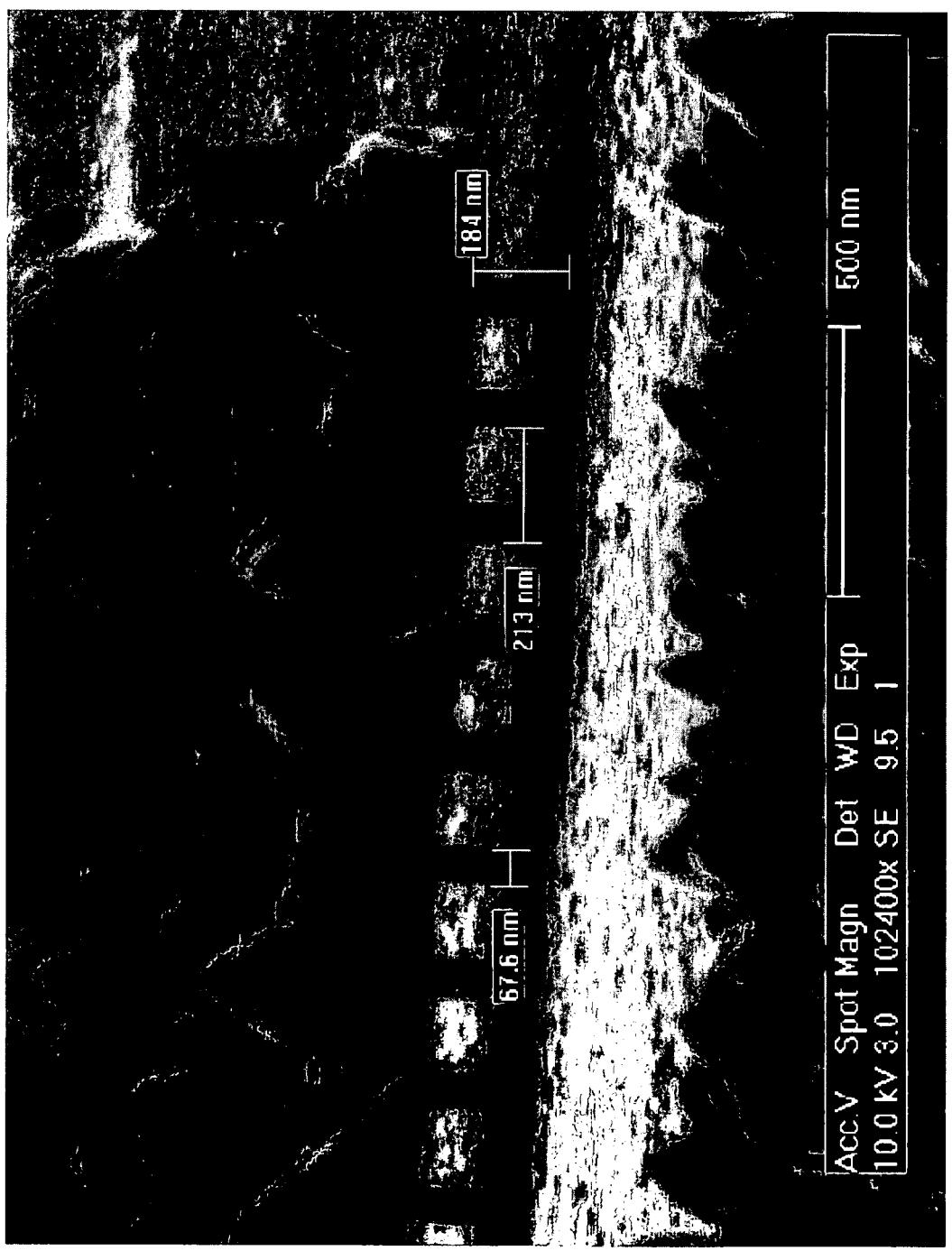
Figure 12:
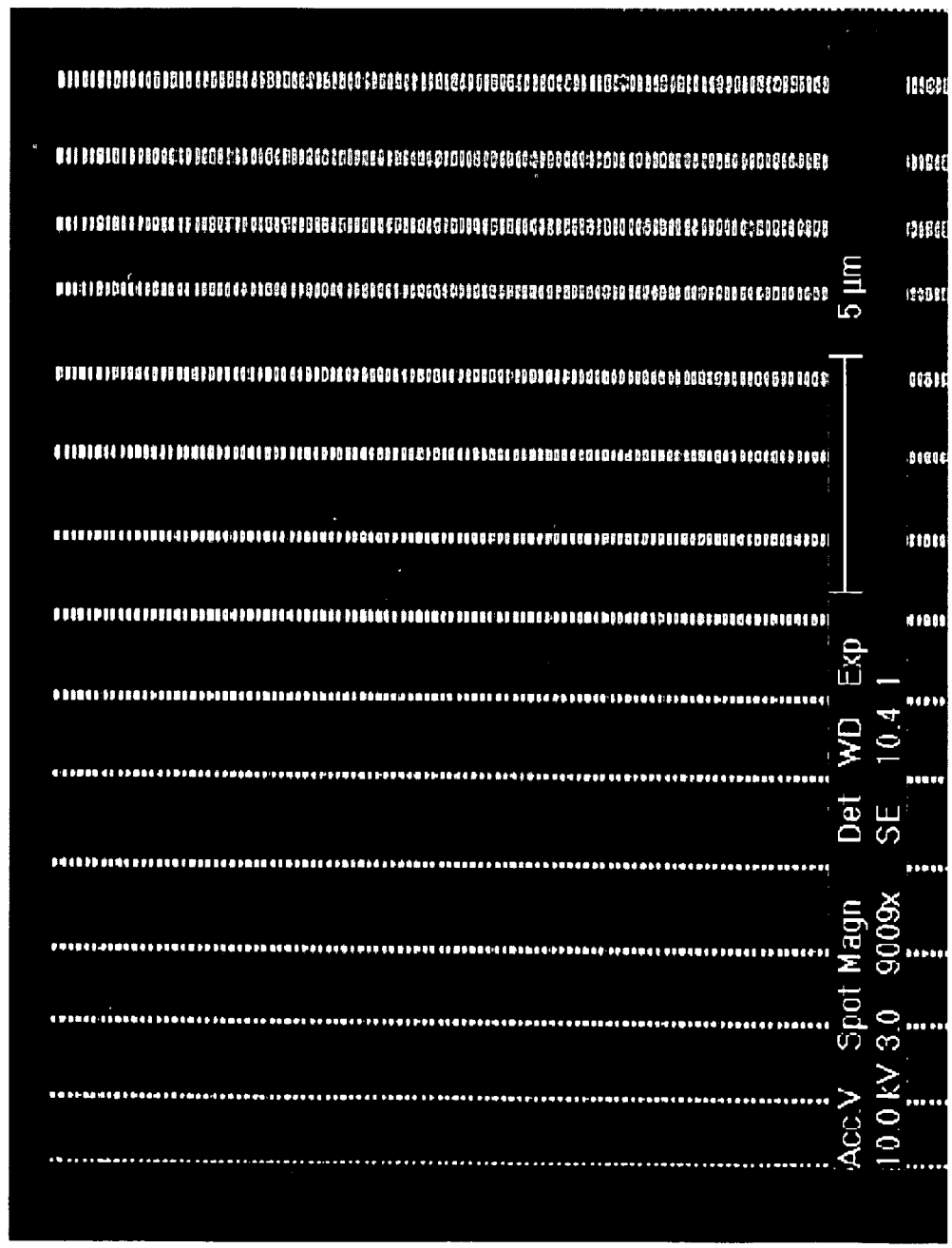
Figure 13:
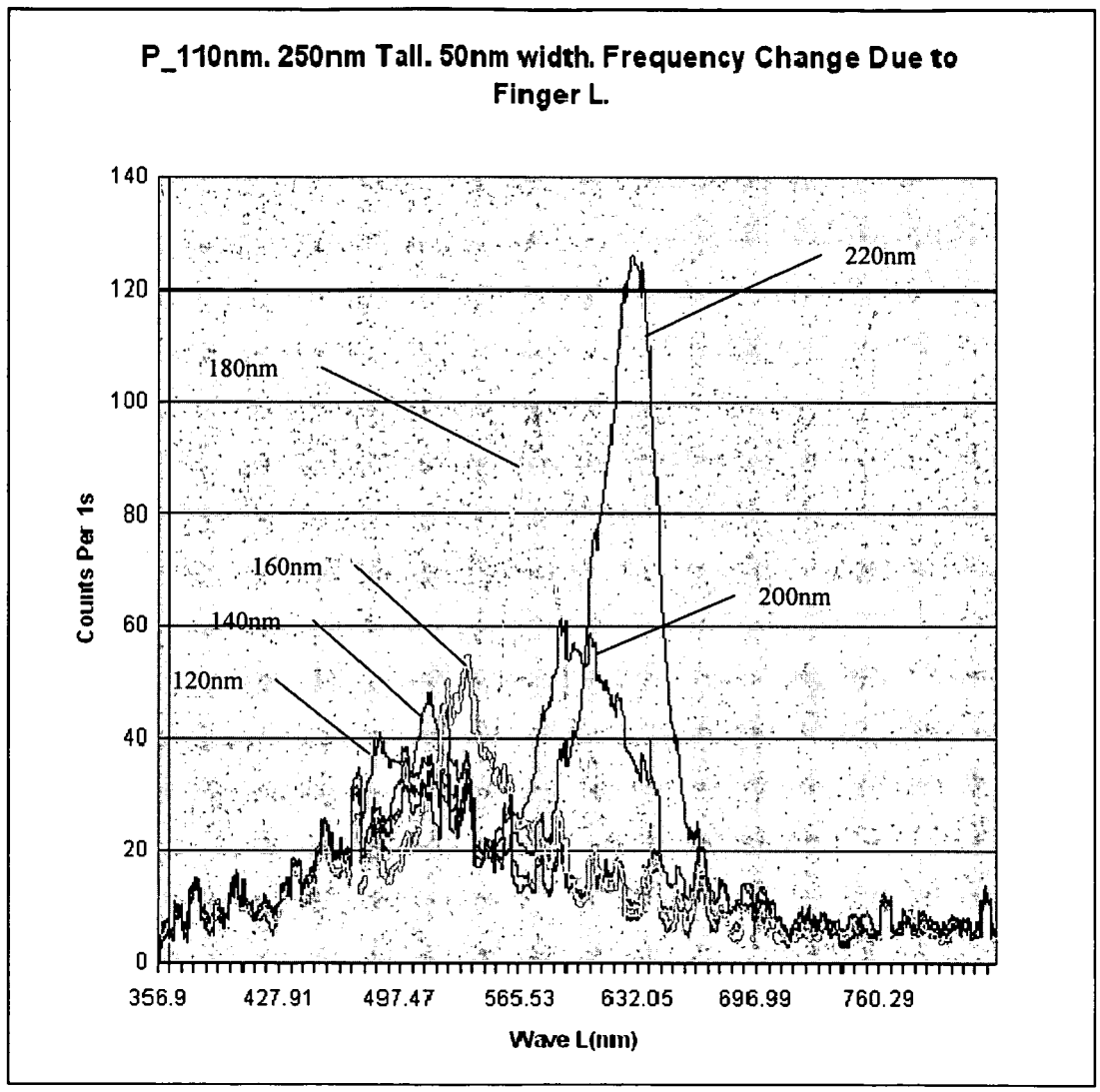
Figure 14:
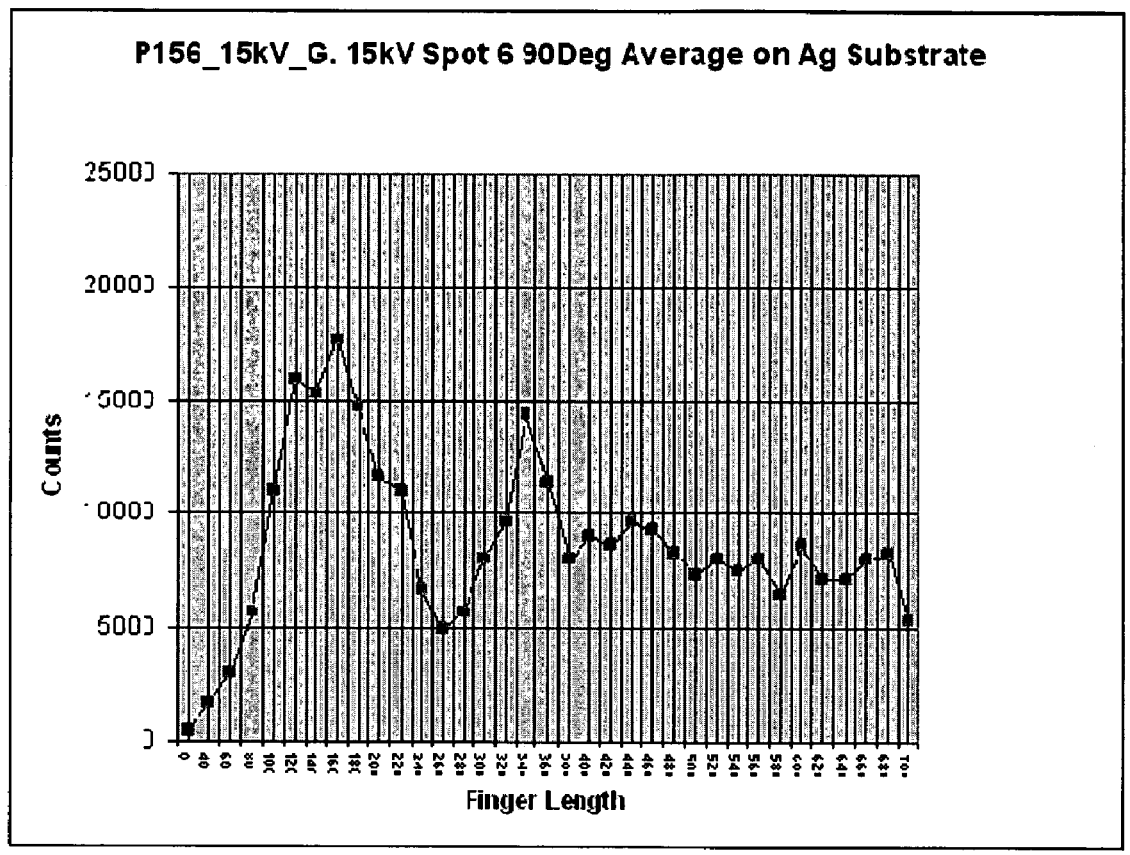
Figure 15:
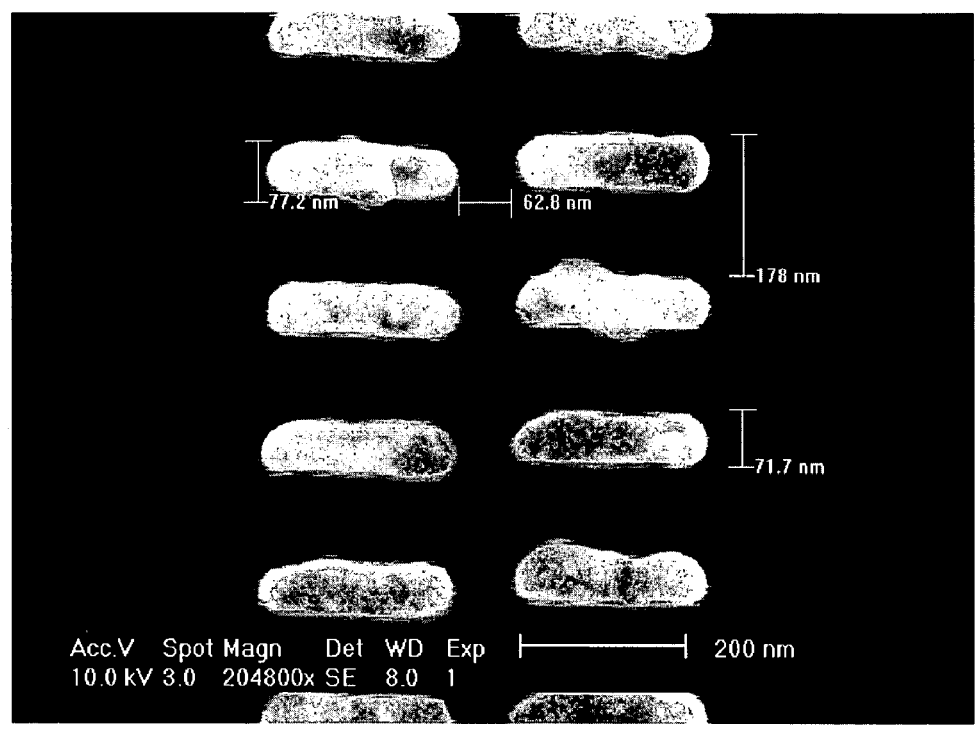
Figure 16:
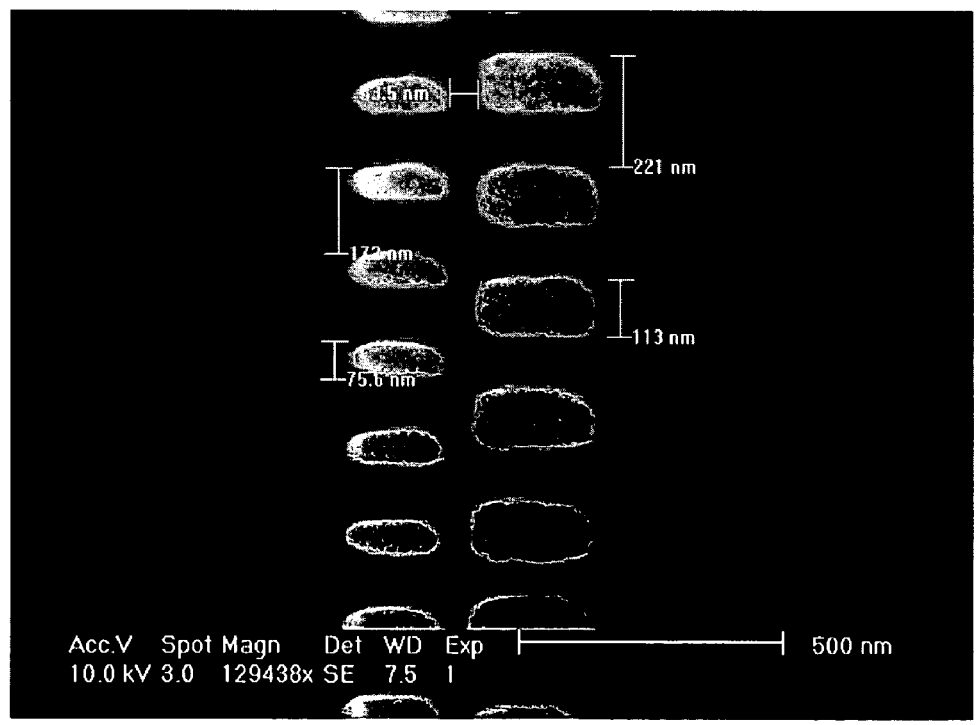
Figure 17:
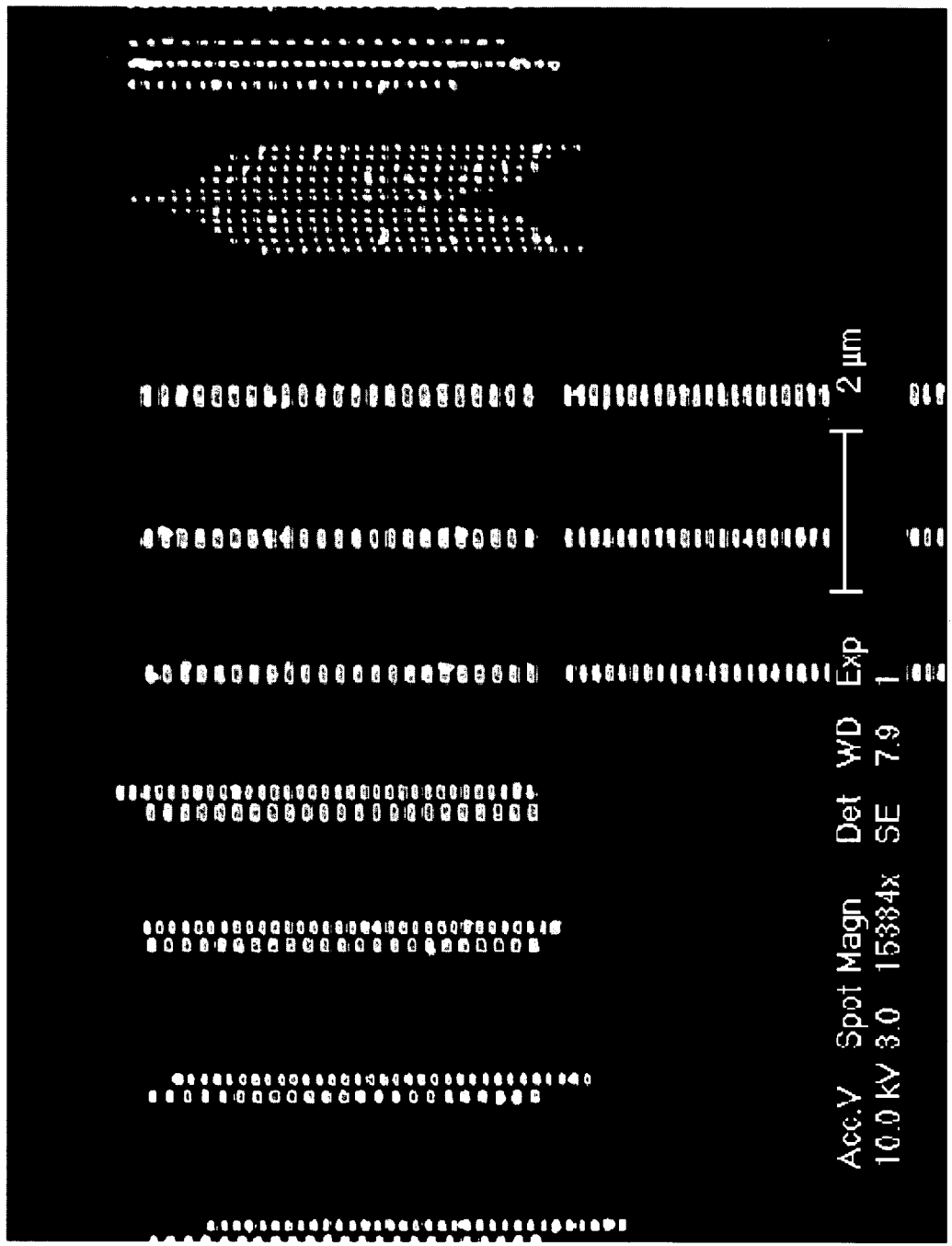
Figure 19:
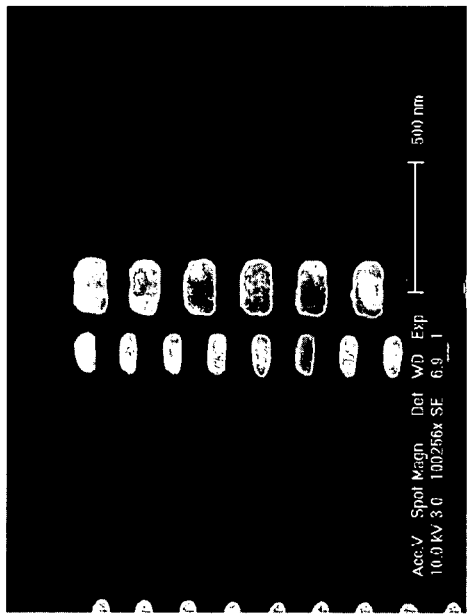
Figure 20:
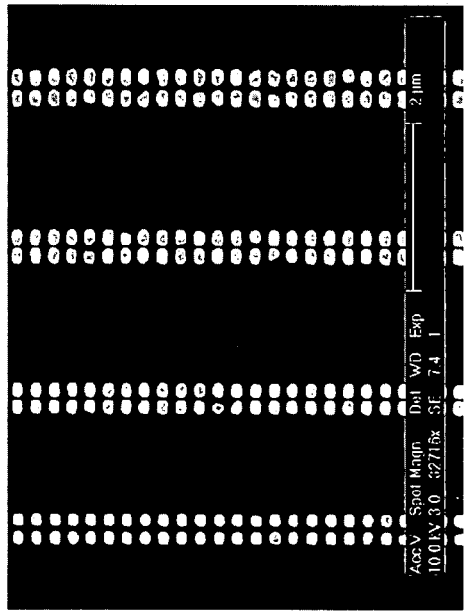
Figure 18:
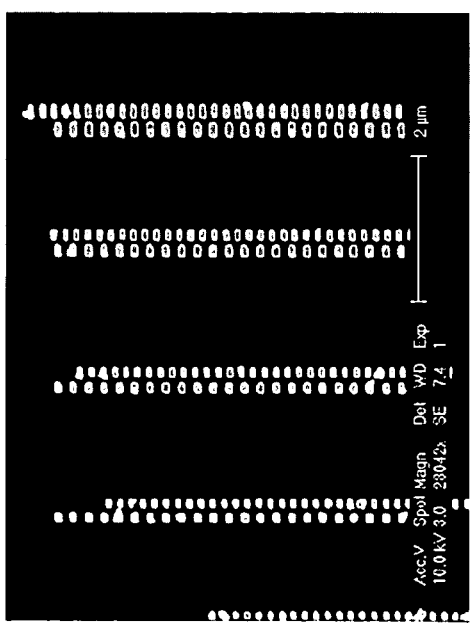

FIG. 1(a) shows a prior art example klystron.
FIG. 1(b) shows a prior art example magnetron.
FIG. 1(c) shows a prior art example reflex klystron.
FIG. 1(d) depicts aspects of the Smith-Purcell theory.
FIG. 2 is schematic representation of an example embodiment of the invention;
FIG. 3 is another schematic representation of certain parameters associated with light emission from exemplary embodiments of the present invention;
FIG. 4 is a microscopic photograph of an example light-emitting comb structure;
FIG. 5 is a microscopic photograph of a series of example light-emitting comb structures;
FIG. 6 is a microscopic photograph of a series of example light-emitting comb structures;
FIG. 7 is a microscopic photograph of a side view of example series of comb structures;
FIGS. 8 and 9 are closer version microscopic photographs of example light-emitting comb structures;
FIG. 10 is an example substrate pattern used for testing the effect of comb length variations;
FIG. 11 is a microscopic photograph of a side view of an example comb structure;
FIG. 12 is a microscopic photograph of a series of frequency sensitive comb structures;
FIG. 13 is a graph showing example intensity and wavelength versus finger length for some of the series of comb teeth of FIG. 10;
FIG. 14 is a graph showing intensity versus post length for the series of comb teeth of FIG. 10;
FIGS. 15 and 16 are microscopic photographs of dual rows of comb teeth;
FIG. 17 is an example substrate with example dual rows of comb teeth and single rows of comb teeth;
FIGS. 18-20 are further examples of dual rows of comb teeth; and
FIGS. 21-24 are further examples of dual rows of C-shaped structures.

As shown in FIG. 2, a single layer of metal, such as silver or other thin metal, is produced with the desired pattern or otherwise processed to create a number of individual resonant elements. Although sometimes referred to herein as a "layer" of metal, the metal need not be a contiguous layer, but can be a series of elements individually present on a substrate. The metal with the individual elements can be produced by a variety of methods, such as by pulse plating, depositing or etching. Preferred methods for doing so are described in co-pending U.S. application Ser. No. 10/917,511, filed on Aug. 13, 2004, entitled "Patterning Thin Metal Film by Dry Reactive Ion Etching," and in co-pending U.S. application Ser. No. 11/203,407, filed on Aug. 15, 2005, entitled "Method of Patterning Ultra-small Structures."

The etching does not need to remove the metal between posts all the way down to the substrate level, nor does the plating have to place the metal posts directly on the substrate (they can be on a silver layer on top of the substrate, for example). That is, the posts may be etched or plated in a manner so a small layer of conductor remains beneath, between and connecting the posts. Alternatively, the posts can be conductively isolated from each other by removing the entire metal layer between the posts. In one embodiment, the metal can be silver, although other metal conductors and even dielectrics are envisioned as well.

A charged particle beam, such as an electron beam 12 produced by an electron microscope, cathode, or any other electron source 10 and passing closely by a series of appropriately-sized structures, causes the electrons in the structures to resonate and produce visible light. In FIG. 2, resonance occurs within the metal posts 14 and in the spaces between the metal posts 14 on a substrate and with the passing electron beam. The metal posts 14 include individual post members 15a, 15b, . . . 15n. The number of post members 15a . . . 15n can be as few as one and as many as the available real estate permits. We note that theoretically the present resonance effect can occur in as few as only a single post, but from our practically laboratory experience, we have not measured radiation from either a one post or two post structure. That is, more than two posts have been used to create measurable radiation using current instrumentation.

The spaces between the post members 15a, 15b, . . . 15n (FIG. 2) create individual cavities. The post members and/or cavities resonate when the electron beam 12 passes by them. By choosing different geometries of the posts and resonant cavities, and the energy (velocity) of the electron beam, one can produce visible light (or non-visible EMR) of a variety of different frequencies (for example, a variety of different colors in the case of visible emissions) from just a single patterned metal layer.

That resonance is occurring can be seen in FIG. 14. There, the average results of a set of experiments in which the photon radiation from an example of the present invention was plotted (in the y-axis, labeled "counts" of photons, and measured by a photo multiplier tube as detected current pulses) versus the length of the length of the posts 14 that are resonating (in the x-axis, labeled as "finger length"). The intensity versus finger length average plot shows two peaks (and in some experimental results, a third peak was perhaps, though not conclusively, present) of radiation intensity at particular finger lengths. We conclude that certain finger lengths produce more intensity at certain multiple lengths due to the resonance effect occurring within the post 14 itself.

For completeness, the substrate used in the above finger length resonance tests is shown in FIG. 10. There, the lines of posts in the vertical direction correspond to posts of different length from "0" length to 700 nm length. As described in more detail below, the experiment is conducted by passing an electron beam near the rows of posts and generally perpendicular to them (that is, the electron beam passes vertically with respect to FIG. 10). The specifications for the experiment were: a period between posts of 156 nm, a 15 kV beam energy from an electron microscope at 90 degrees to the length of the posts. In that test, a continuous conductive silver substrate layer was beneath the posts. When we repeated the tests, we found that there was some variation in terms of actual intensities seen by the different finger lengths, which we attribute to slight variations in the proximity of the electron beam to the post runs, but the resonance effect was generally apparent in each case.

Notably, the resonance effect described in FIG. 14 appears to occur in the individual posts themselves. That is, it appears that we are recording an effect that occurs from oscillations that are on the surface (including perhaps within) the posts themselves. That resonance is supplementing system resonance, namely the resonance that occurs between adjacent posts. Although these theories do not limit our inventions, we believe that the supplemental resonance occurring within the posts is amplifying the system resonance such that new, substantial levels of intensity are being recognized. As the electron beam passes by the posts, charged particles in the posts begin to resonate between adjacent posts. That resonance produces electromagnetic radiation and is predominantly responsible for the first peak in FIG. 14. What we have now seen is that we can, by choosing finger length, demonstrate further resonance within the fingers themselves (as opposed to between adjacent fingers) that is predominantly responsible for the second peak and is also responsible for amplifying the intensity of the system resonance. We have seen, for example, that without system resonance, then the electron beam cannot be made intense enough to excite the in-post resonance to a detectible level. But, with the system resonance, both the system resonance and the in-post resonance excite the others to further excitation.

We have also detected with angle periodic structures that running the beam one way over the angled teeth produces an effective output while running the beam the other way decreases the output dramatically.

We have also detected that, unlike the general theory on Smith-Purcell, which states that frequency is only dependant on period and electron beam characteristics (such as beam intensity), some of the frequencies of our detected beam change with the finger length. Thus, as shown in FIG. 13, the frequency of the electromagnetic wave produced by the system on a row of 220 nm fingers (posts) has a recorded intensity and wavelength greater than at the lesser shown finger lengths. With Smith-Purcell, the frequency is related to the period of the grating (recalling that Smith-Purcell is produced by a diffraction grating) and beam intensity according to:

$$\lambda = \frac{L}{|n|} \cdot \left(\frac{1}{\beta} - \sin\theta\right)$$

where λ is the frequency of the resonance, L is the period of the grating, n is a constant, β is related to the speed of the electron beam, and θ is the angle of diffraction of the electron.

It is reasonable to suggest, that if the other modes are aligned to the operating frequency, the Q of the device will be improved. A sweep of the duty cycle of the space width s (shown in FIG. 3) and post width (l−s) indicates that the space width s and period length l have relevance to the center frequency of the resultant radiation. By sweeping the geometries d, l, and s of FIG. 3 and the length of the posts (shown in FIG. 2 and variously at FIG. 10), at given electron velocity v and current density, while evaluating the characteristic harmonics during each sweep, one can ascertain a predictable design model and equation set for a particular metal layer type and construction. With such, a series of posts can be constructed that output substantial EMR in the visible spectrum (or higher) and which can be optimized based on alterations of the geometry, electron velocity and density, and metal type.

Using the above-described sweeps, one can also find the point of maximum Q for given posts 14 as shown in FIG. 14. Additional options also exist to widen the bandwidth or even have multiple frequency points on a single device. Such options include irregularly shaped posts and spacing, series arrays of non-uniform periods, asymmetrical post orientation, multiple beam configurations, etc.

Some example geometries are described herein and are shown in the associated figures. Those geometries do not limit the present inventions, but are described in order to provide illustrative examples of geometries that work for the intended purpose. In FIG. 3, an example representation of our posts is shown with dimensional variables labeled for clarity. As described above, in our devices, for example, as the post length d was swept in length, the intensity of the radiation was oscillatory in nature, aligning very near to the second and third harmonic lengths.

In FIG. 4, a microscopic photograph depicts a set of actual single metal-layer posts, of the kind generally referred to in FIG. 3. In the FIG. 4 example, the metal layer is silver. The metal is pulse plated to provide the posts 14 shown. The posts may be constructed according to the techniques described in the applications identified above under "Related Applications."

In FIG. 4, the post length is about 698 nm. The space width, s, is about 51.5 nm. The post and space width, l, is about 155 nm. The electron beam runs perpendicular to the length of the posts and spaces, as shown in FIG. 2. Unlike a Smith-Purcell device, the resultant radiation from a structure such as shown in FIG. 4 is actually intense enough to be visible to the human eye without the use of a relativistic electron beam. Another example set of the structures of FIG. 4 in which the post length was altered to determine the effect on harmonic lengths is shown in FIG. 5. There, four different example post lengths are shown, 303 nm, 349 nm, 373 nm, and 396 nm. The example of FIG. 5 realizes harmonic oscillation aligning near the second and third harmonic lengths As described previously, by altering the combined length, period l, spaces s, and post members $15a \ldots 15n$, the center frequency of the radiation changes. It is thus valuable to size a row of posts 14 such that a desired frequency of visible light is emitted when the charged particle beam is passed near it. FIG. 6 illustrates an alternative example embodiment in which we produce a variety of frequencies by modifying the post lengths in multiple rows of differently configured posts. By etching, plating or otherwise producing multiple rows of posts, each of which is tuned to a produce a different frequency, multiple colors of visible light can be produced by directing an injected charged particle beam parallel and close to appropriate ones of the rows.

Indeed, we can envision a row of posts having varying lengths within the row itself, such that different frequencies of radiation are excited by different ones or combinations of posts. The result could be a mixed, multiple wavelength light.

Different frequency outputs can also be obtained by directing multiple charged particle beams at different rows of posts etched from or plated on the same metal layer. Thus, one can obtain any color of visible light from a single layer metal nano- or micro-structure. Because the rows are only about a few micrometers or less apart, directing multiple electron beams simultaneously at different ones of the rows could also mix the visible light to yield to the human eye essentially any color frequency in the visible spectrum. The breadth and sensitivity of color options available in such a system is limited only by the number and geometries of the rows, and the number of electron beam sources available to stimulate the rows into resonance.

FIG. 7 illustrates a side view of a set of rows of posts. As shown, each row has a different geometry to produce a different radiation. Various period, space distances, and depths are shown. The lengths of the posts, a dimension clearly shown in the example of FIG. 6, are not clearly identifiable in FIG. 7. In FIG. 7, the period of the second row is 210 nm while the period of the third row is 175 nm. The space of the first row is 123 nm, while the space of the fourth row is 57 nm. Depths and lengths can also be varied. Each of the rows can exhibit different post geometries (although there may be reasons for including some or all rows of duplicate geometries).

As shown in FIG. 6, the post elements 14 do not necessarily have to have the backbone portion connecting the posts, as shown in FIG. 4. The posts on the substrate can resemble a comb with a backbone connecting all of the teeth, as in FIG. 4, or can resemble be just the teeth without the comb backbone, as in FIG. 6. Each post can also be freestanding and physically unconnected to adjacent posts except by the portion of metal layer remaining beneath the posts or by the substrate if the metal layer is completely removed from around the posts. Alternatively, the posts can be connected by remaining metal layer in the form of the backbone shown in FIG. 3 or by a top layer shown in FIG. 11, or by a connecting conductive substrate beneath the posts. In FIG. 11, the posts have period length l of 213 nm, a post width (l–s) of 67.6 nm and a height (d) of 184 nm. The posts are covered by a layer of silver, which can provide advantageous—though not necessary—coupling between the posts (such coupling can also or alternatively be provided by contiguous metal layer left beneath the posts).

FIGS. 8 and 9 illustrate still further example geometries of non-backboned posts 14 are shown. In each case, just two rows are shown, although any number of rows can be employed, from one to any. The number of rows is limited by available real estate on the substrate, except that multiple substrates can also be employed proximate (side-by-side or atop) each other. The specific dimensions shown in FIGS. 8 and 9, like the other examples described herein are just illustrative and not limiting. Sizes and geometries of the posts, numbers of the posts, sequences of the posts, and arrangements of the posts can also be changed and remain within the concepts of the present inventions.

When the backbone is removed, for certain wavelengths, radiation can emit from both sides of the device. Depending on the spacing and the XY-dimensions of the post members, it may be possible that there is a blocking mode that negates the photon emission from that side. The emissions are thus altered by the presence/absence of the backbone, but the existence of resonance remains.

The direction of the radiation can also be adjusted. We have noted that radiation has been detected outwardly from the row (essentially parallel to the long dimension of the posts and spaces), as well as upwardly (relative, for example, to the plane of FIG. 6). It thus appears that some directionality can be advantageously employed for the radiation's initial direction.

Given that plasmon velocity is material dependent, it can be advantageous to build devices using conductive materials other than silver. We expect that less conductive materials would have a lower emission wavelength due to the slower plasmon velocity. Similarly, more conductive material would have higher emission wavelengths. Thus, metal or other conductive layers of different types can be employed. As described above, we envision single metal or alloy layers of different row geometries producing different frequencies. We also envision different metal layer types with the same or different row geometries to produce different frequencies.

FIG. 12 illustrates anther set of post rows (similar to FIG. 10). The rows in FIG. 12 have no backbones on the posts. As can be seen, the different rows are formed of a common metal layer and have different lengths so as to produce different frequencies and intensities of radiation when a charge particle beam passes close to (and generally parallel to) a selected row.

FIGS. 15-17 are still further example configurations of the rows of posts 14. In FIGS. 15 and 16, two rows are provided in proximity, so an electron beam 12 can be passed between the two rows, exciting resonance in each row simultaneously.

Each row can have posts of the same geometry or each row can have posts of different geometries. Further, as between the two rows, the geometries of the posts can be entirely the same, some different, or entirely different. If the rows have uniform posts within the row and different posts as between the two rows, then the different rows produce different wavelengths of radiation from a common electron beam.

With the two row embodiments of FIGS. 15-16, detectable light output was increased at least 20% (the increase is likely much more than 20% due to the inability to detect light going in undetected directions from the two rows.

FIG. 17 is a substrate with some two row embodiments, as in FIGS. 15 and 16, with other single row and multiple row example embodiments. In FIG. 17, the dual row embodiments on the left side produced light of two different colors. FIGS. 18-20 show some additional details of the dual row embodiments. It is worth noting that simultaneous dual frequency outputs from two rows, like those shown in FIG. 18-20, are not realized with devices operating according to diffraction theory, such as Smith-Purcell devices.

Figure 21:
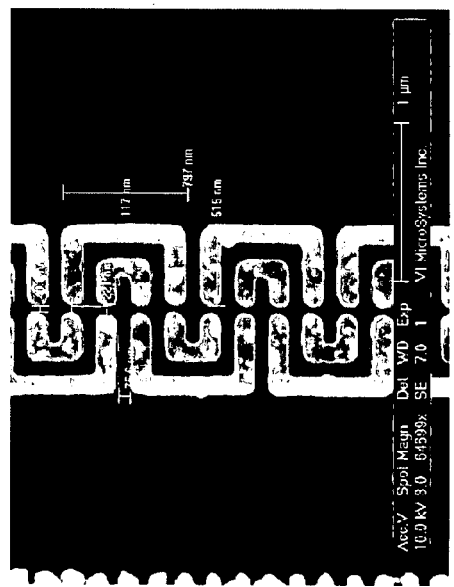

As should be understood from these descriptions, there is a wide variety of geometries of posts, geometries of rows, orientations of posts and rows, kinds of posts, kinds of metal, kinds of substrates, backbones, electron beam characteristics and other criteria that we envision within the framework of our inventions. We envision within our inventions deviations from the above criteria, whether or not specifically described herein. For example, FIGS. 21-24 show still further example resonant structures by which an electron beam can pass to induce resonance in and between. In FIG. 21, the structures are not in the form of straight posts (as in FIG. 1), but are instead C-shaped cavities which can form a type of waveguide. The electron beam passes down the middle of the facing C's, perpendicular to the arms of the Cs. As in FIG. 1, the electron beam induces resonance in the structures, both within the structures (including surface resonance) and among the structures (system resonance) to produce electromagnetic radiation at superior intensities and optimizable wavelengths.

FIG. 21 also illustrates a device that exhibits higher order of harmonics by alternating "half-stubs" between the full stubs. The same kind of idea in which half-stubs are alternated with full stubs can be incorporated into any of the other embodiments (such as the several post embodiments) described earlier in this document. In the case of FIG. 21, the half-stubs are actually half-Cs nestled into the full-Cs, with the electron beam passing near and perpendicular to the arms of each. Resonance occurs within each C, between the nestled and nestling Cs, and between adjacent large Cs. As in previously described embodiments, the period of the repeating Cs is less than the wavelength of light, so the light is not being diffracted because the period spacing is so small that the arms of the Cs (or in the case of the posts, the ends of the posts) appear essentially as a solid "surface" to the wave. In the case of FIG. 21, the period of the respective arms of the Cs is 117 nm. The distance from the end of one arm of a big-C to the other arm of the same big-C is about 797 nm (i.e., it can be greater than the wavelength of light) The length of each big-C arm is about 515 nm.

Figure 22:
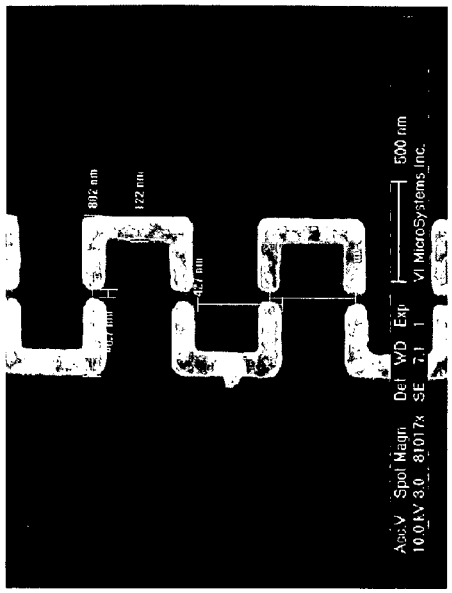

FIG. 22 illustrates a double rowed, single-C embodiment in which offset, facing Cs are provided with the electron beam running between them. As shown, the period of the repeating arms is about 427 nm. The space within which the electron beam runs is about 40 nm. The width of the C is about 122 nm. The entire length of two facing Cs and the space between is 802 nm.

Figure 24:
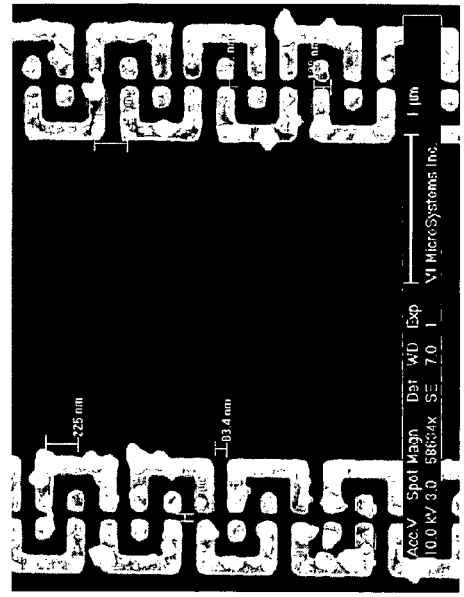
Figure 23:
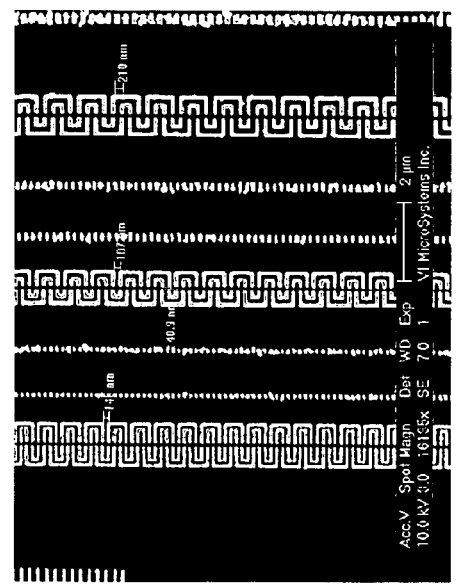

FIG. 23 illustrates a number of example light-producing embodiments, including nestled-C embodiments and post embodiments. FIG. 24 is a hybrid of the Cs and posts, in which a post is nestled into each C. The posts and C-arms have a period of about 225 nm, with a spacing between the arms of adjacent Cs of about 83 nm. Again, the electron runs down the middle slit to induce resonance in the proximate posts and ends of the C-arms.

All of the structures described operate under vacuum conditions. Our invention does not require any particular kind of evacuation structure. Many known hermetic sealing techniques can be employed to ensure the vacuum condition remains during a reasonable lifespan of operation. We anticipate that the devices can be operated in a pressure up to atmospheric pressure if the mean free path of the electrons is longer than the device length at the operating pressure.

The conductive structures described herein are preferably comprised of silver, but may be any conductive metal or may be any non-metallic conductor such as an ionic conductor. Dielectrics are also envisioned as layer materials in the alternative to conductive layers, or in combination with them.

We have thus described electron beam induced resonance that can be used to produce visible light of optimized frequencies from a single metal layer. Such devices have application in such fields as ultra high-speed data communications and in any light producing application.

The various devices and their components described herein may be manufactured using the methods and systems described in related U.S. patent application Ser. No. 10/917, 511, filed on Aug. 13, 2004, entitled "Patterning Thin Metal Film by Dry Reactive Ion Etching," and U.S. application Ser. No. 11/203,407, filed on Aug. 15, 2005, entitled "Method Of Patterning Ultra-Small Structures," both of which are commonly owned with the present application at the time of filing, and the entire contents of each of have been incorporated herein by reference.

Thus are described electron beam induced resonance and methods and devices for making and using same. While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

We claim:

1. A method of patterning a series of ultra-small structures in a continuum on a single surface to emit electromagnetic radiation at an output wavelength when a charged particle beam is directed generally along and proximate the series of structures, the series having a period between the structures less than the wavelength of the emitted electromagnetic radiation, the method comprising:
   providing a conductive layer;
   depositing a mask layer on said conductive layer;
   defining a pattern in said mask layer having said period; and
   growing said series of ultra-small structures on said surface in a pulse-electroplating process including applying a series of voltage pulses comprising at least one positive voltage pulse, wherein each said at least one positive voltage pulse is between 1.5 and 12 volts and each said at least one positive voltage pulse is for a period of less than 500 ns.

2. The method of claim 1 wherein said ultra-small structures are comprised of a material selected from the group consisting silver (Ag), copper (Cu), and gold (Au).

3. The method of claim 1 wherein said mask layer is comprised of photoresist.

4. The method of claim 1 wherein said conductive layer is comprised of one from the group consisting of: carbon, metal, semiconducting material, transparent conductor, indium tin oxide (ITO), conductive polymer, ionic conductor, or sodium chloride.

5. The method of claim 1 wherein the series of voltage pulses includes at least one negative voltage pulse.

6. The method of claim 1 further comprising:

after said step of applying, resting for a rest period of at least 1 microsecond, and then repeating said applying step.

7. The method of claim 6 wherein the rest period is between 1 microsecond and 500 ms.

* * * * *